(12) United States Patent
Wang et al.

(10) Patent No.: US 9,900,487 B2
(45) Date of Patent: Feb. 20, 2018

(54) CAMERA MODULE AND ARRAY CAMERA MODULE BASED ON INTEGRAL PACKAGING TECHNOLOGY

(71) Applicant: NINGBO SUNNY OPOTECH CO., LTD., Ningbo, Zhejiang (CN)

(72) Inventors: Mingzhu Wang, Ningbo (CN); Bojie Zhao, Ningbo (CN); Zhenyu Chen, Ningbo (CN); Nan Guo, Ningbo (CN); Takehiko Tanaka, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 0 days.

(21) Appl. No.: 15/627,425

(22) Filed: Jun. 19, 2017

(65) Prior Publication Data

US 2017/0353644 A1    Dec. 7, 2017

Related U.S. Application Data

(63) Continuation of application No. 15/512,065, filed as application No. PCT/CN2016/106402 on Nov. 18, 2016.

(30) Foreign Application Priority Data

| Apr. 21, 2016 | (CN) | 201610250836 |
| Apr. 21, 2016 | (CN) | 201620336842 |
| May 11, 2016 | (CN) | 201610311232 |
| May 11, 2016 | (CN) | 201620422525 |
| Oct. 14, 2016 | (CN) | 201610898430 |
| Oct. 14, 2016 | (CN) | 201621124404 |
| Oct. 14, 2016 | (CN) | 201621124509 |

(Continued)

(51) Int. Cl.
| H04N 5/225 | (2006.01) |
| H05K 1/02 | (2006.01) |
| H05K 1/18 | (2006.01) |
| G02B 7/00 | (2006.01) |
| G02B 7/02 | (2006.01) |

(52) U.S. Cl.
CPC .......... *H04N 5/2257* (2013.01); *G02B 7/006* (2013.01); *G02B 7/02* (2013.01); *H04N 5/2254* (2013.01); *H05K 1/0274* (2013.01); *H05K 1/182* (2013.01)

(58) Field of Classification Search
None
See application file for complete search history.

(56) References Cited

U.S. PATENT DOCUMENTS

| 2009/0128681 A1* | 5/2009 | Kim | H04N 5/2253 |
| | | | 348/335 |
| 2010/0157142 A1* | 6/2010 | Ryu | G02B 7/021 |
| | | | 348/373 |

(Continued)

*Primary Examiner* — Shahbaz Nazrul
(74) *Attorney, Agent, or Firm* — Raymond Y. Chan; David and Raymond Patent Firm

(57) ABSTRACT

A camera module and an array camera module based on an integral packing process are disclosed. The camera module or each of the camera module units of the array camera module includes a circuit board, an integral base, a photosensitive element operatively connected to the circuit board, a lens, a light filter holder installed at the integral base and a light filter installed at the light filter holder. The light filter is not required to be directly installed to the integral base, so that the light filter is protected and the requiring area of the light filter is reduced.

30 Claims, 51 Drawing Sheets

A-A

(30) Foreign Application Priority Data

Oct. 14, 2016 (CN) .......................... 201621124964
Nov. 18, 2016 (WO) ................ PCT/CN2016/106402

(56) References Cited

U.S. PATENT DOCUMENTS

| | | | | |
|---|---|---|---|---|
| 2011/0159919 A1* | 6/2011 | Kim | ........................ | G02B 7/08 455/556.1 |
| 2013/0070148 A1* | 3/2013 | Kim | ........................ | G02B 7/08 348/357 |
| 2013/0128108 A1* | 5/2013 | Oh | ....................... | H04N 5/2253 348/374 |
| 2014/0184809 A1* | 7/2014 | Luan | ................. | H01L 27/14618 348/164 |
| 2014/0184881 A1* | 7/2014 | McKinley | ............ | H04N 5/2253 348/345 |
| 2015/0077628 A1* | 3/2015 | Kim | .................... | H04N 5/2254 348/374 |
| 2016/0154154 A1* | 6/2016 | Lee | ..................... | H04N 5/2253 348/342 |
| 2016/0165125 A1* | 6/2016 | Kim | ........................ | G03B 3/10 348/345 |
| 2017/0104903 A1* | 4/2017 | Warashina | ........... | H04N 5/2254 |
| 2017/0134630 A1* | 5/2017 | Park | .................... | H04N 5/2257 |

* cited by examiner

A-A

CAMERA MODULE AND ARRAY CAMERA MODULE BASED ON INTEGRAL PACKAGING TECHNOLOGY

CROSS REFERENCE OF RELATED APPLICATION

This is a Continuation application that claims the benefit of priority under 35 U.S.C. § 120 to a non-provisional application, application Ser. No. 15/512,065, filed Mar. 18, 2017, that claims the benefit of priority under 35 U.S.C. § 119 to Chinese applications, application number 2016102508366, filed Apr. 21, 2016, application number 2016203368429, filed Apr. 21, 2016, application number 2016103112328, filed May 11, 2016, application number 2016204225259, filed May 11, 2016, application number 2016108984309, filed Oct. 14, 2016, application number 2016211245098, filed Oct. 14, 2016, application number 2016211249648, filed Oct. 14, 2016, application number 2016211244042, filed Oct. 14, 2016, and the benefit of priority under 35 U.S.C. § 371 to international application number PCT/CN2016/106402, international filing date Nov. 18, 2016, wherein the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to camera modules, and more particularly to a camera module and array camera module based on an integral packaging technology.

Description of Related Arts

A camera module is one of the indispensable components of an intelligent electronic device such as smart phone, camera, computer device, wearable device, and the like. With the continuous development of a variety of intelligent devices and the popularity of the intelligent devices, the camera module requirements are getting higher and higher.

In recent years, intelligent electronic devices have been developed by leaps and bounds, the growing trend of the intelligent electronic devices is towards thinner and thinner. In order to adapt such development, the camera module of the intelligent electronic device is required to be multi-functional, lightweight and compact in size, so that electronic equipment can be made thinner and thinner while meeting its imaging requirements. Therefore, the camera module manufacturers continue to focus on designing and manufacturing camera modules that meet these requirements.

Molded packaging technology is an emerging packaging technology developed from the conventional COB (Chip on Board) packaging technology. As shown in FIG. 1A of the drawings, a circuit board encapsulated by a conventional integrated packaging technology is illustrated, wherein a packaging portion 1 is packaged on a circuit board 2 through a packaging process, and then a chip 3 (such as an imaging sensor and a photosensitive element) is connected to the circuit board 2, and a light filter 4 is installed to the molded portion 1. The packaging portion 1 embeds the electronic components 5 which are provided on the circuit board 2, so as to reduce the occupying space for the electronic components 5 of the camera module, so that the size of the camera module can be made smaller and it can also solve the problem of the dust that may adhere on the electronic components 5 and adversely influence the imaging quality of the camera module.

As shown in FIG. 1B, a circuit board packaged through a conventional COB technology is illustrated. In comparison with the conventional COB packaging technology, the packaging technology has many advantages. For example, through replacing the holder 7 with the packaging portion 1, the occupying space for the electronic components 5 can be reduced so as to reduce the size of the camera module, and that the dust that may adhere on the electronic components 5 and adversely influence the imaging quality of the camera module can thus be avoided. However, some new problems arise in such conventional packaging structure.

The light filter, which is a very important component in a modern camera module, serves to filter infrared lights, so that a desired light observing performance similar to a human eye observing effect can be achieved. The light filter is easy to be damaged. It also plays a significant role in the manufacturing cost of the camera module. The larger the size of the light filter, the more expensive of the light filter. In addition, when the filtering area of the light filter is relatively large, the degree of the manufacturing accuracy of the light filter is relatively hard to control too. Therefore, the issue of the light filter should be carefully considered when adopting the packaging technology.

First of all, in comparison with the conventional COB packaging technology, the packaging portion embeds the electronic components 5 in the packaging technology so as to further utilize the space and position of the electronic components 5. However, comparing with the COB holder as shown in FIG. 1B, the introduction of the packaging portion must increase the assembly space of the light filter 4 at top of the packaging portion. In other words, a relative larger size of the light filter 4 is required for the packaging technology.

More specifically, referring to FIG. 1B, the light filter 7 as illustrated is installed on the holder 7 in the conventional COB technology. Because the holder 7 is installed on the circuit board 2 in a later step, it can be manufactured to have different shapes. For example, as long as the photosensitive area is not blocked, the holder can extend inwardly to reduce the size of the light filter as much as possible, so as to enable an easy assembly while ensuring to fulfill its utility requirement. And, since the light filter with a relatively smaller size can be used, the manufacturing cost of the camera module can be reduced. However, in the packaging technology, the packaging portion 1, which is integrally formed on the circuit board 2 through a set of moulds, is integrally extended from bottom to top, so that the size of the light filter 4 is determined by an opening of the packaging portion 1, and thus the light filter is inevitable to be relatively large.

Secondly, in the packaging technology, as shown in FIG. 1A, the light filter 4 is required to be installed in a groove 6 of the packaging portion 1. However, because of the adoption of the packaging technology, the shape of the corner of the groove 6 is hard to control. In other words, the groove walls for forming the groove 6, especially the joint position between the adjacent groove walls, are prone to deform that, for example, may produce some blurs so that it is not able to provide a good assembling condition for the light filter 4, and thus smoothness is hard to guarantee. The light filter is also easy to get damages. However, in a conventional holder 7, an inner groove 8 can be provided. In other words, the holder 7 can extend inwardly to provide a sheltering position for the light filter 4 while reduce the assembly area of the light filter 4. However, since the packaging portion is formed through an integrally forming process, a demoulding issue exists in the manufacturing process, so that the structure of the conventional holder can be manufactured by the packaging process. Therefore, the conventional packaging technology can only provide a limited structure, e.g. the packaging portion 1 without the inner groove 8. The conventional holder, the packaging holder, and their forming processes both have their own advantages and disadvantages. Therefore, a combination of the advantages of the two structures is desired.

Thirdly, even the packaging portion 1 is constructed to be a flat step structure without the groove 6, it ensures that the surface of the packaging portion 1 has a good flatness for providing a good assembly condition for the light filter 4. However, in this structure, on one hand, the light filter 4 has to share the packaging portion 1 with other components such as a lens or an actuator, so that a relatively high requirement for the assembly accuracy is required, or otherwise these components may damage the light filter during the assembly process. On the other hand, a distance between the light filter and the lens is relatively small, so that a lens element of the lens may easy to have contact with the light filter, and also a back focus length of the lens is increased.

Furthermore, the circuit board is required to be installed with the photosensitive element, the electronic components, and the packaging portion, so that the layout of these components will have an influence on the area of the circuit board. Because of the integral forming manner of the molded portion, the area of the packaging portion will be larger than the area of the conventional holder, i.e. the occupying area of the packaging portion on the circuit board is relatively large.

SUMMARY OF THE PRESENT INVENTION

The invention is advantageous in that it provides a camera module and array camera module based on integral packaging process, wherein the camera module comprises a light filter holder which is cooperative with an integral base of the camera module, so that it is capable of providing support to various components.

Another advantage of the invention is to provide a camera module and array camera module based on integral packaging process, wherein the light filter holder provides a suitable assembly position for the light filter, so that the light filter is not required to be directly installed on the integral base of the camera module.

Another advantage of the invention is to provide a camera module and array camera module based on integral packaging process, wherein the light filter holder has a supporting groove adapted for installing the light filter, so that the light filter can be installed at a lower position, i.e. closer to the circuit board and the photosensitive element.

Another advantage of the invention is to provide a camera module and array camera module based on integral packaging process, wherein the light filter holder has an engaging groove adapted for engaging with the integral base, so that a total height of the combination of the light filter holder and the integral base is reduced, and the light filer is able to be positioned closer to the photosensitive element.

Another advantage of the invention is to provide a camera module and array camera module based on integral packaging process, wherein the light filter holder comprises a holder body and at least one inward extending arm which is inwardly extended from a lower side thereof for defining the supporting groove.

Another advantage of the invention is to provide a camera module and array camera module based on integral packaging process, wherein the light filter holder comprises a downward extending arm which is longitudinally extended from the holder body, wherein the inward extending arm is transversely extended from the downward extending arm, so that the engaging groove and the supporting groove are respectively formed.

Another advantage of the invention is to provide a camera module and array camera module based on integral packaging process, wherein the integral base has at least one notch that communicates to outside, the light filter holder comprises at least one extending edge which corresponds to the notch and adapts the transverse thickness of the integral base.

Another advantage of the invention is to provide a camera module and array camera module based on integral packaging process, wherein the light filter holder comprises an upward extending surrounding wall which is capable of restricting the position of the actuator or lens, so as ensure a uniform axis.

Another advantage of the invention is to provide a camera module and array camera module based on integral packaging process, wherein the light filter holder is capable of protecting the light filter by avoiding any stress applied on the integral molded base when the light filter is directly installed on the integral base.

Another advantage of the invention is to provide a camera module and array camera module based on integral packaging process, wherein the array camera module comprises an integral piece of light filter holders which comprises at least two light filter holders integrally connected together for supporting at least two light filters respectively, so as to ensure the accordance of the camera module units.

Additional advantages and features of the invention will become apparent from the description which follows, and may be realized by means of the instrumentalities and combinations particular point out in the appended claims.

According to the present invention, the foregoing and other objects and advantages are attained by a camera module which comprises at least one integral base assembly, at least one photosensitive element, at least one lens, at least one light filter holder, and at least one light filter, wherein the integral base assembly comprises a circuit board and an integral base integrally packaged on the circuit board. The photosensitive element is operatively connected to the circuit board. The light filter holder is installed with the integral molded base and forms an optical window for providing a light passage (photosensitive path) to the photosensitive element, so that the light filter is installed at the light filter holder and aligned in a photosensitive path of the photosensitive element, while the lens is also aligned in the photosensitive path of the photosensitive element.

According to some embodiments, the light filter holder of the camera module comprises a light filter holder body and at least one inward extending arm which is transversely extended from a partial portion of the light filter holder body to form a supporting groove for installing the light filter.

According to some embodiments, the light filter holder of the camera module comprises a light filter holder body, at least one downward extending arm, and at least one inward extending arm, wherein the downward extending arm is downwardly extended from the light filter holder body to form an engaging groove for engaging with the integral base, wherein the inward extending arm is transversely extended from the downward extending arm to form an supporting groove for supporting the light filter.

According to some embodiments, a corner opening is formed between two inward extending arms of the camera module, wherein the corner opening is outwardly extended from the light window for increasing the light flux at the position of the corner opening.

According to some embodiments, each downward extending arm of the camera module is longitudinally extended from the light filter holder body towards the photosensitive element, and the position of the light filter is downwardly displaced and closer to the photosensitive element.

According to some embodiments, each inward extending arm of the camera module is transversely extended from the downward extending arm so as to reduce an assembly area of the light filter.

According to some embodiments, the integral base of the camera module has at least one installing groove communicated with the light window and at least one notch communicating the light window to outside, wherein the light filter holder body of the light filter holder comprises at least one engaging edge engaged with the installing groove and at least one extending edge which extends into and sealedly fits with the notch.

According to some embodiments, the integral base of the camera module has three installing grooves to form a U-shaped configuration, wherein the light filter holder body of the light filter holder comprises three engaging edges forming a corresponding U-shaped configuration for matching with the three installing grooves respectively.

According to some embodiments, the integral base of the camera module has two installing grooves communicated to the light window and two notches communicating the light window to outside, wherein the light filter holder body of the light filter holder comprises two engaging edges for coupling with the two installing grooves respectively and two extending edges which extend into and sealedly fit with the two notches respectively.

According to some embodiments, the two installing grooves of the integral base of the camera module are arranged at opposite sides, wherein the two notches are arranged at opposite sides and, correspondingly, the two engaging edges of the light filter holder are arranged at opposite sides, while the two extending edges are arranged at opposite sides.

According to some embodiments, the two installing grooves of the integral base of the camera module are adjacent to each other, wherein the two notches are adjacent to each other and, correspondingly, the two engaging edges of the light filter holder are adjacent to each other, while the two extending edges are adjacent to each other too.

According to some embodiments, the integral base of the camera module has one installing groove communicated to the light window and three notches communicating the light window to outside, wherein the light filter holder body of the light filter holder comprises one engaging edge for coupling with the installing groove and three extending edges which extend into and sealedly fit with the three notches respectively.

According to some embodiments, the integral base of the camera module comprises an upward extending surrounding wall which is upwardly extended from the light filter holder body to form a retaining chamber.

According to some embodiments, the integral base of the camera module comprises an upward extending surrounding wall which is upwardly extended from the light filter holder body to form a retaining chamber and a downward extending surrounding wall downwardly extended from the light filter holder body to form a lower housing chamber.

According to some embodiments, the light filter holder of the camera module has a receiving opening for receiving the light filter which is aligned in the photosensitive path of the photosensitive element.

According to some embodiments, the integral base of the camera module comprises a base body which is integrally molded and packaged on the circuit board, wherein the base body has at least one opening, wherein the light filter holder is supplemental to the base body and is aligned with the opening to define the light window.

According to some embodiments, the opening of the base body of the camera module has an inverted trapezoid shape with a size gradually increasing from bottom to top.

According to some embodiments, at least one portion of the light filter holder of the camera module is connected to the circuit board.

According to some embodiments, the light filter holder of the camera module comprises at least one extending leg which is downwardly and integrally extended from the light filter holder body to the circuit board to fit into the opening of the integral base so as to sealedly form the light window.

According to some embodiments, the opening of the base body of the camera module has an inverted trapezoid shape with a size gradually increasing from bottom to top, wherein the extending leg also has an inverted trapezoid shape to match with the shape of the opening, so as to retain the light filter holder in position at the opening.

According to some embodiments, the camera module comprises at least one actuator which is at least partially and selectively installed to the integral base and the light filter holder, wherein the lens is installed with the actuator.

According to some embodiments, the lens of the camera module is at least partially and selectively installed to the integral base and the light filter holder.

According to some embodiments, the lens of the camera module is at least partially installed to the integral base.

According to some embodiments, the light filter of the camera module is selected from the group consisting of IR cut filter, blue glass filter, and wafer level IR cut filter.

According to some embodiments, the integral packaging manner of the integral base is achieved through a molding packaging process.

According to some embodiments, the circuit board of the camera module comprises a base board and at least one electronic component provided on the base board, wherein the integral base, which is integrally packaged on the base board, embeds the electronic component.

According to some embodiments, the integral base of the camera module is further formed with a lens barrel which defines a lens cavity for installing the lens.

According to some embodiments, the light filter holder of the camera module is formed through an injection molding process.

According to some embodiments, the integral base of the camera module has an inner side surface which defines an incline angle, wherein the engaging groove has an engaging angle which is corresponding to the incline angle.

According to some embodiments, the camera module may comprise a plurality of integral base assemblies, a plurality of photosensitive elements, a plurality of lens, a plurality of light filter holders, and a plurality of light filters, wherein each integral base assembly is integrally formed with the circuit board to form an integral circuit board assembly, wherein the integral bases are integrally molded to form an integral piece of bases, and the light filter holders may be integrally formed to form an integral piece of light filter holders.

According to some embodiments, the light filter holder of the camera module further comprises at least one retaining protrusion which is at least partially protruded from a top of the light filter holder body.

According to some embodiments, the retaining protrusion is constructed to be in ring shape.

According to some embodiments, the camera module comprises an actuator, wherein the lens is installed with the actuator and the actuator is retained to be installed at an outer side of the retaining protrusion.

According to another aspect of the present invention, the present invention provides an array camera module which comprises a plurality of camera module units which are arranged in an array, wherein each camera module unit comprises at least one integral base assembly, at least one photosensitive element, at least one lens, at least light filter holder, and at least one light filter, wherein the integral base assembly comprises an integral base and a circuit board, and the integral base is integrally packaged on the circuit board, wherein the photosensitive element is operatively connected to the circuit board, and the light filter holder is installed with the integral base and forms an optical window for providing a light passage to the photosensitive element, wherein the light filter is installed at the light filter holder and aligned in a photosensitive path of the photosensitive element, while the lens is also aligned in the photosensitive path of the photosensitive element, wherein the integral bases of the plurality of camera module units are integrally formed to provide an integral piece of bases.

According to some embodiments, the plurality of circuit boards are integrally formed to provide an integral piece of circuit boards, the plurality of light filter holders are integrally formed to provide an integral piece of light filter holders. t is appreciated that, in some other embodiments, the plurality of circuit boards are independent circuit boards, and the plurality of light filter holders are independent light filter holders.

According to some embodiments, the integral piece of bases of the array camera module comprises a plurality of base boards each having a light window formed therein, wherein the two adjacent base boards are integrally formed to provide an joint portion, and the integral piece of light filter holders has a plurality of supporting grooves communicating with the light windows for assembling the light filters respectively, wherein two adjacent light filter holders are integrally formed to provide a bridge portion which is provided above the joint portion of the integral piece of bases.

According to some embodiments, each light filter holder of the array camera module comprises a light filter holder body and at least one inward extending arm which is transversely extended from a partial portion of the light filter holder body to form a supporting groove for installing the light filter.

According to some embodiments, each light filter holder of the array camera module comprises a light filter holder body, at least one downward extending arm, and at least one inward extending arm, wherein the downward extending arm is downwardly extended from the light filter holder body to form an engaging groove for engaging with the integral base, wherein the inward extending arm is transversely extended from the downward extending arm to form an supporting groove for supporting the light filter.

According to some embodiments, a corner opening is formed between two inward extending arms of the array camera module, wherein the corner opening is outwardly extended from the light window for increasing the light flux at the position of the corner opening.

According to some embodiments, each downward extending arm of the array camera module is longitudinally extended from the light filter holder body towards the photosensitive element, and that the light filter can be installed at a lower position and closer to the photosensitive element.

According to some embodiments, each inward extending arm of the array camera module is transversely extended from the downward extending arm so as to reduce an assembly area of the light filter.

According to some embodiments, each integral base of the array camera module has at least one installing groove communicated with the light window and at least one notch communicating the light window to outside, wherein the light filter holder body of the light filter holder comprises at least one engaging edge which engages with the installing groove and at least one extending edge which extends into and sealedly fits with the notch.

According to some embodiments, each integral base of the array camera module has three installing grooves forming a U-shaped configuration, wherein the light filter holder body of the light filter holder comprises three engaging edges forming a corresponding U-shaped configuration for matching with the three installing grooves respectively.

According to some embodiments, each integral base of the array camera module has two installing grooves communicated to the light window and two notches communicating the light window to outside, wherein the light filter holder body of the light filter holder comprises two engaging edges for coupling with the two installing grooves respectively and two extending edges extend into and sealedly fit with the two notches respectively.

According to some embodiments, the two installing grooves of each integral base of the array camera module are arranged at opposite sides; the two notches are arranged at opposite sides and, correspondingly, the two engaging edges of the light filter holder are arranged at opposite sides; the two extending edges are arranged at opposite sides.

According to some embodiments, the two installing grooves of each integral base of the array camera module are adjacent to each other; the two notches are adjacent to each other and, correspondingly, the two engaging edges of the light filter holder are adjacent to each other; the two extending edges are adjacent to each other.

According to some embodiments, each integral base of the array camera module has one installing groove communicated to the light window and three notches communicating the light window to outside, wherein the light filter holder body of the light filter holder comprises one engaging edge for coupling with the installing groove and three extending edges which extend into and sealedly fit with the three notches respectively.

According to some embodiments, each integral base of the array camera module comprises an upward extending surrounding wall which is upwardly extended from the light filter holder body to form a retaining chamber.

According to some embodiments, each integral base of the array camera module comprises an upward extending surrounding wall which is upwardly extended from the light filter holder body to form a retaining chamber and a downward extending surrounding wall downwardly extended from the light filter holder body to form a lower housing chamber.

According to some embodiments, each integral base of the array camera module comprises a base body which is integrally packaged on the circuit board, wherein the base body has at least one opening extending to the circuit board, wherein the integral piece of light filter holders comprises at least one extending leg which fits into the opening and connects to the circuit board.

According to some embodiments, the extending leg of the array camera module is extended from the light filter holder body to the circuit board to seal a periphery of the light opening.

According to some embodiments, the extending leg of the array camera module is extended between two adjacent light windows to separate and define the two light windows.

According to some embodiments, each light filter holder of the array camera module has a receiving opening for receiving the light filter so as to align the light filter in the photosensitive path of the photosensitive element According to some embodiments, the array camera module comprises at least one actuator which is at least partially and selectively installed to the integral piece of bases and the integral piece of light filter holders, and the lens is installed with the actuator, so as to form an auto-focus camera module.

According to some embodiments, at least one lens of the array camera module is at least partially and selectively installed to the integral piece of bases and the integral piece of light filter holders, so as to form a fixed-focus camera module.

According to some embodiments, at least one of the camera module units of the array camera module is an auto-focus camera module, and at least one of the camera module units of the array camera module is a fixed-focus camera module.

According to some embodiments, at least two camera module units of the array camera module are auto-focus camera modules.

According to some embodiments, at least two camera module units of the array camera module are fixed-focus camera modules.

According to some embodiments, the array camera module comprises two camera module units so as to form a dual camera module.

According to another aspect, the present invention provides an electronic device which comprises an electronic device body and one or more the camera modules which are provided at the electronic device body.

According to some embodiments, the electronic device can be, but not limited to, smart phone, wearable device, computer device, television, transporting device, digital camera and monitoring device.

According to another aspect, the present invention provides an array camera module which comprises at least two lenses, at least two photosensitive elements, an integral piece of at least two circuit boards, an integral piece of at least two bases, at least two light filters, and at least two light filter holders, wherein the integral piece of bases is integrally packaged on the integral piece of circuit boards and forms at least two light windows for providing two light passages for the corresponding lenses and photosensitive elements respectively, wherein the light filter holder bodies are installed at the integral piece of bases for installing the light filters respectively in such a manner that each light filter is arranged between the respective lens and photosensitive element.

According to another aspect, the present invention provides an electronic device which comprises an electronic device body and one or more array camera modules which are provided at the electronic device body.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
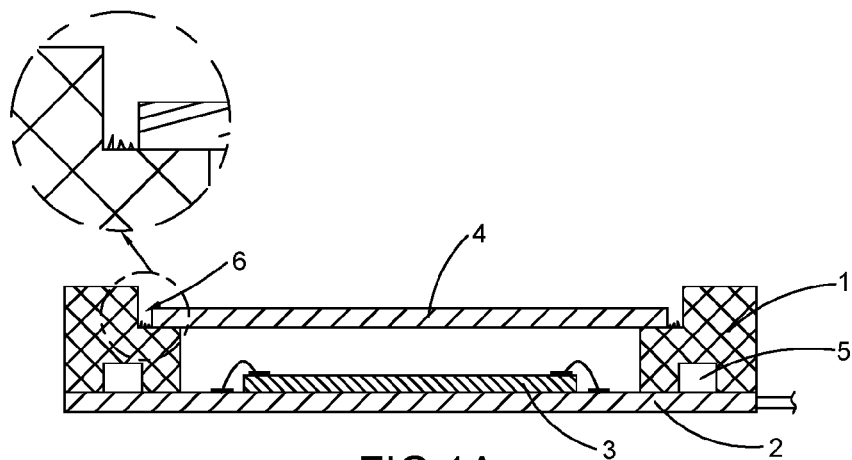
FIG. 1A illustrates a conventional circuit board assembly manufactured through a packaging process.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. just indicate relations of direction or position are based on the relations of direction or position shown in the appended drawings, which is only to facilitate descriptions of the present invention and to simplify the descriptions, rather than to indicate or imply that the referred device or element must be arranged in such a specific direction or to be operated or configured in specific direction. Therefore, the above mentioned terminologies shall not be interpreted as a limitation to the present invention.

It is understandable that the term "a" or "an" should be understood as "at least one" or "one or more". In other words, in one embodiment, the number of an element can be one and in other embodiment the number of the element can be more than one. The term "a" or "an" is not construed as a limitation of quantity.

The molding packaging process is a newly developed important application process in the field of camera modules. The molding or packaging process may have been well known in other fields, but in the field of camera modules, especially the current popular camera modules with a plurality of lenses and with high resolution. The molding packaging process has just begun to present its advantages and importance, and is becoming applicable. In comparison with the conventional packaged camera module by a COB process, the camera module manufactured based on the molding packaging process is able to replace a conventional independent holder by forming the holder by the molding packaging process, so as to provide advantages such as reducing the size of the camera module, and providing a flat installing surface. However, the holder formed by the molding packaging process has to take up the responsibility of the original holder, such as for installing the light filter. As mentioned above, the holder formed by the molding packaging process is not suitable for directly installing with the light filter. On the other hand, the configuration of the photosensitive element and electronic components on the circuit board will have an adverse influence to the size of the camera module. However, according to the present invention, a camera module and an array camera module based on an integral packaging process, as well as a light filter holder are provided. Accordingly, the light filter holder is introduced into the camera module and the array camera module, so that the light filter holder cooperates with an integral base, so as to undertake the function of the conventional holder. Therefore, when applying the integral packaging process such as the molding packaging process, a good installing condition can be provided for a light filter, an actuator or a lens, so as to make up the installing problem of the integral packaging process, and optimize the configuration of components on the circuit board, so that the space around the circuit board is fully effectively utilized and thus the size of the camera module can be further reduced.

Figure 2:
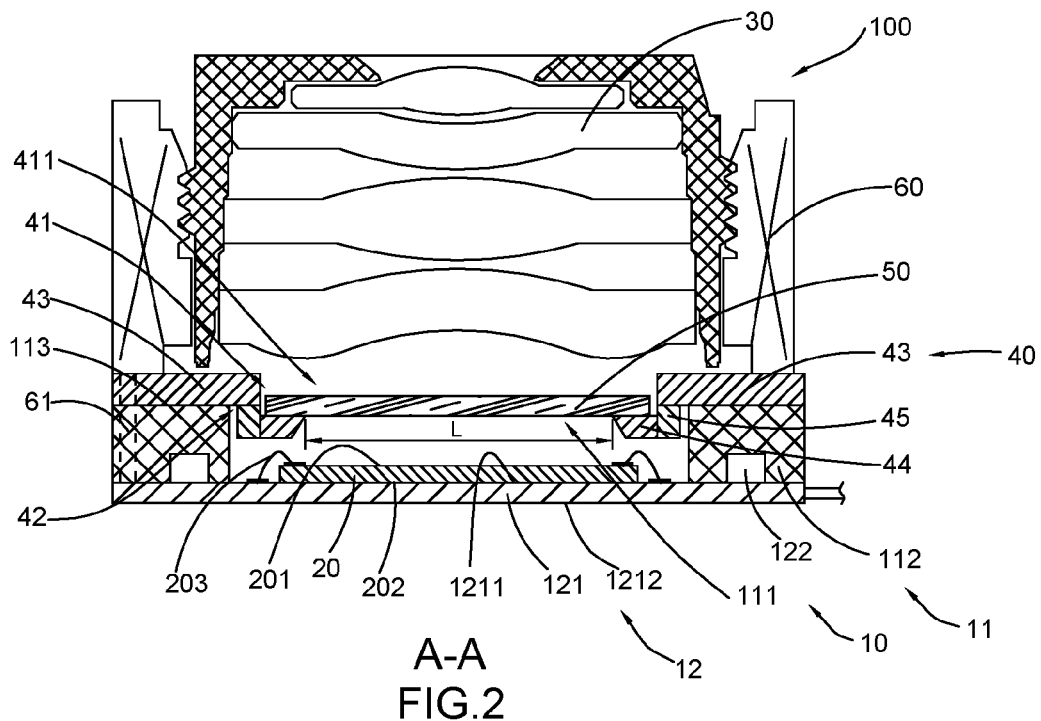
FIG. 2 is a sectional view of a camera module according to a first preferred embodiment of the present invention.
Figure 3:
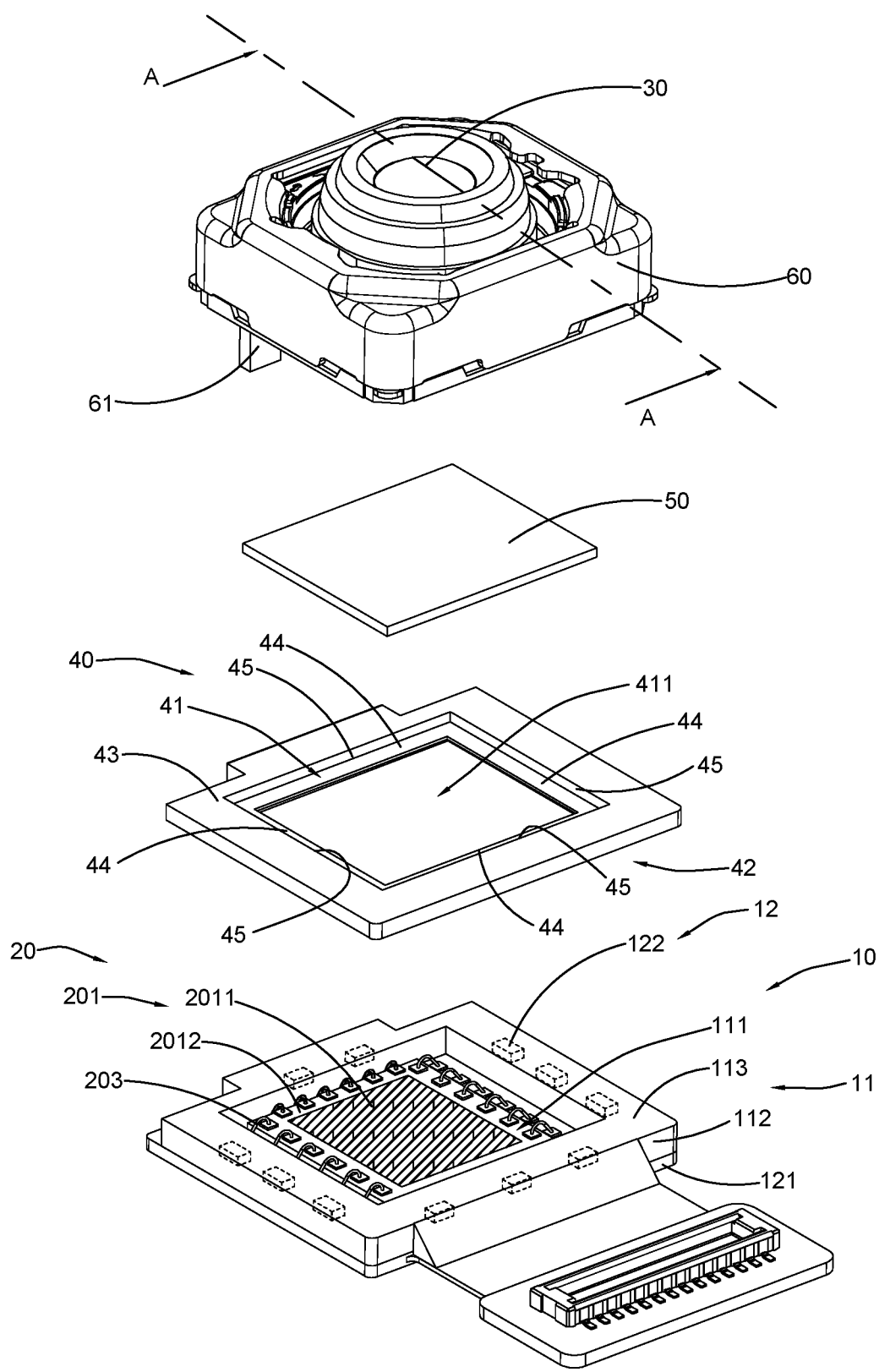
FIG. 3 is an exploded view of the camera module according to the above first preferred embodiment of the present invention.
Figure 4:
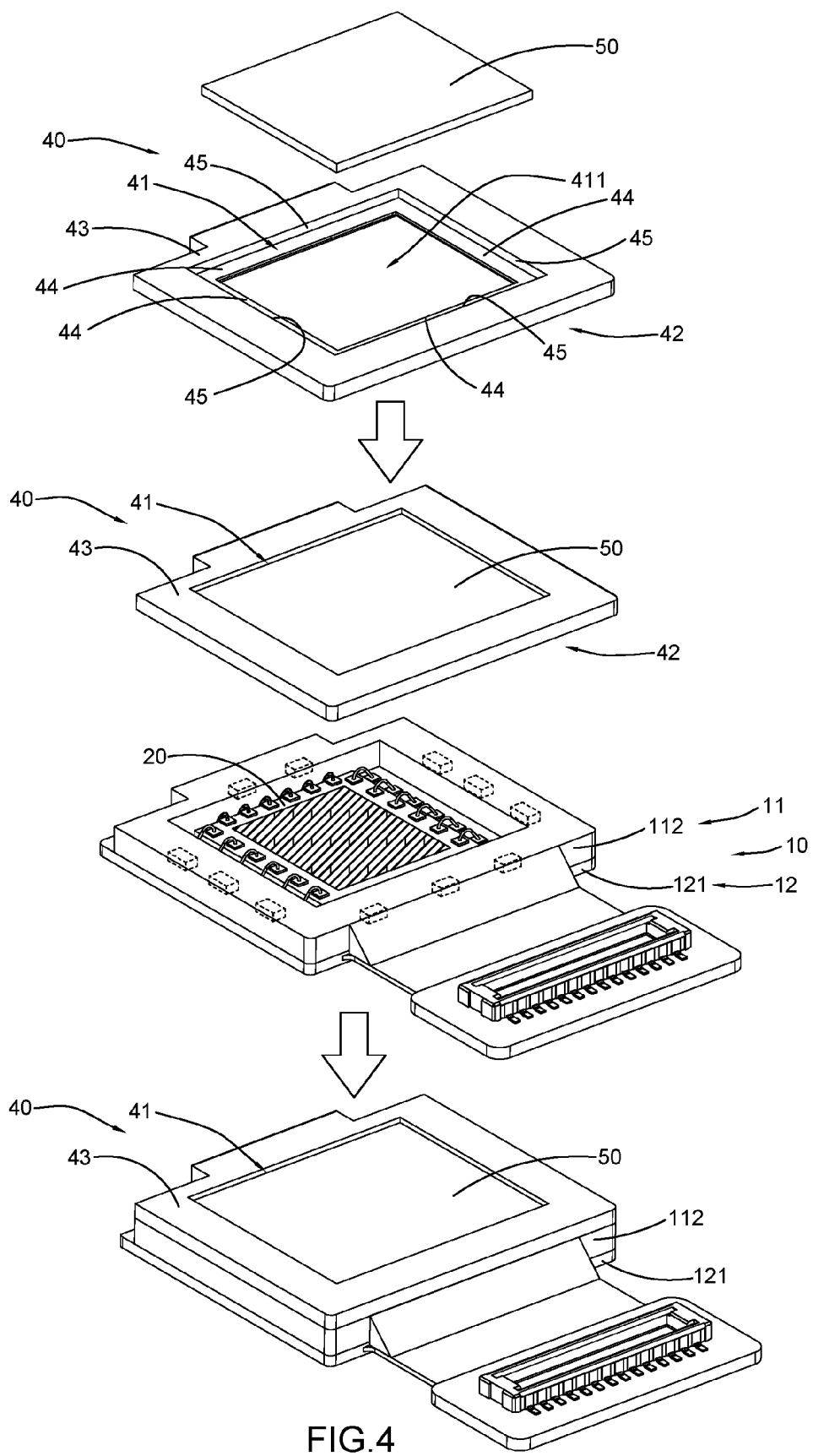
FIG. 4 illustrates the assembling process of key components of the camera module according to the above first preferred embodiment of the present invention ○

Referring to FIGS. 2 to 4 of the drawings, a camera module according to a first embodiment of the present invention is illustrated. Accordingly, the camera module 100 can be incorporated into various electronic devices, including but not limited to smart phone, wearable device, computer device, television, transporting device, digital camera, monitoring device, and the like so as to cooperative with the electronic device to achieve an image acquisition and reproduction of a target object.

As shown in FIGS. 2 to 4, the camera module 100 according to the first embodiment of the present invention comprises an integral base assembly 10, a photosensitive element 20, a lens 30, a light filter holder 40 and a light filter 50.

The integral base assembly 10 comprises an integral base 11 and a circuit board 12, and the integral base 11 is integrally packaged on the circuit board 12. For example, but not limiting, the integral base 11 is integrally packaged on the circuit board 12 through a molding process. The light filter holder 40 is adapted to be installed at the integral base 11 so that the integral base 11 and the light filter holder 40 are cooperative that can replace the holder or supporter of the conventional camera module which has to be adhered to the circuit board by glue while the present invention does not require such adhering procedure. The photosensitive element 20 is operatively connected to the circuit board 12. Accordingly, the photosensitive element 20 is electrically connected to the circuit board 12 of the integral base assembly 10, the light filter holder 40 is installed with the integral base assembly 10, and the lens 30 is positioned in a photosensitive path of the photosensitive element 20.

The integral base 11 has a light window 111 and comprises a base body 112 defining the light window 111 in a central portion thereof which provides a light passage for the photosensitive element 20. The base body 112 is molded to be integrally packaged with the circuit board 12. More specifically, according to this embodiment, the light window 111 is defined by an inner surrounding wall of the base body 112 to provide a periphery sealing inner enclosure for the lens 30. The circuit board 12 comprises a base board 121 and a plurality of electronic components including, but not limited to resistors, capacitors, drives and etc., which are mounted on the base board through a SMT adhering process. According to this preferred embodiment, the integral base 11 is molded to be integrally packaged on the base board 121 with the electronic components 122 being embedded therein so as to avoid a problem in the conventional camera module that the dust and particles would be adhered to electronic components 122 and contaminate the photosensitive element 20 to adversely influence the image quality thereof. It is understandable that in other embodiments, the electronic components 122 may be embedded in the base board 121, i.e. the electronic components 122 may not be exposed to outside. The base board 121 of the circuit board 12 can be PCB rigid board, PCB flexible board, rigid-flexible combination board, ceramics board, and etc. It is worth mentioning that, according to this preferred embodiment, the integral base 11 can completely embed and cover these electronic components 122, so that the electronic components 122 do not need to be embedded into the base board 121, and the base board 121 is only used for forming electrically conductive circuits. Therefore, a thickness of the final integral base assembly 10 being manufactured can be relatively thinner.

It is worth mentioning that the electronic components 122 may be arranged around the photosensitive element 20 in some embodiments, while in some other embodiment, they may also be designed and configured according to other different requirements, such as being arranged at a single side or two sides thereof, so as to be in cooperation with the position of the photosensitive element 20, the position of electrically connecting elements 203 and the shape of the light filter holder 40. Thus, the utilization of the space above the base board 121 is optimized that substantially reduces the size of the camera module as much as possible. However, the person of ordinary skilled in the art shall understand that the position and configuration of the electronic components 122 are not limited in the above-mentioned embodiment of the present invention. It is still worth mentioning that, because the positions of the electronic components 122 may be different, the electronic components 122 in a sectional view may not be presented, or may be shown with only on one side. For facilitating the understanding and description, the electronic components 122 are merely shown in the presented drawings of the present invention for examples. However, the illustration and presentation shall not be interpreted as a limitation in the present invention.

More specifically, the base board 121 has a top or front surface 1211 which is facing towards the lens 30 and a bottom or back surface 1212 which is opposite to the lens 30. The photosensitive element 20 has a front surface 201 which is facing towards the lens 30 and a back surface 202 which is opposite to the lens 30 and is arranged above the top surface 1211 of the top surface 1211 of the base board 121. The photosensitive element 20 is electronically connected to the base board 121 through at least one electrically connecting element 203 which can be but not limited to gold wire, silver wire, copper wire and aluminum wire. The electrically connecting elements 203 can be arranged at one side, two sides, three sides or four sides of the photosensitive element 20. According to some drawings of the present invention, the electrically connecting elements 203 are illustrated to be arranged at four sides of the photosensitive element 20. However, in other embodiments, the electrically connecting elements 203 may be arranged at one side, two sides or three sides of the photosensitive element 20. The person of ordinary skilled in the art shall understand that the number, position, and type of the electrically connecting elements 203 have no limitation in the present invention.

The photosensitive element 20 can be installed on the base board, through a process which can be but not limited to a SMT (Surface Mount Technology) process or a COB (Chip On Board) process, by electrically connecting the photosensitive element 20 with the base board 121 via gold wires or the like. Of course, in other embodiments, the photosensitive element 20 may be connected to the base board via other connecting manners, such an embedding manner or a FC (Flip Chip) manner. The person of ordinary skilled in the art shall understand that the connecting and installing manner between the photosensitive element 20 and the circuit board 12 is not limited in the present invention.

More specifically, the front surface 201 of the photosensitive element 20 has a photosensitive area 1311 and a non-photosensitive area 1312 positioned around the photosensitive area 1311. The photosensitive area 1311 is used for a photosensitive performance in which light signals are converted into electrical signals, and the non-photosensitive area 1312 is electrically connected to the circuit board 12 by the connecting elements 203 for transmitting the electrical signals to the circuit board 12. The lens 30 is optically coupled with the photosensitive element 20 in such a manner that a light axis is coaxially arranged, so that the light beams passing through the lens 30 can reach the photosensitive element 20 via the light window 111, and then undergo a light conversion process by the photosensitive element 20 the electrical signals are transmitted to the circuit board 12, so that the camera module 100 is able to capture image information.

As shown in FIGS. 2 and 3, the light filer 50 of the camera module 100, which is used for filtering the light beams passing through the lens 30, can be but not limited to IR cut filter, blue glass light filter, wafer level IR cut filter, light filter of full spectrum, and light filter for filtering visible light. The light filter 50 is installed at the light filter holder 40 and is positioned along the light passage of the photosensitive element 20. The camera module may further comprise an actuator 60, such as a voice coil motor or a piezoelectric motor. The lens 30 is installed with the actuator 60, so as to form an AF (Auto Focus) camera module. The actuator 60 comprises at least one pin 61 which is arranged for operatively connecting the actuator 60 with the circuit board 12. The at least one pin 61 can be embodied as a single pin, double pins, a single row of pins, or double rows of pins. In the drawings of the present invention, two pins are illustrated, but it is not a limitation to the present invention. The pin 61 is usually positioned adjacent to the edge of circuit board 12. FIG. 3 is a sectional view along line A-A and is corresponding to the sectional view of FIG. 2. The pin 61 actually is not shown in the sectional view of FIG. 2, but for easy to comprehend and describe, broken lines are used to illustrate the existence of the pins 61 in the corresponding sectional views. The person of ordinary skilled in the art shall understand that the type, shape and position of the pins 61 have no limitation in the present invention.

Referring to FIGS. 2 to 4, the light filer 50 is installed in the light filter holder 40 and is positioned inside the light window 111 of the integral base 11. The integral base 11 of the integral base assembly 10 has a top or front surface 113, and the light filter holder 40 is installed to the top surface 113 of the integral base 11 while the actuator 60 is installed at the light filter holder 40. According to this embodiment of the present invention, the top surface 113 of the integral base is made a flat surface. In other words, the integral base 11 forms a flat step structure without protrusion step, and the light filter holder 40 is installed at the flat step structure. It is worth mentioning that in this configuration, the top surface 113 of the integral base 11 is flatly extended with no apparent bending angles are formed, so that during the integral packaging process, such as a molding process, a relative flat installing surface with no blurs is obtained, so as to provide a relatively good flat installing condition for the light filter holder 40.

It is worth mentioning that the light filter 50, such as a blue glass light filter, is fragile and easy to be damaged, but very expensive, so that it is also very important for protecting the light filter 50 during the manufacturing process of the camera module. In the present invention, the integral base 11 is manufactured through the molding process such as an injection molding process or a compression molding process. The material of the light filter holder 40 is not limited, as long as a strength thereof is enough to support the light filter 50. Preferably, the light filter holder 40 and the integral base 11 can be manufactured by different processes. For example, the light filter holder 40 is formed in an injection molding process, and the integral base 11 is manufactured by a transferring compression molding process, so that different materials can be respectively used for manufacturing the light filter holder 40 and the integral base 11, and thus the light filter holder 40 and the integral base 11 are respectively provided with different rigidness and surface flexibility. For example, the light filter holder 40 may have a better flexibility, so that when the light filter 50 is installed at the light filter holder 40, it bears less impact force comparing with the situation when the light filter 50 is installed at the integral base 11, and thus the light filter holder 40 is actually more beneficial for installing the light filter 50 to avoid the damage or smash of the light filter 50. In other words, the light filter holder 40 can relieve an influence of outer impact to the light filter 50, such as to avoid the impact when the light filter 50 is directly adhered to the integral base 11.

More specifically, the light filter holder 40 has at least one supporting groove 41 provided in a top side for installing the light filter 50 and at least one engaging groove 42 provided in a bottom side for installing with the integral base 11. The supporting groove 41 is communicated with the light window 111 for defining a receiving opening 411 for receiving the light filter 50. The engaging groove 42 is circularly arranged along a bottom periphery of the light filter holder 40. In other words, the light filter holder 40 has the receiving opening 411 for receiving the light filter 50, so that the light filter 50 is arranged along the photosensitive path of the photosensitive element 20.

It is worth mentioning that the light filter 50 is installed in the supporting groove 41, so that a relative height thereof with respect to the light filter holder 40 is reduced, wherein the light filter 50 will not protruded above the light filter holder 40 or merely has a relative small portion protruding from the light filter holder 40. Therefore, it will not increase the overall height of the camera module 100, and the light filter 50 is also not easy to have contact with the lens 50 or the actuator 60.

In other words, the supporting groove 41 forms an inner enclosing space, so that it is convenient to install the light filter 50 within the light filter holder 40 in the light path of the photosensitive element 20. The engaging groove 42 forms an outer surrounding space for engaging with the integral base 11, and the integral base 11 provides an installing position for the light filter holder 40.

More specifically, the engaging groove 42 is shaped and configured to couple with the integral base 11, so that the light filter holder 40 is firmly installed at the integral base 11.

More specifically, as illustrated in FIGS. 2 to 4, the light filter holder 40 comprises a light filter holder body 43 having a receiving opening 411 defined therein, at least one inward extending arm 44 and at least one downward extending arm 45 which is extended downwardly from at least a portion of an inner side surrounding and defining the receiving opening 411, that is longitudinally extended from the light filter holder body 43, wherein the at least one inward extending arm 44 is extended inwardly from the downward extending arm 45 to form a taper shaped light filter window gradually increasing its size downwardly in the light window 111 so as to ensure the installing position of the light filter 50 within the light window 111 and to reduce reflectivity of incident light beams and avoid stray lights. The inward extending arm 44 is transversely extended from the downward extending arm 45 for providing a horizontal (transversal) installing position to the light filter 50, so that a light axis of the light filer 50 and a light axis of the photosensitive element are coaxially arranged. According to the embodiment shown in the drawings, the light filter holder 40 comprises four integrally connected inward extending arms 44 and four integrally connected downward extending arms 45, the four inward extending arms 44 and the four downward extending arms 45 are integrally extended from, front, back, left and right, four side positions to form the ring shaped integral light filter holder 40.

In other words, the downward extending arms 45 are integrally extended from the inner sides of the light filter holder body 43 to define the outer engaging groove 42 at the bottom side of the light filter holder body 43, so as to engage with the integral base 11. The inward extending arms 44 are transversely and integrally extended from the inner sides of the downward extending arms 45 inwardly and respectively to define the supporting groove 41 above the inward extending arms 44 to form an installing position surrounding by the downward extending arms 45 for supporting the light filter 50.

In one embodiment, the engaging groove 42 of the light filter holder 40 is shaped corresponding to the shape of the light window 111 of the integral base 11. The shape of the supporting groove 41 is matched with the shape of the light filter holder 50. Particularly, the light filter 50 has a square structure, and the supporting groove 41 is illustrated in the top view to have a ring shape, such as a square ring shape.

Figure 1B:
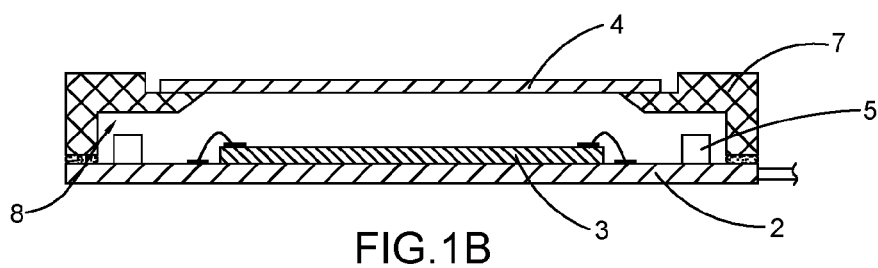
FIG. 1B illustrates a conventional circuit board assembly manufactured through a COB process.

The light filter holder 40 provides the receiving opening 411 for receiving the light filter 50 so that the light filter 50 is positioned in the photosensitive path of the photosensitive element 20. More specifically, the light filter holder body 43 and the downward extending arms 45 form the receiving opening 411 therebetween. In other words, the extending length of each inward extending arm 44 determines the requiring smallest area of the light filter 50. It is worth mentioning that the packaging portion 1 as shown in FIG. 1A is unable to integrally form the inward extending arms 44 of the present invention by the packaging process, so that a light filter 4 with relatively larger size is required, or it requires a relative larger light filter in comparison with the light filter 4 used with the conventional holder 7 adhered to the circuit board 2 as shown in FIG. 1B. However, in the present invention, since each inward extending arm 44 is inwardly extended, the requiring size for the light filter 50 is reduced, and thus the advantages of the light filter holder 40 and the benefits of the integral packaging technology are incorporated into the present invention.

For example, as shown in FIG. 2, L denotes a distance between two opposite inner ends of inward extending arms 44, wherein the inner end of the inward extending arm 44 has an inclined cross section so that the distance L increases from top to bottom thereof to define the taper shaped light filter window. The dimension of the light filter 50 is only required to be slightly larger than L. The light filter 50 can be simply supported at the inward extending arms 44 instead of being supported at the integral base body 112, so that the requiring size of the light filter 50 is reduced according to the present invention while the taper shaped light filter window reduces reflectivity of incident light beams and avoids stray lights.

It is worth mentioning that the extending distance of each downward extending arm 45 controls a downward distance of the light filter 50 to be installed within the light window 111, and the inward extending distance of each inward extending arm 44 controls the size and top surface area of the light filter 50. For example, when the extending distance of each the downward extending arm 45 is larger, the deeper of the light filter 40 can be installed in the light window 111, and the shorter of the distance between the light filter 50 and the photosensitive element 20, so that the back focus length of the camera module also can be configured smaller. When the extending distance of each inward extending arm 44 is larger, the smaller size of the receiving opening 411 of the light filter holder 40 is formed, and the smaller of top surface area of the light filter is required too, so that it is more convenient to obtain a suitable light filter 50 for the present invention, that not only facilitates the assembling process but also reduces the cost of the camera module 100. Of course, the downward extending distance of each downward extending arm 45 should also consider the image quality of the camera module, such as avoiding dark spots such as image of dusts while reducing the back-focus length. The extending distance of the inward extending arms 44 also shall consider the light path of the camera module 100, the layout of the photosensitive area 1311 and non-photosensitive area 1312 of the photosensitive element 20, as well as the margin width of the circuit board 12. For instance, when each inward extending arm 44 extends inwardly, in the condition that a relatively smaller the light filter 50 is used, each inward extending arm 44 should also not block the photosensitive area 1311 of the photosensitive element 20, so as to prevent excessive blocking of the light flux, wherein for circuit board 12 having more remaining space after packaging, the inward extending arms 44 can extend more to position of such remaining space, and for circuit 12 having less remaining space wider space after packaging, the inward extending arms 44 can extend less, so as to reduce the size of the light filter 50 the most while ensuring the imaging quality of the camera module.

The light filter holder 40 is shaped to couple with and corresponding to the integral base 11. In some embodiments, the integral base 11 has a substantially regular symmetrical structure, such as a square ring shape. Accordingly, as the light filter holder 40 is constructed to have a symmetrical configuration in which the light filter holder body 43 has a symmetrical structure, each of the inward extending arms 44 has a uniform shape, and each of the downward extending arms 45 has a uniform shape too. According to some other embodiments, because of the positions of the electronic components to be embedded are different, the integral base 11 may have inward protruding portions of different widths. Accordingly, the light filter holder body 43 may be provided with corresponding grooves or protrusions, or the lengths of the inward extending arms 44 are different, so as to adapt the shape of the integral base 11 and the position of the photosensitive element 20, in order to facilitate the installation of the light filter 50.

According to some embodiments, the light filter holder 40 can be adhered to the integral base 50 by adhering glue, and the thickness of the glue can be adjusted and control to ensure the flatness of the light filter holder 40.

It is worth mentioning that the integral base 11 is sealedly packaged on the top surface 1211 of the circuit board 12 according to this embodiment of the present invention. However, in other embodiments of the present invention, the molded integral base 11 can also be extended to a side surface and/or a bottom surface of the circuit board 12. The person of ordinary skilled in the art should understand that the integral packaging area of the integral base 11 is not limited in the present invention.

According to some embodiments, during the assembling process of the integral base assembly 10 and the light filter holder 40 of the camera module 100, as shown in FIG. 4, the integral base 11 is firstly formed on the base board 121. Then, the light filter 50 is installed at the light filter holder 40. Finally, the light filter holder 40 with the light filter 50 are installed at the integral base 11. Accordingly, the installation of the light filter 50 can be achieved relatively convenient.

It is worth further mentioning that the base board 121 is a flat board according to this embodiment of the present invention, the photosensitive element 20 is attached to the top surface 1211 of the base board 121. In another embodiment, the base board 121 may have an indented receiving slot, and the photosensitive element 20 can be received in the receiving slot, so as to reduce a height of the portion of the photosensitive element 20 protruding above the base board 121. In still another embodiment, the base board 121 may have a through hole penetrating through the thickness of the base board 121, and the photosensitive element 20 is received within the through hole, wherein the relative position of the photosensitive element 20 with respect to the base board 121 is adjustable that, for example, the top surface of the photosensitive element 20 may be in the same plane of the top surface 1211 of the base board 121, or the bottom surface of the photosensitive element 20 may be in the same plane of the bottom surface 1212 of the base board 121. In another embodiment, the base board 121 may have a passage which has a step structure, and the photosensitive element 20 is installed in the passage through a flip chip manner. In another embodiment, the base board 121 may have a reinforcing hole, and the molded portion which is the integral base 11 may be extended into the reinforcing hole so as to increase the structural strength of the integral base assembly 10. In another embodiment, the circuit board 12 may comprise a back board which is overlapped at a bottom side of the base board 121 with a relatively thinner thickness to enhance the structural strength of the integral base assembly 10 and the heat dissipation performance, wherein the back board can be but not limited to a metal plate. In another embodiment, the integral base assembly 10 may comprise an electromagnetic shielding layer which is coated at the outside of the integral base 11 or is provided around the inner side of the integral base 11, so as to increase the anti-electromagnetic interference performance. In some other embodiments, the circuit board 12 may have other alternative modes, so as to add different performances for the integral base assembly 10. However, the person of ordinary skilled in the art should understand that the structural alternative modes of the circuit board 12 are not limitations to the scope of the present invention.

Figure 5:
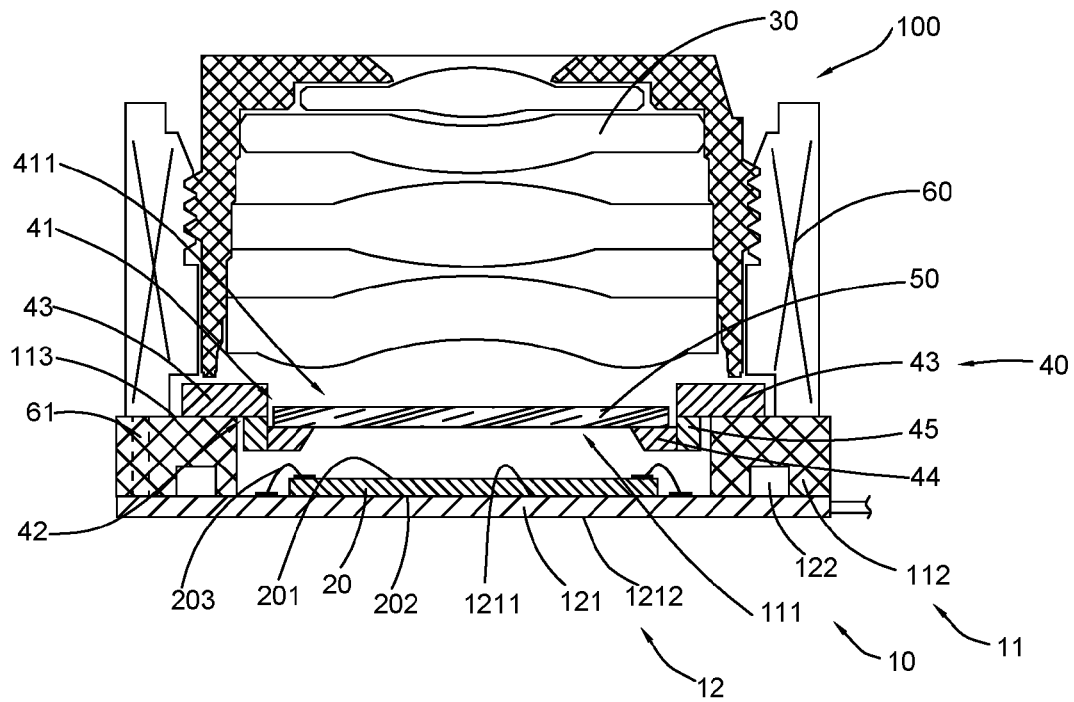
FIG. 5 is a schematic view of a camera module according to an alternative mode of the above first preferred embodiment of the present invention.

According to the above preferred embodiment of the present invention, the light filter holder 40 is installed at the integral base 11, the actuator 60 is installed at the light filter holder 40, as shown in FIGS. 2 to 4. In other words, the light filter holder 40 is provided between the actuator 60 and the integral base 11. In another preferred embodiment of the present invention, as shown in FIG. 5, the light filter holder 40 and the actuator 60 can be installed on the top surface 113 of the integral base 11. More specifically, the light filter holder 40 is installed to the integral base 11 at a position adjacent to the inner side of the integral base 11, while the actuator 60 is installed to the integral base 11 at a position adjacent to the outer side of the integral base 11, so that the actuator 60 and the light filter holder 40 coordinate to share the top surface 113 of the integral base 11.

Figure 6:
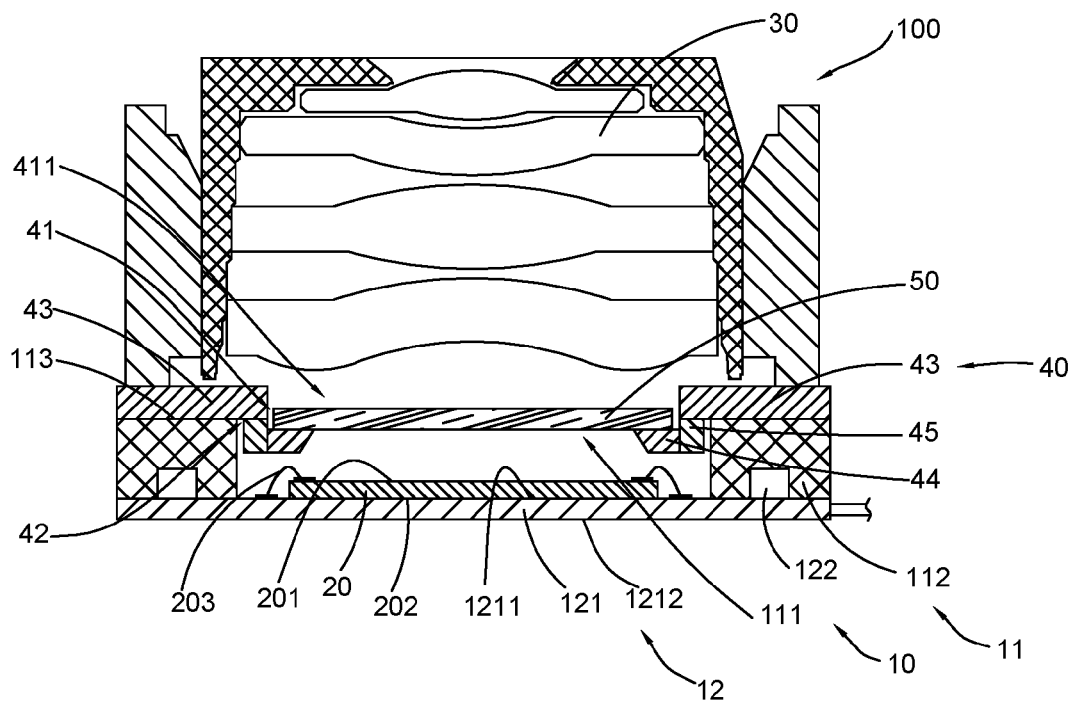
FIG. 6 is a schematic view of a camera module according to another alternative mode of the above first preferred embodiment of the present invention.

It is worth mentioning that the camera module 100 according the above preferred embodiment of the present invention comprises the actuator 60 and the lens 30 is installed at the actuator 60 so as to form an AF camera module which is capable of automatic adjusting its focus length. In another embodiment of the present invention, as shown in FIG. 6, the camera module 100 may not comprise the actuator 60, so that a FF (Fix Focus) camera module is provided, and the lens 30 may be directly installed at the light filter holder 40. The person of ordinary skilled in the art should understand that the type of the camera module 100 is not limited in the present invention.

It is understandable for the person of ordinary skilled in the art that the light filter holder 40 can be manufactured by using the manufacturing process of the conventional holder, and the specification of the light filter holder 40 is designed according to the specification of the integral base 11. For instance, the light filter holder 40 is manufactured through an injection molding process, or other assembling process such as an adhering process.

It is worth mentioning that the parts of the light filter holder 40, i.e. the light filter holder body 43, the inward extending arms 44 and the downward extending arms 45 can be made of the same material and are integrally formed as an integral body, or can be made of different materials integrally connected together. In order to facilitate the description, different shadows are used to represent different parts, but are not intended to be interpreted as a limitation to the material and the structure of the light filter holder 40.

It is still worth mentioning that the light filter holder 40 can be used for installing the light filter 50, and also can be used for installing the lens 30 or the actuator 60. The person of ordinary skilled in the art should understand that the components installed to the light filter holder 40 are not restricted.

Figure 7:
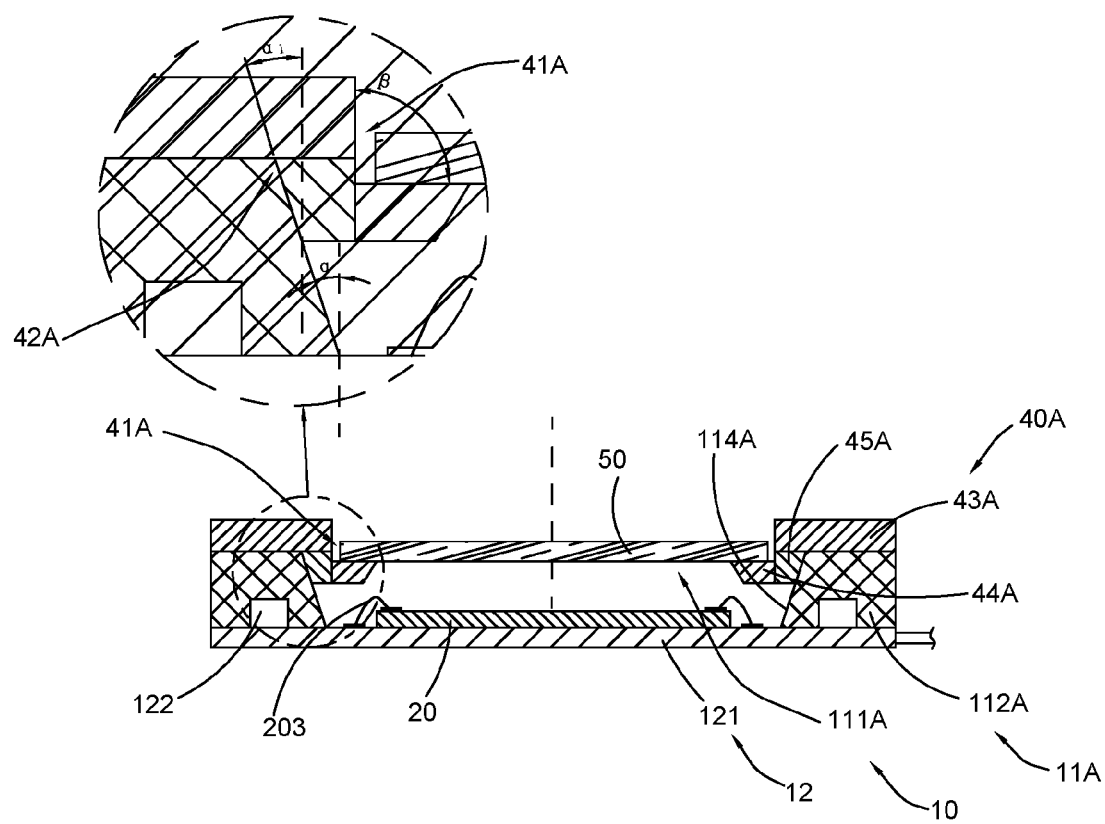
FIG. 7 is a sectional view illustrating a first alternative mode of the integral base assembly and the light filter holder of the camera module according to the above first preferred embodiment of the present invention.

Referring to FIG. 7, an alternative mode of the integral base assembly and the light filter holder according to the first preferred embodiment of the present invention is illustrated. In this alternative mode, the inner surface of the integral base 11A is inclinedly extended from bottom to top to form the light window 111A having a gradually increasing size along the light or photosensitive path. More specifically, the integral base 11A has an inner surface 114A which defines an inclination angle α with respect to the longitudinal light axis of the camera module 100, so that an opening of the light window 111A has increasing size that facilitates, the manufacture of the integral base 11A. The inclination angle α may have a range of 3°~80°. In some embodiments, the value of the inclination angle α is 3°~30°, such as within 3°~15°, 15°~20°, or 20°~30°. Correspondingly, the engaging groove 42A of the light filter holder 40A defines an engaging angle α1 which is corresponding to the inclination angle α, so that the shape of the engaging groove 42A adapts the inclined shape of the inner surface 114A, and thus the light filter holder 40A can be more stably installed.

In other words, each downward extending arm 45A is longitudinally, inclinedly and downwardly extended from the light filter holder body 43A so as to define the engaging angle α1 corresponding to the inclination angle α. Each inward extending arm 44A is transversely (horizontally) extended from the respective downward extending arm 45A to define a supporting angle β which is larger than 90°, so as to facilitate the assembly of the light filter 50. Of course, the integral base 11 having the inclination angle α also be installed with the light filter holder 40 which does not form the engaging angle α1 and the supporting angle β.

Figure 8A:
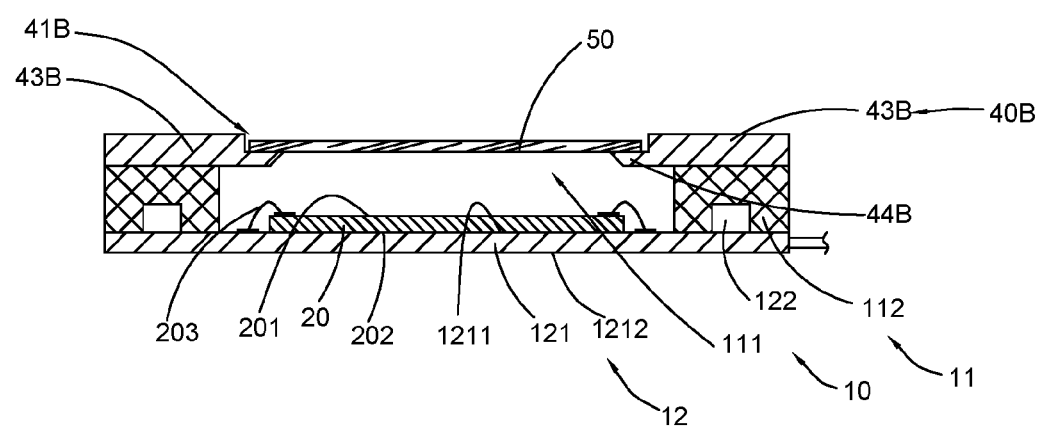
FIG. 8A is a sectional view illustrating a second alternative mode of the integral base assembly and the light filter holder of the camera module according to the above first preferred embodiment of the present invention.

As shown in FIG. 8A, a second alternative mode of the integral base assembly and the light filter holder according to the above first preferred embodiment of the present invention is illustrated. The light filter holder 40B has a supporting groove 41B communicated with the light window 111 of the integral base 11B for providing an installation site for the light filter 40. In other words, the light filter 50 is installed at the supporting groove 41B.

More specifically, the light filter holder 40B comprises a light filter holder body 43B and at least one inward extending arm 44B which is transversely, integrally and inwardly extended from a lower portion of an inner side the light filter holder body 43B to define the supporting groove 41B thereon. The light filter holder body 43B is connected on the integral base 11.

In other words, the light filter holder 40B does not comprise the downward extending arm 45 and does not have the engaging groove 42 as provided in the first preferred embodiment. Therefore, the installation site of the light filter 50 may not be downwardly located within the light window 111. However, through the inward extending distance of each inward extending arm 44B, the top surface area and the size of the light filter 50 also can be reduced, wherein the light filter 50 is received in the supporting groove 41, so that the relative height of the light filter 50 with respect to the light filter holder 40B is reduced.

Figure 8B:
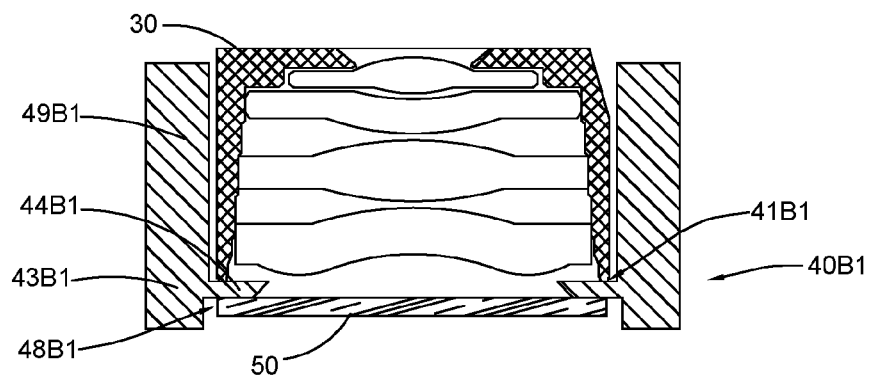
FIG. 8B is a sectional view illustrating an alternative example of the second alternative mode of the integral base assembly and the light filter holder of the camera module according to the above first preferred embodiment of the present invention.

FIG. 8B illustrates another alternative example of the second alternative mode of the integral base assembly and the light filter holder according to the above first preferred embodiment of the present invention. The light filter holder 40B1 has a supporting groove 41B1 and an attaching groove 48B1 for providing assembling sites for the lens 30 and the light filter 50 respectively.

More specifically, the light filter holder 40B1 comprises a light filter holder body 43B1 and at last one inward extending arm 44B1 which is transversely, integrally and inwardly extended from an inner side of the light filter holder body 43B1 to define the supporting groove 41B1 on top of the inward extending arm 44B1 and the attaching groove 48B1 below the inward extending arm 44B1. The light filter holder 40B1 further provide a lens supporting portion 49B1 integrally and upwardly extended from the light filter holder body 43B1 to define the supporting groove 41B1 therein for receiving the lens 30 to install on top of each inward extending arm 44B1. According to this alternative example, the light filter 50 is received in the attaching groove 48B1 and attached at a bottom side of each inward extending arm 44B1.

Furthermore, in this alternative example of the present invention, the lens supporting portion 49B1 has a flat inner surface without screwing threads for installing the lens 30 without engaging screw threads.

In other words, when the camera module 100 is a Fix Focus camera module, the lens 30 can be directly installed within the light filter holder 40B1, so as to retain the lens 30 in position. Particularly, there may be gap between the lens 30 and the lens supporting portion 49B1, so as to facilitating the assembly and adjustment of the lens 30 before the lens 30 is fixed.

Figure 8C:
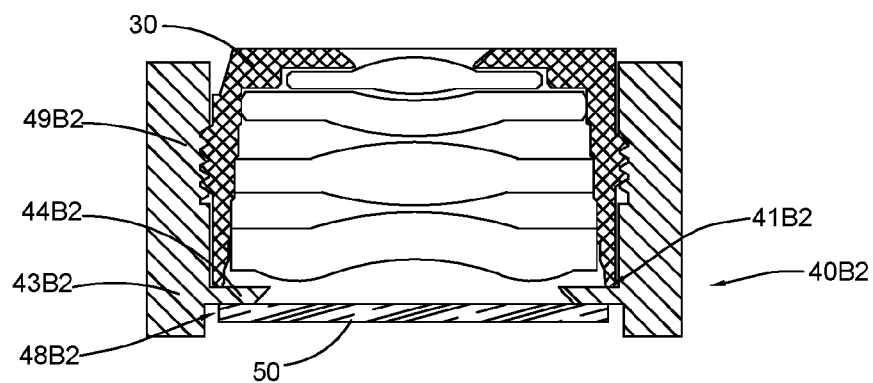
FIG. 8C is a sectional view illustrating another alternative example of the second alternative mode of the integral base assembly and the light filter holder of the camera module according to the above first preferred embodiment of the present invention.

FIG. 8C illustrates another alternative example of the second alternative mode of the integral base assembly and the light filter holder according to the above first preferred embodiment of the present invention. The light filter holder 40B2 has a supporting groove 41B2 and an attaching groove 48B2 for providing assembling positions for the lens 30 and the light filter 50 respectively.

More specifically, the light filter holder 40B2 comprises a light filter holder body 43B2 and at least one inward extending arm 44B2 which is transversely, integrally and inwardly extended from an inner side of the light filter holder body 43B2 to define the supporting groove 41B2 on top of each inward extending arm 44B2 and the attaching groove 48B2 below each inward extending arm 44B2. The light filter holder 40B2 further comprises a lens supporting portion 49B2 which is integrally and upwardly extended from the light filter holder body 43B2 to define the supporting groove 41B2 therein for receiving the lens 30. According to this alternative example, the light filter 50 is received in the attaching groove 48B2 and attached to a bottom side of each inward extending arm 44B2.

Furthermore, in this embodiment of the present invention, the lens supporting portion 49B2 has an inner screwing structure for installing the lens 30 with engaging screw threads.

In other words, when the camera module 100 is a Fix Focus camera module, the lens 30 can be directly installed within the light filter holder 40B2, so as to screw the lens 30 in position by means of the inner screwing structure.

It is worth mentioning that in the above two embodiments, the possible alternative modes and alternative examples of the light filter holder illustrating that the lens 30 can be directly installed in the light filter holder 40B1 or 40B2 are exemplary only but are not a limitation to the scope of the present invention.

Figure 9A:
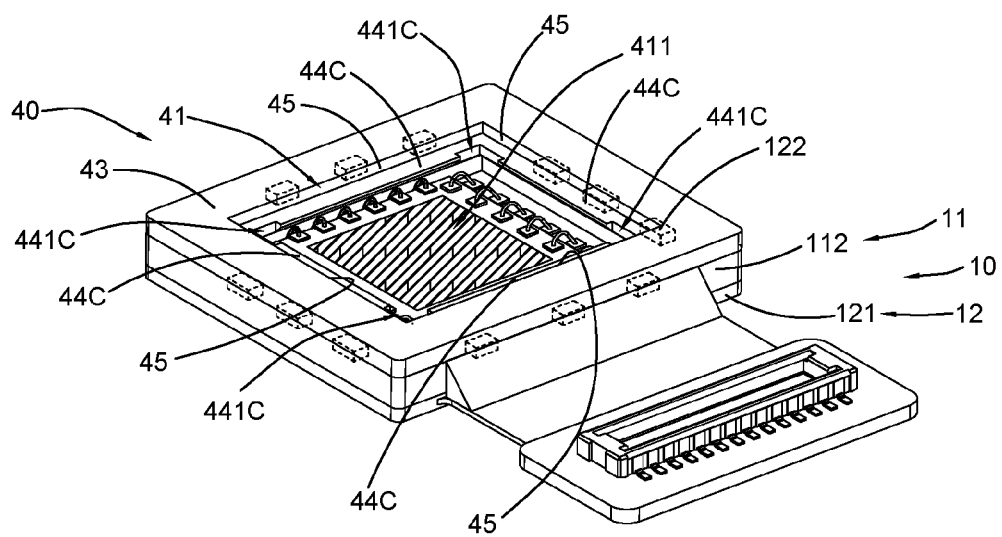
FIG. 9A is a perspective view illustrating a third alternative mode of the light filter holder of the camera module according to the above first preferred embodiment of the present invention.

Referring to FIG. 9A, a third alternative mode of the light filter holder according to the first preferred embodiment of the present invention is illustrated. In this embodiment, the light filter holder 40 has at least one corner opening 441C which is provided at a corner position thereof, for facilitating the assembling of the light filter 50 and reducing the edge shadow of the image of the camera module resulting from a sharp corner. More specifically, each corner opening 441C is formed between two adjacent inward extending arms 44C, and is extended outwardly so as to increase the light flux at the corner position of the light filter holder 40 of the camera module. In other words, the two adjacent inward extending arms 44C form the corner opening 441C therebetween which is communicated to outside so as to increase light flux at the corner opening 441C of the light filter holder 40, and thus the edge shadow is reduced.

More specifically, in one embodiment, the corner opening 441C is an expanded square corner opening. For example, but not limiting, the light filter holder 40 has four such expanded square corner openings at the four corner positions thereof respectively. In other embodiments, each corner opening 441C may be a corner opening with an arc angle so as to increase the light flux at the respective corner of the light filter holder 40. Of course, in some embodiments, there may not have such corner openings 441C provided. The person of ordinary skilled in the art should understand that the shape, number, and position of the corner openings 441C are not limited in the present invention.

Figure 9B:
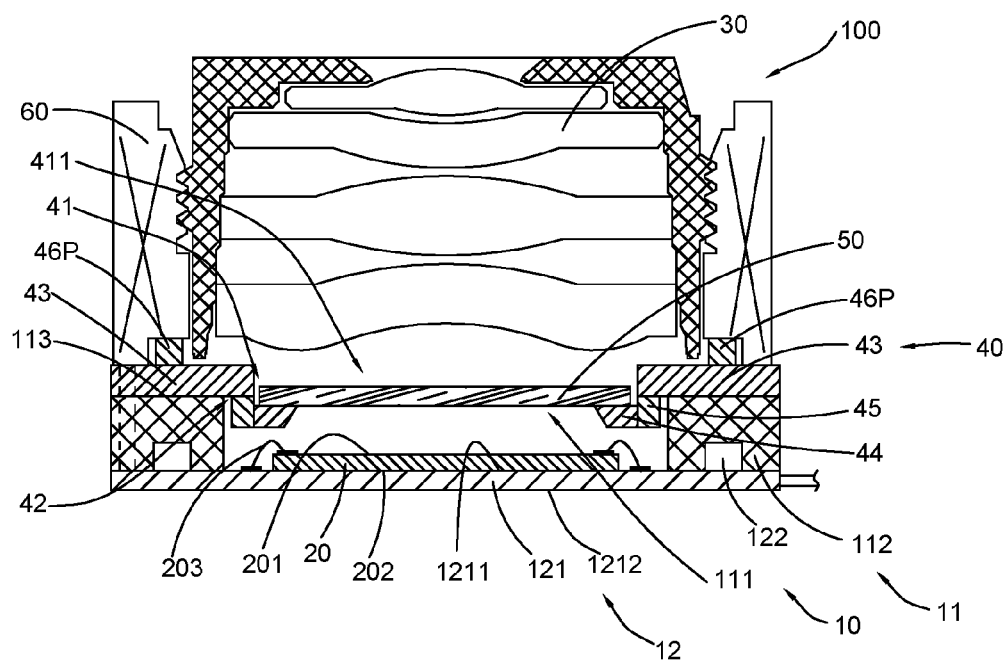
FIG. 9B is a schematic view illustrating another alternative mode of the integral base assembly and light filter holder of the camera module according to the above first preferred embodiments of the present invention.

As shown in FIG. 9B, another alternative mode according to the above first preferred embodiment of the present invention is illustrated. The light filter holder 40 comprises at least one retaining protrusion 46P which is at least partially, protrudedly, and upwardly extended from the top of the light filter holder body 43, so as to retain an installed component or prevent dusts or lights from reaching the inner space of the camera module. For example, but not limiting, each retaining protrusion 46P is used for retaining the actuator 60 or the lens 30 in position. Particularly, in one embodiment, the retaining protrusion 46P is provided at a middle position of the holder body 43 for dividing the holder body 43 into inner and outer portions, wherein the outer portion is used for installing the actuator 60 while the inner part is used for installing the lens 30. In such a configuration, each retaining protrusion 46P is adapted to retain the actuator 60 in position, so as to decrease the deviation of the actuator 60. In addition, during the assembling process, the retaining protrusion 46P can prevent the glue used for installing the actuator 60 from overflowing into the inner space to contaminate the lens or other inner components. Particularly, the retaining protrusion can be a ring shaped protrusion so as to integrally retaining the actuator 60 in position and block the glue from overflowing into the inner space.

It is worth mentioning that according to other embodiments of the present invention, a surface of the retaining protrusion 46P can be provided with screwing threads for directly installing the lens 40. And when the retaining protrusion 46P is provided with screwing threads at an outer side thereof, it is suitable for coupling with the lens 30 with a relatively large pore diameter.

Figure 10A:
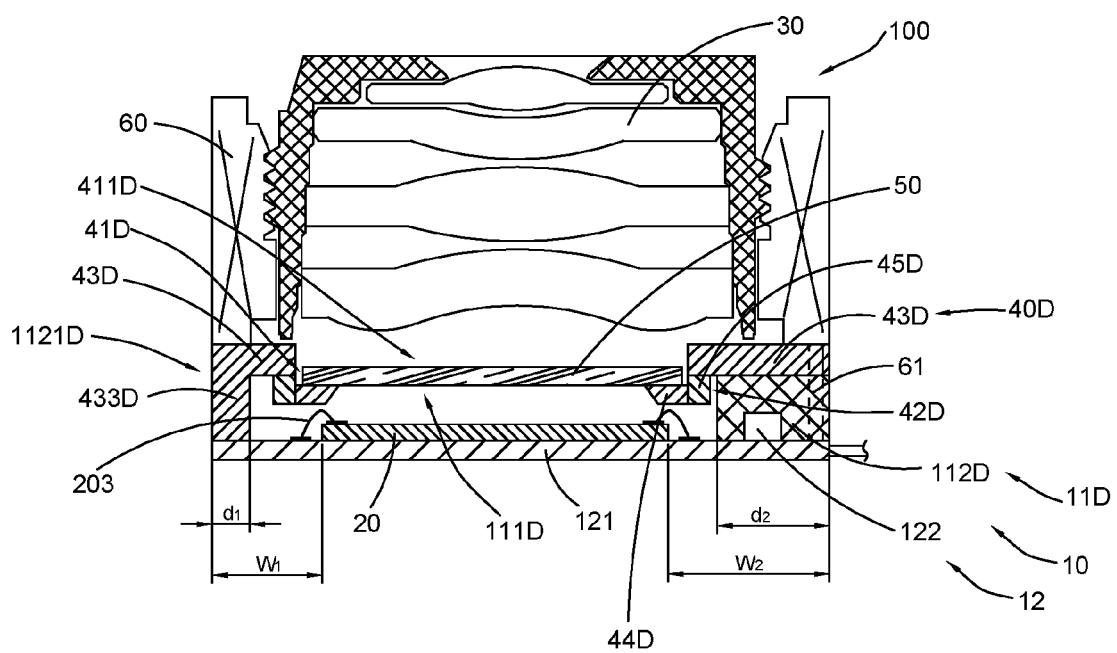
FIG. 10A is a sectional view from one direction of a camera module according to a second preferred embodiment of the present invention.
Figure 10B:
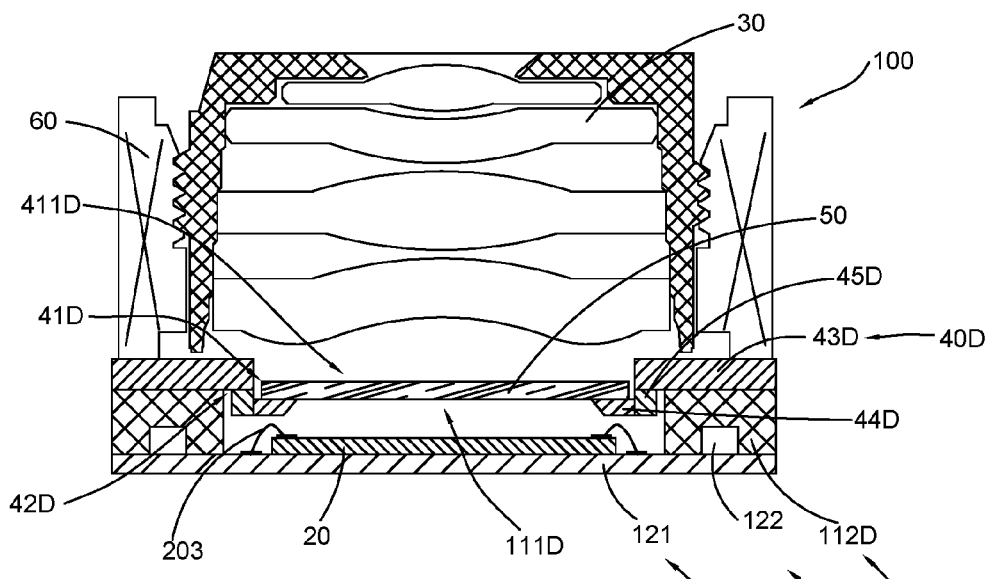
FIG. 10B is another sectional view from another direction of the camera module according to the second preferred embodiment of the present invention.
Figure 11:
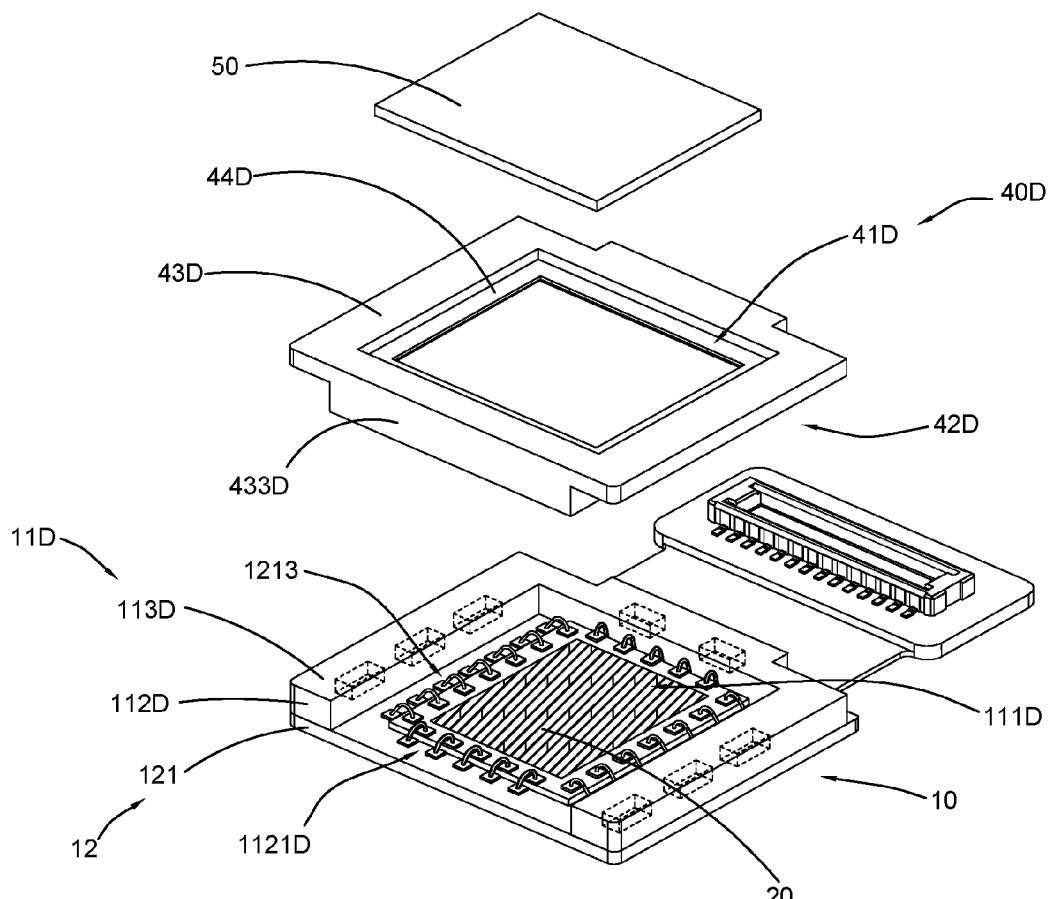
FIG. 11 is an exploded view of the integral base assembly and the light filter holder of the camera module according to the above second preferred embodiment of the present invention.
Figure 12A:
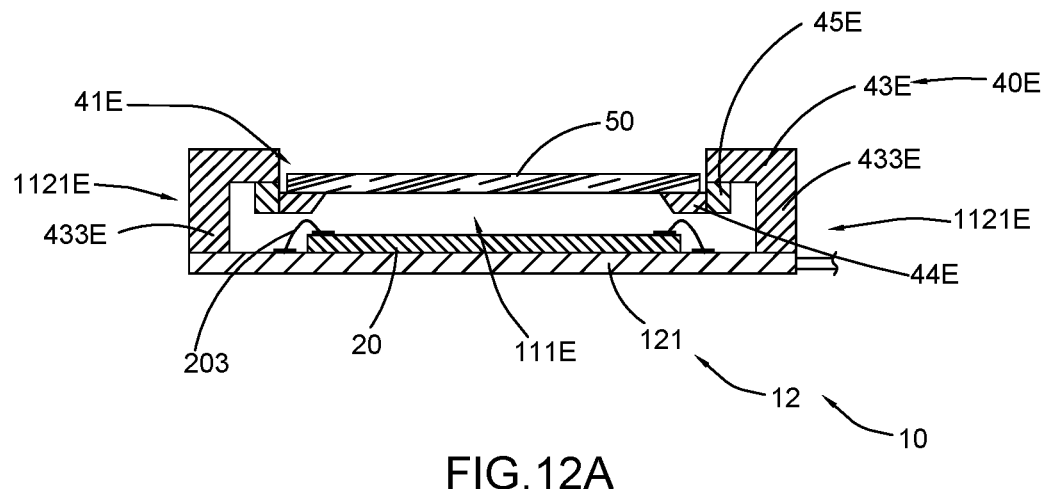
FIG. 12A is sectional view from a direction illustrating an alternative mode of the integral base assembly and the light filter holder of the camera module according to the second preferred embodiment of the present invention.
Figure 12B:
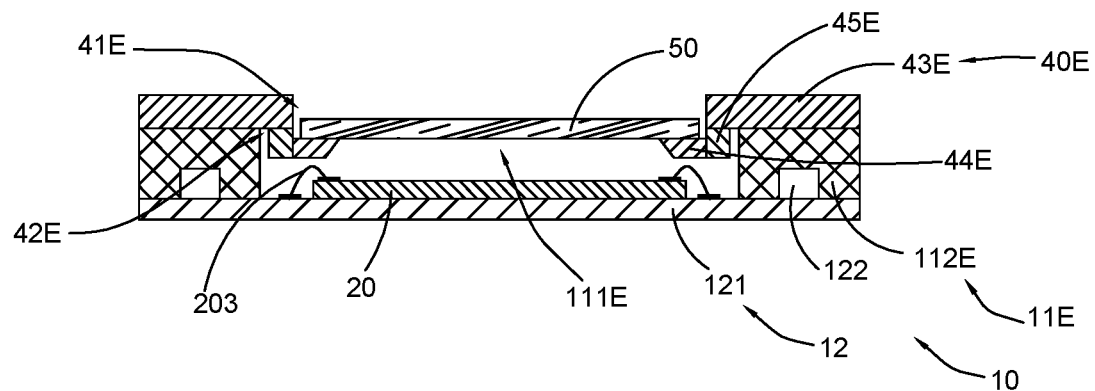
FIG. 12B is another sectional view from another direction illustrating the alternative mode of the integral base assembly and the light filter holder of the camera module according to the second preferred embodiment of the present invention.

Referring to FIGS. 10A to 11, an integral base assembly according to a second preferred embodiment of the present invention is illustrated. The integral base 11D comprises a base body 112D with at least one light window 111D therein for providing a light passage for the photosensitive element 20. More specifically, the base body 112D has at least one opening 1121D which communicates the light window 111D to outside, and the light filter holder 40D is supplemental to cover the opening 1121D so as to form the light window 111D with closed and sealed side surfaces.

In other words, in this second embodiment, the base body 112D is not a complete enclosure structure, but has the opening 1121D at one side thereof, and the light filter holder 40D provides a supplemental means to seal and close the opening 1121D of the base body 112D.

The light filter holder 40D comprises at least one extending leg 433D as the supplemental means which is integrally and downwardly extended from the light filter holder body 43D to the base board 121, so as to seal and close the opening 1121D. For example, but not limiting, the extending leg 433D is connected to the base board 121 and/or the base body 112 by, for example, adhering.

More specifically, the base body 112D forms a U-shaped structure, and the body of the light filter holder 40D is engaged with the U-shaped base body 112D, and the extending leg 433D is adapted to be fittingly positioned at the opening 1121D of the U-shaped structure so as to form a closed structure of the integral base 11D, so that a sealed and closed inner environment is formed within the integral base 11D.

In other words, in this second embodiment, the integral base 11D and the light filter holder 40D are combined to achieve the holder function of the camera module, so that the advantages of integral encapsulating process and the function of the light filter holder 40D are all incorporated in the present invention.

It is worth mentioning that since the compact size requirement of the camera module is greater and greater, the layout of the electronic components 122 of the circuit board 12, the positions of the electronically connecting elements 203, and the packaging positions of the integral base 11 should be properly configured. That is while fully utilizing the base board 121, the occupying areas of these components should be as small as possible, so as to reduce the overall size of the camera module. According to this second embodiment of the present invention, the integral base 11 is integrally molded and packaged at the positions of the electronic components 122 that not only utilizes the space around and locations of the electronic components 122 by embedding all the electronic components 122 to form the integral base 11, but also reduces the electromagnetic interference between the electronic components 122 and the electrically connecting elements 203. In addition, at one side of the base board 121 where has no electronic component being provided, the extending leg 433D of the light filter holder 40D is provided to fully utilize the remaining space and position of the base board 121. On the other hand, during the adhering procedure of the light filter holder 40D, a flatness of the integral base 11D can be adjusted and complemented, so as to ensure a good installing condition for the camera module.

It is still worth mentioning that the base board 121 is provided with the photosensitive element 20, the electronic components 122, the electronically connecting elements 203, the integral base 11D, and the light filter holder body 40D, wherein the electronic components 122, the electronically connecting elements 203, the integral base 11D, and the light filter holder body 40D are provided around the outer periphery of the photosensitive element 20. In other words, the base board 121 has a plurality of installing regions 1213 positioned around the outer sides of the photosensitive element 20. In order to increase the space utilization rate of the base board 121, the electronic components 122 are provided at the installing regions 1213 at one side or two sides of the base board 121. And the installing regions 1213 with the electronic components 122 provided thereon are integrally packaged by the integral base 11D, so as to embed the electronic components 122 in the integral base 11D. The regions having no electronic component provided thereon and/or the regions adjacent to the installing regions 1213 for the electronic connecting element 133 can be used for connecting with the light filter holder 40D, so that the light filter holder is able to utilize such narrow space and position, and that the light filter holder 40D and the integral base 11D are cooperatively combined to form the light window 111D, so as to provide the light passage for the photosensitive element 20. In other words, the photosensitive element 20 may not be provided at a center location of the base board 121, but can be deviated to be located near one side of the base board 121, so that installing regions 1213 with different widths are formed to facilitate the electronic components 122 to be grouped together and installed while the molded integral base 11D with the electronic components 122 sealedly embedded therein can substantially avoid electromagnetic interference among the electronic components 122. Furthermore, the extending leg 433D of the light filter holder 40D according to this embodiment is connected to the relative narrower region that has no electronic component and electric connecting element provided thereon, while the relative wider regions are used for installing the electronic components 122 and the electrically connecting elements 203, as well as for integrally forming the integral base 11D to embed the electronic components 122. For example, the two opposing sides of the photosensitive element 20 have a width W1 and a width W2 respectively, wherein W1 is smaller than W2, the region having the width W1 is used for connecting the extending leg 433D of the light filter holder 40D, and the region having the width W2 is used for providing the electronic components 122, so that the electronic components 122 are grouped and gathered to provide at the wider region(s) at the side(s) having the relatively wider width.

For example, but not limiting, in some embodiments, during the assembling of the integral base assembly 10, the photosensitive element 20 is attached to the base board 121 in such a manner that installing regions 1213 of different widths by installing the photosensitive element at a position near and closer to one side of the base board 121, and then the electronic components are adapted to be installed at the wider regions. Furthermore, by means of integral packaging, the integral base 11D is integrally molded to form at the installing regions 1213 provided with the electronic components 122 and to embed those electronic components 122 therein. Then, the light filter holder 40D is installed at the integral base 11D. In another embodiment, the electronic components are adhered to predetermined positions, such as the installing regions 1213, and then the integral base 11D is formed before installing the photosensitive element 20.

It is still worth mentioning that the light filter holder 40D can be manufactured through the injection molding process. Therefore, in comparison with the forming process of the integral base 11D, a relatively smaller thickness is obtained. In other words, the thickness d1 of the light filter holder 40D is smaller than the thickness d2 of the integral base 11D, so that the installing regions 1313 of the base board 121 with different thickness can be reasonably utilized.

As shown in FIGS. 12A to 13A, an alternative mode of the integral base assembly and the light filter holder according to the above second preferred embodiment of the present invention is illustrated. The integral base 11E comprises a base body 112E with at least one light window 111E for providing the light passage for the photosensitive element 20. More specifically, the base body 112E has two openings 1121E at two sides thereof each communicating the light window 111E to outside, wherein the light filter holder 40E covers the two openings 1121E so as to sealingly close up two sides of the light window 111E correspondingly.

Accordingly, the light filter holder 40E comprises two extending legs 433E which are respectively, integrally and downwardly extended from the light filter holder body 43E towards the base board 121 to close the two openings 1121E of the integral base 11E. For example, but not limiting, each extending leg 433E is connected to the base board 121 and/or the base body 112E by adhering.

More specifically, according to one embodiment, the base body 112E of the integral base 11E is constructed to have a parallel structure including two pieces parallelly molded on two sides of the base board 121 embedding the electronic components therein while defining the two openings 1121E at the other two sides of the base board 121, wherein the light filter holder body 43E is sat on two pieces of the parallel structure so as to engage with the base body 112E while the two extending legs 443E of the light filter holder 40E are complemented extended downwardly to fittingly cover the two openings 1121E between the two pieces of the parallel structure of the base body 112E, so that the base body 112E forms a sealed and closed inner environment as the light window 111E defined between the two pieces of the parallel structure of the base body 112E and the two extending legs 443E, communicating with the receiving opening of the light filter holder 40E to form the light passage for photosensitive element 20.

Figure 13A:
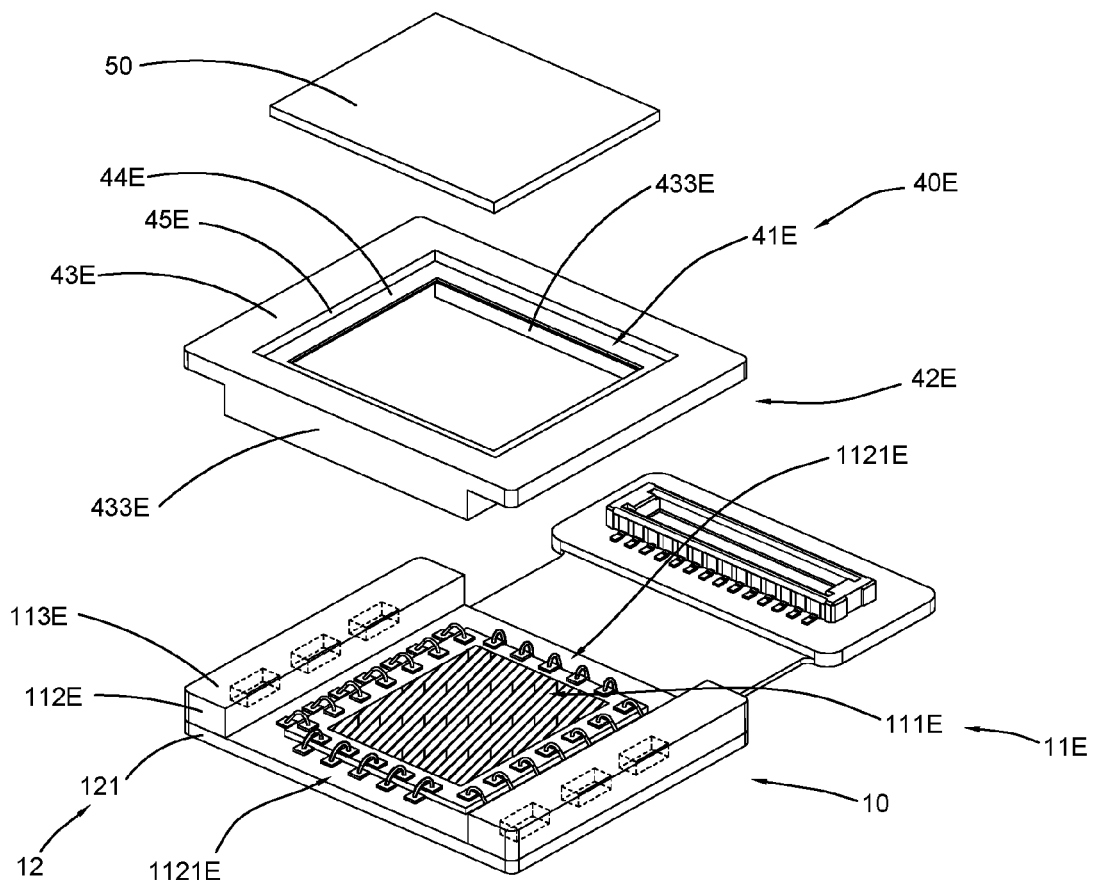
FIG. 13A is an exploded view illustrating the alternative mode of the integral base assembly and the light filter holder of the camera module according to the above second preferred embodiment of the present invention.
Figure 13B:
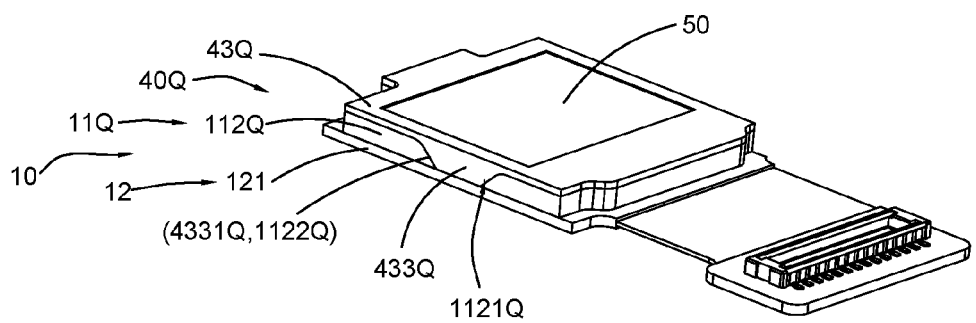
FIG. 13B is a schematic view illustrating another alternative mode of the integral base assembly and the light filter holder of the camera module according to the above second preferred embodiments of the present invention.
Figure 13C:
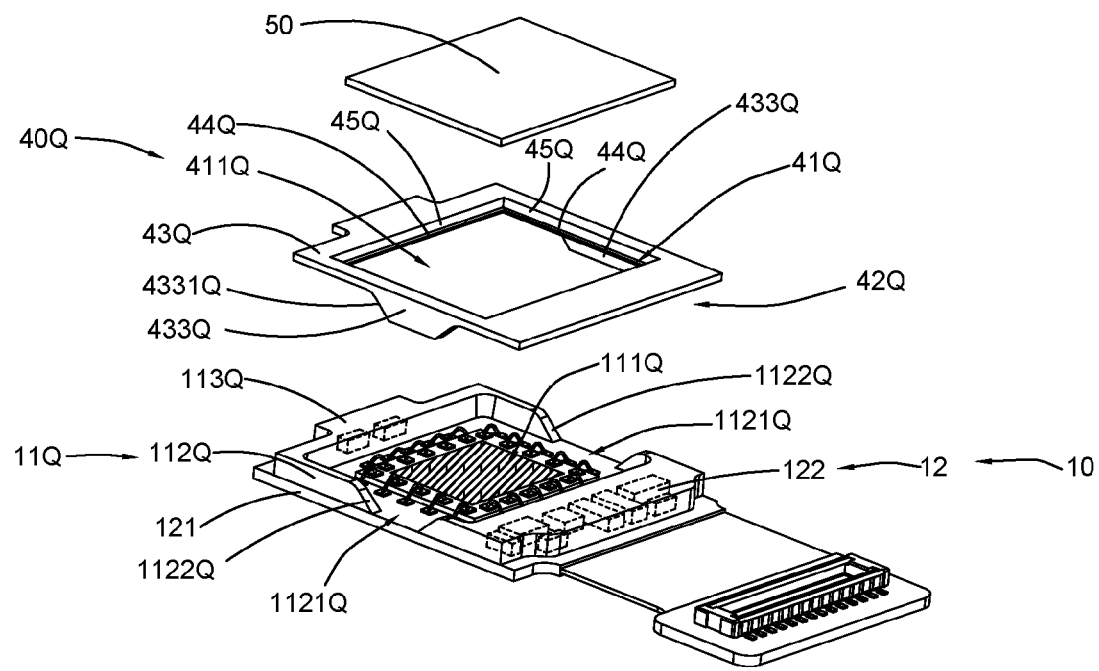
FIG. 13C is an exploded view of the integral base assembly and the light filter holder of the array camera module of FIG. 13B.

Referring to FIGS. 13B to 13C, another alternative mode of the integral base and the light filter holder according to the second preferred embodiment of the present invention is illustrated. In this alternative mode, the integral base 11Q comprises a base body 112Q having at least one light window 111Q provided therein for providing the light passage for the photosensitive element 20. More specifically, the integral base 11Q has two openings 1121Q formed at two middle portions of two sides thereof respectively to communicate the light window 111Q to outside, wherein the light filter holder 40D provides means for covering the two openings 1121Q to sealingly close the side periphery of the light window 111Q. Comparing with the above alternative mode as shown in FIGS. 12A to 13A, the difference is that the two openings of this alternative mode are arranged at the middle portion of the opposite sides and constructed to have a reversed trapezoidal shape, so as to better and fittingly retain and install the light filter holder 40Q in position. In other words, the two opening 1121Q divides the base body 112Q into two opposite U-shaped members, and when the light filter holder 40Q is installed with the base body 112Q, the two members of the base body 121Q are joined and combined by the light filter holder 40Q sealingly.

Accordingly, the light filter holder 40Q comprises two extending legs 433Q each is integrally and downwardly extended from the light filter holder body 43D to the base board 121, so as to seal and cover the two openings 1121Q respectively. More specifically, the two extending legs 433Q are arranged at two opposite sides, and each of which has a reversed trapezoidal structure for fittingly placing in and sealingly covering the respective opening 1121Q. For example, when the light filter holder 40Q is being installed, each extending leg 433Q is retained at the corresponding opening 1121Q. In other words, each opening 1121Q has a width size increasing form bottom to top and each extending leg 433Q is gradually getting wider from bottom to top to fill up the corresponding opening 1121Q, so as to seal and close the corresponding opening 1121Q.

Person of ordinary skilled in the art should understand that the shape and size of the opening 1121Q in the embodiment of the present invention is exemplary only but is not for limiting the invention.

Particularly, in some embodiments, the electronic components can be collectively arranged at just one side of the base board 121 and are embedded by at least a portion of the base body 112Q, and more particularly, they are embedded by the base body 112Q at a wider portion thereof. The other side of the base body 121 which is not provided with the electronic components 122Q is corresponding to the relatively narrower portion of the base body 112Q. The light filter holder 40Q is installed at the base body 112Q and the two extending legs 433Q fittingly fill up the two openings 1121Q provided between the two opposing wider and narrower portions of the base body 112Q respectively.

Furthermore, the base body 112Q has at least one opening wall 1122Q, embodying two opening walls 1122Q defining the corresponding opening 1121Q therebetween. Each opening wall 1122Q is inclinedly, integrally and upwardly extended from the base board 121, so as to form the reversed trapezoidal shaped opening 1121Q. Correspondingly, each extending leg 433Q has at least one complementary wall 4331Q which is sized and shaped corresponding to the respective opening wall 1122Q, so that the configuration of each extending leg 433Q is fitted to be filled in the respective opening 1121Q, so as to seal and close the periphery of the opening 111Q. It is understandable that a gap may be remained between the complementary wall 4331Q of each extending leg 433Q and the corresponding opening wall 1122Q of the opening 112Q so as to adapt for a bonding material such as a glue to be applied in such gap. However, the size and existence of the gap is should not be considered as a limitation to the present invention.

Particularly, the complementary wall 4331Q of each extending leg 433Q and the corresponding opening wall 1122Q of the base body 112Q are secured and sealed together by the adhering glue.

Figure 14:
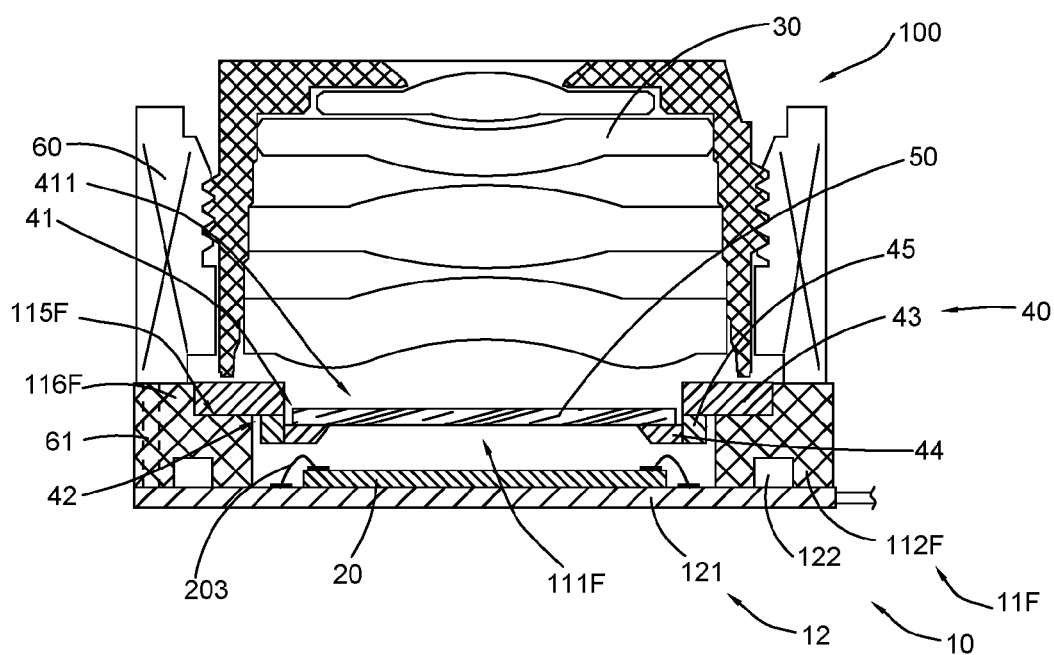
FIG. 14 is a sectional view of a camera module according to a third preferred embodiment of the present invention.

Referring to FIG. 14 of the drawings, a camera module and its integral base assembly and light filter holder according to a third preferred embodiment of the present invention are illustrated. The integral base 11F further has an installing groove 115F provided facing and communicating with the light window 111F. According to this third embodiment of the present invention, the installing groove 115F is a ring shaped communicating groove configured to install the light filter holder 40 thereat.

More specifically, the light filter holder 40 and the integral base 11F are engaged with each other by sitting the outer portion of the lighter filter holder 40 at the installing groove 115F of the integral base 11F while the inner portion of the integral base 11F is engaged in the engaging groove 42 of the light filter holder 40, so that the light filter holder body 43 of the light filter holder 40 is received in the installing groove 115F and supported by the integral base 11F.

The light filter holder body 43 of the light filter holder 40 has a predetermined thickness, and it should not in contact with any components positioned above it, such as the actuator 60 or the lens 30. Preferably, when the light filter holder 40 is installed in the installing groove 115F, a top surface of the light filter holder 40 has the same plane with a top surface of the base body 112F, so that the light filter holder 40 will not protrude from the base body 112F, and will not have any contact with the actuator 60 or the lens 30 installed thereabove. Of course, according to other embodiments of the present invention, the top surface of the light filter holder 40 may also be protruded out of the base body 112F, so as to fit with the actuators 60 of different sizes and retain the corresponding actuator 60 in position, and that it can also prevent the glue for installing the actuator 60 from overflowing into the interior of the camera module. However, the present invention is not limited in this aspect.

More specifically, the integral base 11F comprises a plurality of protrusion steps 116F which is protruded and extended from the base body 112F to form the installing groove 115F. Accordingly, in other embodiments, a circular integral protrusion step may be formed to define the installing groove 115F.

According to this third embodiment of the present invention, the integral base 11F comprises four protrusion steps 116F which are integrally connected to form a square ring shaped protrusion structure. The actuator 60 has at least a portion installed at the protrusion steps 116 to form an Auto Focus camera module. The actuator 60 is operatively connected to the circuit board 12 through at least one connecting pin 61. In other embodiments, the lens 30 may have at least a portion installed at the protrusion steps 116F, so that a Fix Focus camera module is formed.

According to this third embodiment of the present invention, each the protrusion step 116F has the same transversal width, and each the corresponding installing groove 115F has the same width too. Correspondingly, the width of the light filter holder body 43 of the light filter holder 40 can be designed according to the size of the installing groove 115, while the light filter holder body 432 has a consistent width. According to some other embodiments of the present invention, the width of each the protrusion stair 116F can be varied according to different requirements. Accordingly, the width of the light filter holder body 43 can be varied corresponding to the varied width of the installing groove 115F.

Figure 15A:
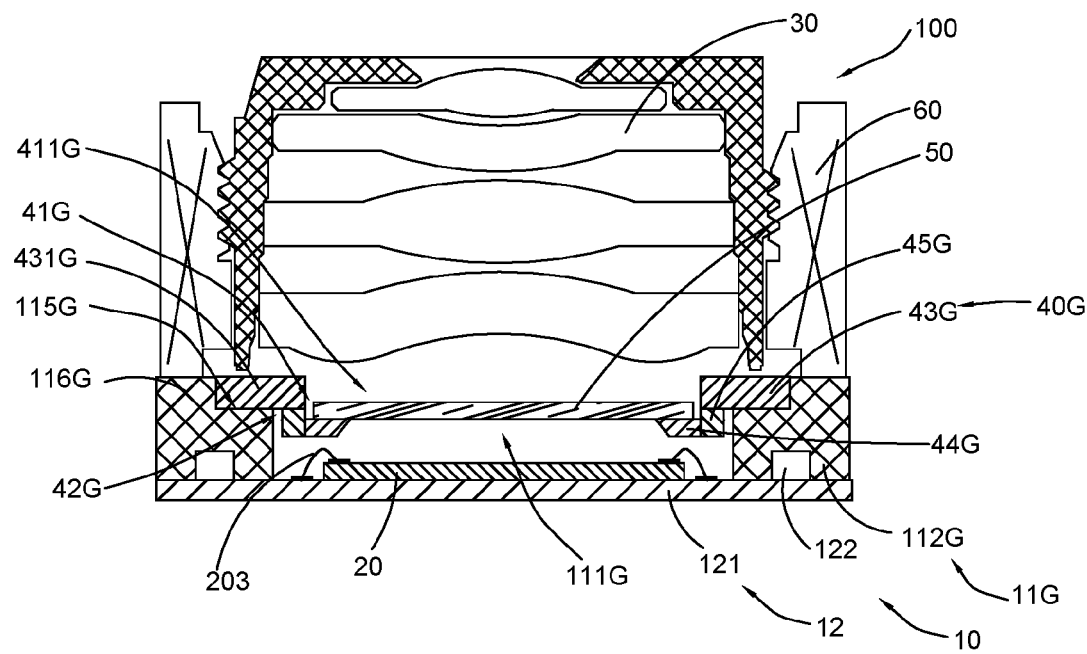
FIG. 15A is a sectional view from one direction of a camera module according to a fourth preferred embodiment of the present invention.
Figure 15B:
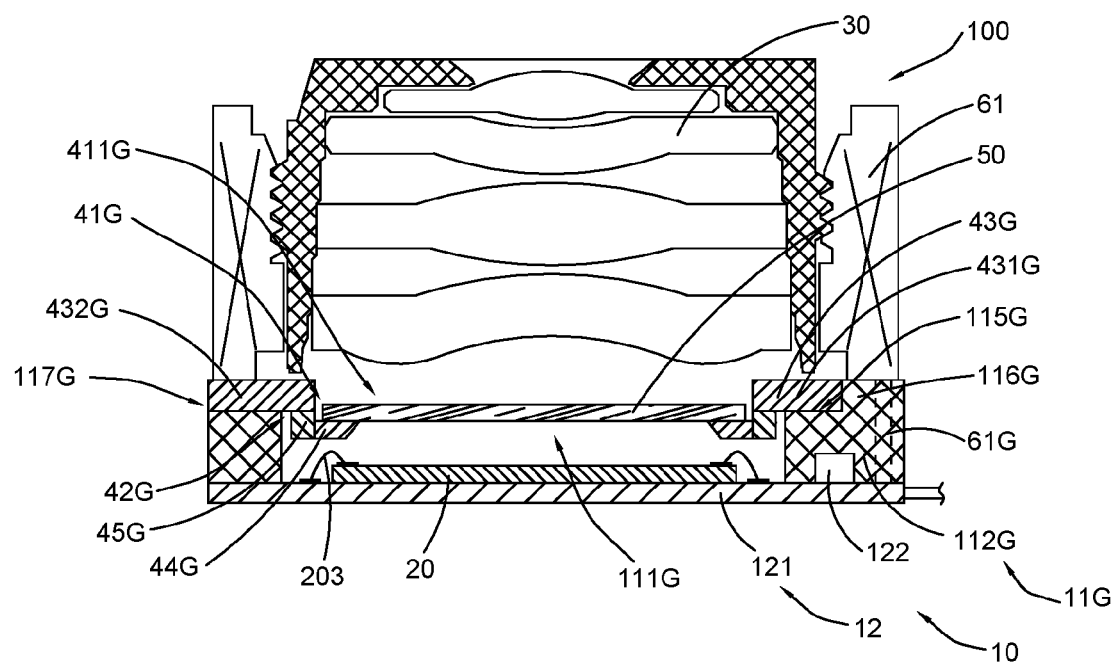
FIG. 15B is another sectional view from another direction of the camera module according to the fourth preferred embodiment of the present invention.

Referring to FIGS. 15A and 15B, a camera module according to a fourth preferred embodiment of the present invention is illustrated, wherein the FIG. 15A is a sectional view viewed from a first direction and the FIG. 15B is a sectional view viewed from a second direction that is perpendicular from the first direction, so as to illustrate the four sides of the camera module. The integral base 11G has at least one installing groove 115G provided facing and communicating with the light window 111G and at least one notch 117G extended from the light window 11G to outside so as to communicate the light window 111G with outside. In other words, the installing groove 115G is an open end communicating groove but not a close end structure. The light filter holder 40G is installed at the installing groove 115G. More specifically, in this fourth embodiment, the installing groove 115G is a U-shaped groove, and the opening of the U-shaped groove defines the notch 117G.

More specifically, the light filter holder 40G is engaged in the installing groove 115G of the integral base 11G, so that the light filter holder body 43G of the light filter holder 40G is received in the installing groove 115G and supported by the integral body 112G of the integral base 11G.

The light filter holder body 43G of the light filter holder 40G has a predetermined thickness, and it should not in contact with the components positioned above it, such as the actuator 60 or the lens 30. Preferably, when the light filter holder 40G is installed at the installing groove 115G, a top surface of the light filter holder 40G has the same plane with a top surface of the base body 112G, so that the light filter holder 40G will not protrude from the base body 112G, and will not have any contact with the actuator 60 or the lens 30 installed thereabove.

More specifically, the integral base 11G comprises a plurality of protrusion steps 116G which is protruded and extended from the base body 112G to form the installing groove 115G. Accordingly, at least one side of the integral base 11G has no protrusion step 116G to form the notch 117G.

According to this fourth embodiment of the present invention, the integral base 11G comprises three such protrusion steps 116G which are integrally connected to define the installing groove 1115G. In other words, the side with no protrusion step 116G defines the notch 117G, and more specifically, the three protrusion steps 116G are integrally and transversely connected to form a U-shaped protrusion structure.

The light filter holder body 43G of the light filter holder 40G comprises at least one engaging edge 431G adapted to be engaged with the installing groove 115G and at least one extending edge 432G adapted to be filled into the notch 117G, as shown in FIG. 15B. In other words, the extending edge 432G is extended into the notch 117G to sealingly fill and close up the notch 117G, so as to define a sealed and closed inner environment therein.

According to this fourth embodiment of the present invention, the light filter holder body 43G of the light filter holder 40G comprises three engaging edges 431G and one extending edge 432G which are integrally and transversely connected to adapt the corresponding shape of the installing groove 115G.

The downward extending arms 45G are respectively longitudinally extended from the engaging edge 431G and the extending edge 432G, so as to form the engaging groove 42G. Each inward extending arm 44G is transversely and integrally extended from the downward extending arm 45G to form the supporting groove 41G.

It is worth mentioning that the electronic components 122 are able to be arranged at different positions of the main body of the circuit board 12, and the integral base 11G is molded to embed the electronic components 122 therein. When configuring the positions of the electronic components 122, the required thickness of the integral base 11G is larger, and it is convenient to form the installing groove 115G. And the positions without electronic components 122 may have a relatively smaller thickness, so as to reduce the size of the circuit board 12. In this fourth embodiment of the present invention, a portion of the integral base 11G corresponding to the three engaging edges 431G is arranged with the electronic components 122, and this portion of the integral base 11G has a larger transverse width, and the installing groove 115G is formed. In addition, another portion of the integral base 11G corresponding to the extending edge 432G has a smaller transverse width, and is not used for forming the installing groove 115G, as shown in FIG. 15B. The extending edge 432G is used to fill the notch 117G to function as the protrusion step 116G.

The actuator 60 has at least a part installed at the protrusion steps 116G, so as to form an Auto Focus camera module. The actuator 60 is operatively connected to the circuit board 12 through at least one connecting pin 61. In other embodiments, the lens 30 may have at least a part installed at the protrusion steps 116G, so that a Fix Focus camera module is formed.

More specifically, the actuator 60 has three edges which are respectively installed at the protrusion steps 116G, and the remaining edge is installed at the extending edge 432G of the light filter holder 40G. In some embodiments, a gap is formed between the actuator 60 and the extending edge 432G for filling with adhering glue, so as to provide a sealed and closed inner environment for the camera module. In other words, the height of a surface of the extending edge 432G is smaller than the height of a surface of each protrusion step 116G, and the glue can be used to make up the height difference. Particularly, the actuator 60 is adhered to the protrusion stairs 116G while ensuring the light axis of the lens 30 is coaxially aligned with the light axis of the photosensitive element 20.

Figure 16A:
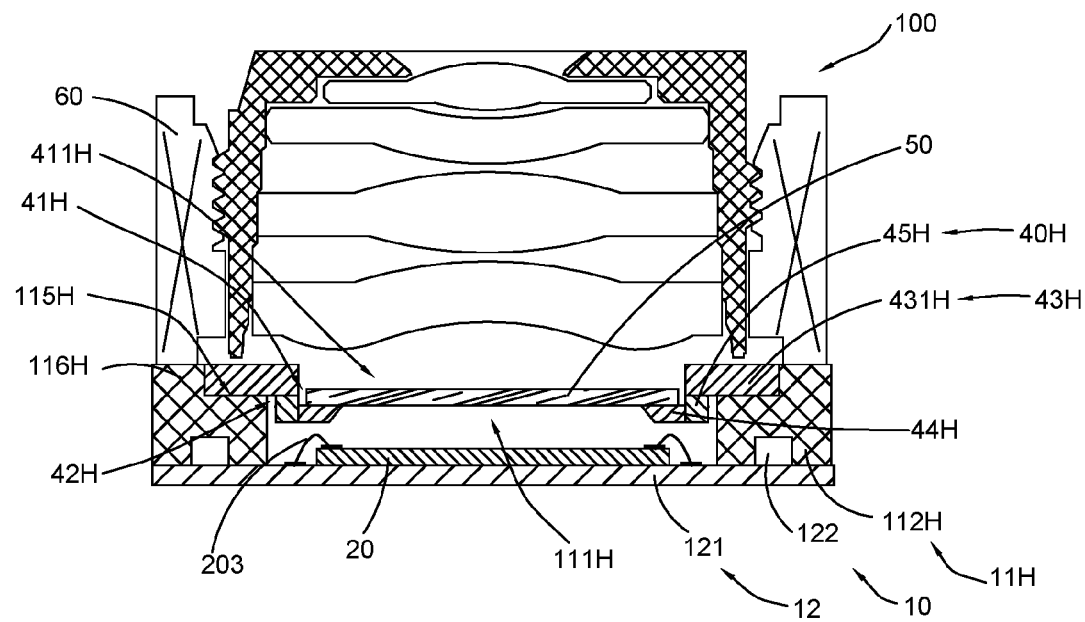
FIG. 16A is a sectional view from one direction of a camera module according to a fifth preferred embodiment of the present invention.
Figure 16B:
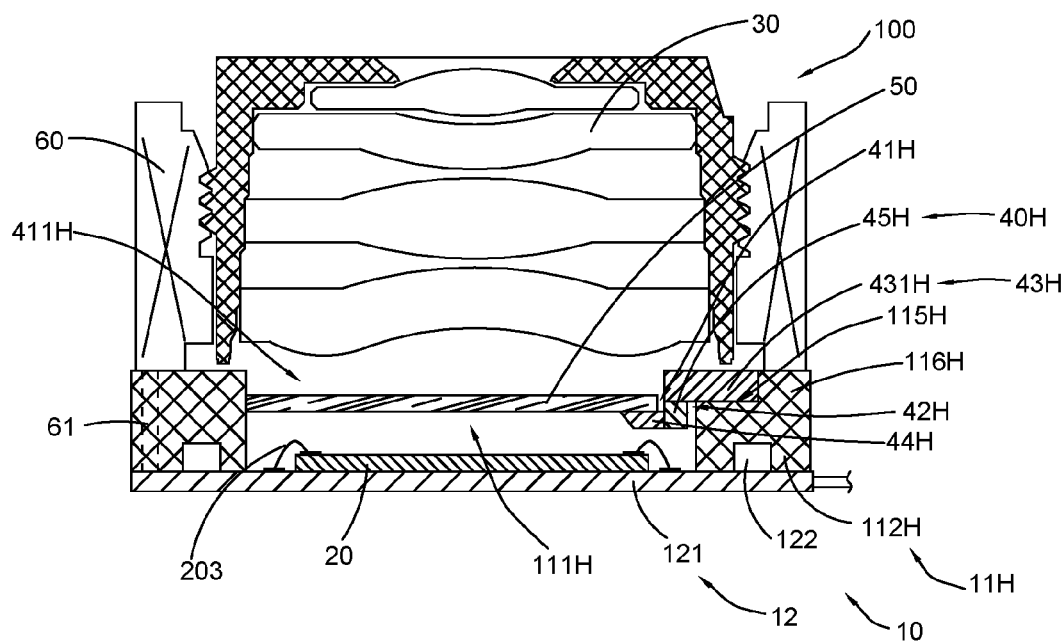
FIG. 16B is another sectional view from another direction of the camera module according to the fifth preferred embodiment of the present invention.

As shown in FIGS. 16A and 16B, a camera module according to a fifth embodiment of the present invention is illustrated, wherein the FIG. 16A is a sectional view viewed from a first direction and the FIG. 16B is a sectional view viewed from a second direction that is perpendicular from the first direction, so as to illustrate the four sides of the camera module. The integral base 11H has at least one installing groove 115H provided thereon and communicated with the light window 111H. The light filter holder 40H is installed at the installing groove 115H. More specifically, each installing groove 115H forms a U-shaped structure without the notch as embodied in the above fourth preferred embodiment.

The light filter holder body 43H of the light filter holder 40H comprises at least one engaging edge 431H for sitting on and engaging with the installing groove 115H.

According to this embodiment of the present invention, the light filter holder body 43H of the light filter holder 40H comprises three engaging edges 431H which are integrally and transversely connected with each other to form a U-shaped structure with an opening, so as to adapt the shape of the U-shaped installing groove 115H.

Three downward extending arms 45H are longitudinally extended from the three engaging edges 431H respectively, so as to engage with the installing groove 115H. Three inward extending arms 44H are transversely and integrally extended from the three downward extending arms 45H respectively to define a U-shape supporting groove 41H, so as to provide an installation site for the light filter 50. A difference between this fifth embodiment and the above fourth embodiment is that each of the engaging groove 42H and the supporting groove 41H is a U-shaped structure with an opening at one side thereof, and thus it is not configured to be a closed structure. In other words, when the light filter 50 is installed at the light filter holder 40H, as shown in FIG. 16B, only three edges thereof are fixed and mounted in the U-shape supporting groove 41H, and one remaining edge thereof is arranged to bias against an inner wall of the protrusion step 116H which is not used for forming the installing groove 115H.

It is worth mentioning that the electronic components 122 may be arranged at different positions of the main body of the circuit board 12, and the integral base 11H is molded on the circuit board 12 to embed the electronic components 122 therein. When configuring the positions of the electronic components 122, the required thickness of the integral base 11H is larger, and that it is convenient to form the installing groove 115H. Also, the positions without electronic components 122 may have a relatively smaller thickness, so as to reduce the size of the circuit board 12, and these positions are not used for forming the installing groove 115H. In this fifth embodiment of the present invention, a portion of the integral base 11H corresponding to the three engaging edges 431 H is arranged to embed the electronic components 122, and this portion of the integral base 11H has a larger transverse width, and the installing groove 115 H is formed. And, another portion of the integral base 11H corresponding to the protrusion step 116H which is not used for forming the installing groove 115H has a relatively smaller transverse width.

The actuator 60 has at least a part installed at the protrusion steps 116H, so as to form an Auto Focus camera module. The actuator 60 is operatively connected to the circuit board 12 through at least one connecting pin 61. In other embodiments, the lens 30 may have at least a part installed at the protrusion steps 116H, so that a Fix Focus camera module is formed.

More specifically, the actuator 60 has three sides installed at the protrusion steps 116H which are used for forming the U-shape installing groove 115H, and one remaining side of the actuator 60 is installed at the protrusion step 116H which is not used for forming the installing groove 115H, as shown in FIGS. 16A and 16B.

In other words, the difference between this fifth embodiment and the above fourth embodiment is that, the light filter holder 40H of this embodiment is not provided with the engaging edge 432G, but forms an open U-shaped structure, and the protrusion steps 116H of the integral base 11H are upwardly extended to form a closed U-shaped structure, and no notch 117G is formed.

Figure 17A:
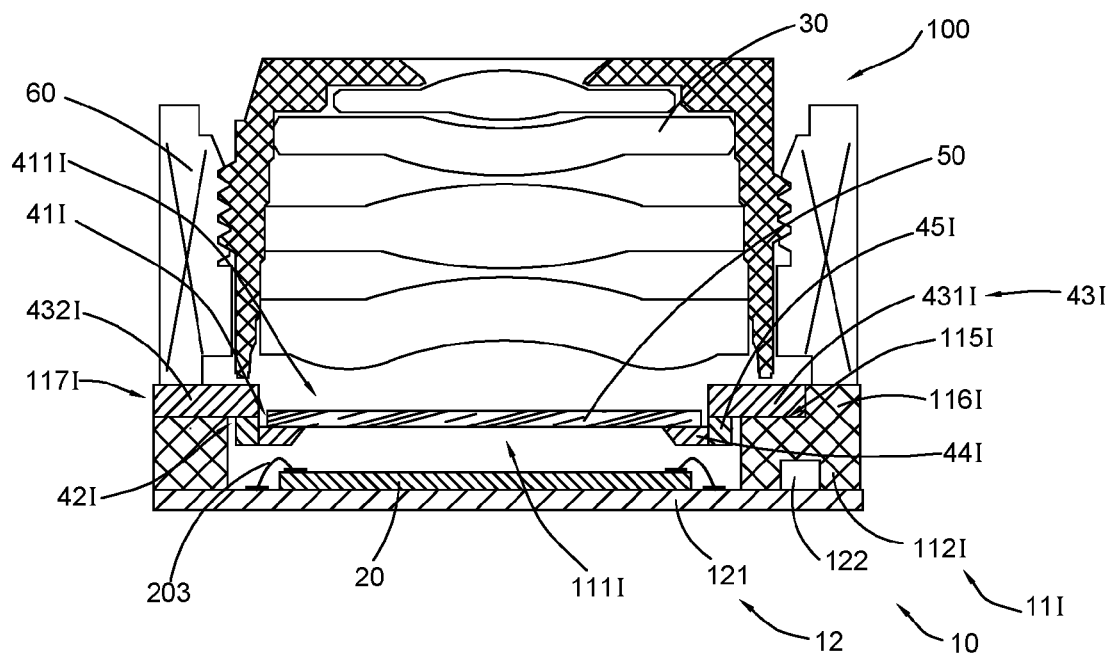
FIG. 17A is a sectional view from one direction of a camera module according to a sixth preferred embodiment of the present invention.
Figure 17B:
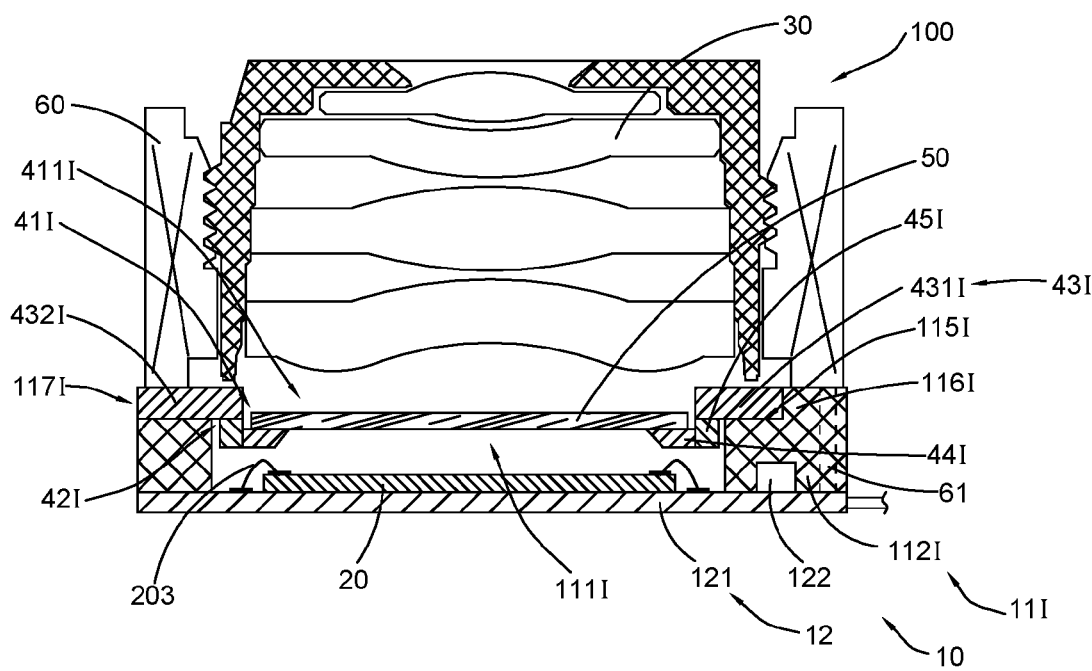
FIG. 17B is another sectional view from another direction of the camera module according to the sixth preferred embodiment of the present invention.

Referring to FIGS. 17A and 17B, two sectional views illustrated from different directions, a camera module according to a sixth preferred embodiment of the present invention is illustrated, wherein the two sectional views are respectively illustrated along two perpendicular directions to illustrate four sides of the camera module. The difference between this sixth embodiment and the above fifth embodiment is that, the integral base 11I forms two protrusion steps 116H and two notches 117I, and the protrusion steps 116I are transversely and integrally connected with each other to form a L-shaped installing groove 115I. In other words, the two sides which are not formed with the protrusion steps 116I are formed with the two perpendicular notches 117I.

The light filter holder body 43I of the light filter holder 40I comprises at least one engaging edge 431I which is engaged with the installing groove 115I and at least one extending edge 432I which is extended into the notch 117I. In other words, the extending edge 432I is extended into and sits on the notch 117I that the notch 117I is filled with the extending edge 432I, so that a sealed and closed inner environment is defined within the integral base 11I and the light filter holder body 43I which is installed on the integral base 11I.

According to this sixth embodiment of the present invention, the light filter holder body 43I of the light filter holder 40I comprises two engaging edges 431I and two extending edge 432I which are integrally and transversely connected to form an endless configuration and adapt the shape of the installing groove 115I.

Four downward extending arms 45I are respectively and longitudinally extended from the two engaging edges 431I and the two extending edges 432I, so as to form a ring shaped engaging groove 42I below the light filter holder body 43I. Four inward extending arms 44I are transversely and integrally extended from the four downward extending arm 45I respectively to define a ring shaped supporting groove 41I above the inward extending arms 44I.

Furthermore, the two protrusion steps 116I of the integral base 11I are jointed with each other perpendicularly, and the two engaging edges 431I are jointed with each other perpendicularly, wherein the two notches are formed adjacent to each other perpendicularly. In other words, the two protrusion steps 116I from a L-shaped structure that defines a L-shaped installing groove 115I. The two notches 117I are adjacent to each other to form a L-shaped structure. Accordingly, the two engaging edges 431I of the light filter holder 40I which are adjacent to each other perpendicularly are configured to adapt the L-shaped installing groove 115I so that the two engaging edges 431I are configured to fittingly sit and mount in the installing groove 115I, and that the two extending edges 432I are adjacent to each other perpendicularly to adapt the L-shaped notches, so that the two extending edges 432I are configured to fittingly sit and mount on the two notches respectively, so as to define a sealed and enclosed inner environment within the integral body 11I and the light filter holder 40I.

The actuator 60 has at least a portion installed at the protrusion steps 116I, so as to form an Auto Focus camera module. The actuator 60 is operatively connected to the circuit board 12 through at least one connecting pin 61. In other embodiments, the lens 30 may have at least a portion installed at the protrusion stairs 116I or the light filter holder body 43I, so that a Fix Focus camera module is formed.

More specifically, the actuator 60 has two sides respectively installed on top of the protrusion steps 116I, and the remaining two sides of the actuator 60 are installed on top of the extending edges 432I of the light filter holder 40I.

Figure 18A:
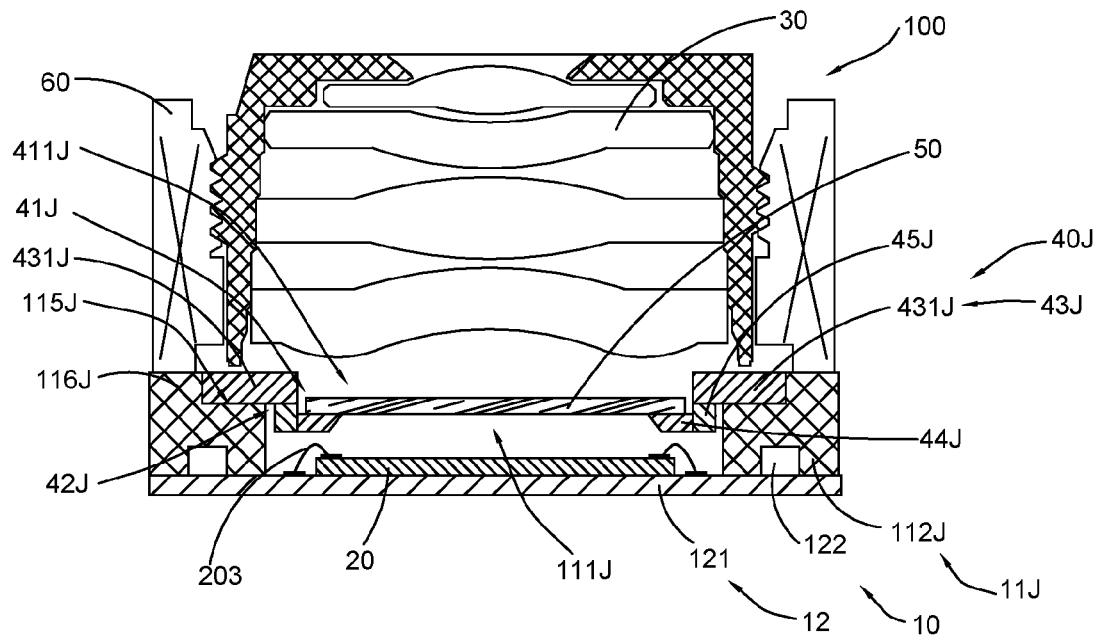
FIG. 18A is a sectional view from one direction illustrating an alternative mode of the camera module according to the above sixth preferred embodiment of the present invention.
Figure 18B:
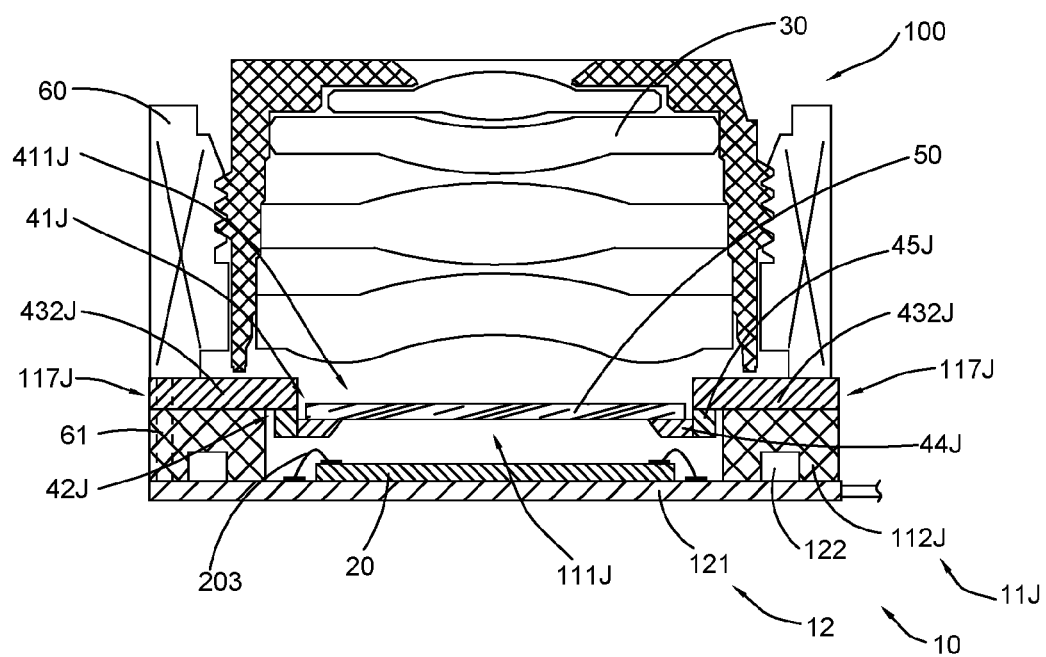
FIG. 18B is another sectional view from another direction illustrating the alternative mode of the camera module according to the above sixth preferred embodiment of the present invention.

As shown in FIGS. 18A and 18B, an alternative mode of the integral base assembly and the light filter holder according to the above sixth preferred embodiment of the present invention is illustrated. FIGS. 18A and 18B are sectional views along two perpendicularly directions. The difference between this alternative mode and the above sixth embodiment is that, the two engaging edges 431J are formed at two opposite sides while the two notches are formed at two opposite sides. Accordingly, the two engaging edges 431J of the light filter holder 40J are opposite to each other adapted for sitting and mounting in the installing groove 115J formed at two opposing sides of the integral base 11J, and the two extending edges 432J are opposite to each other adapted for sitting and mounting on the two notches 117J formed at another two opposing sides of the integral base 11J, so as to define a sealed and closed inner environment within the integral base 11J and the light filter holder 40J.

Figure 19A:
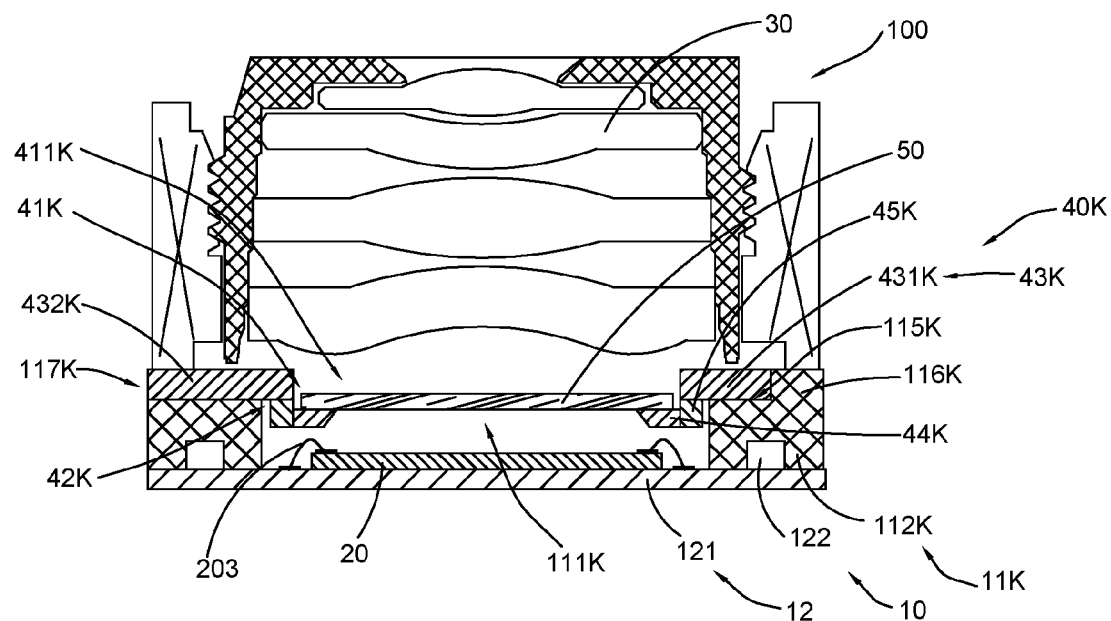
FIG. 19A is a sectional view from one direction of a camera module according to a seventh preferred embodiment of the present invention.
Figure 19B:
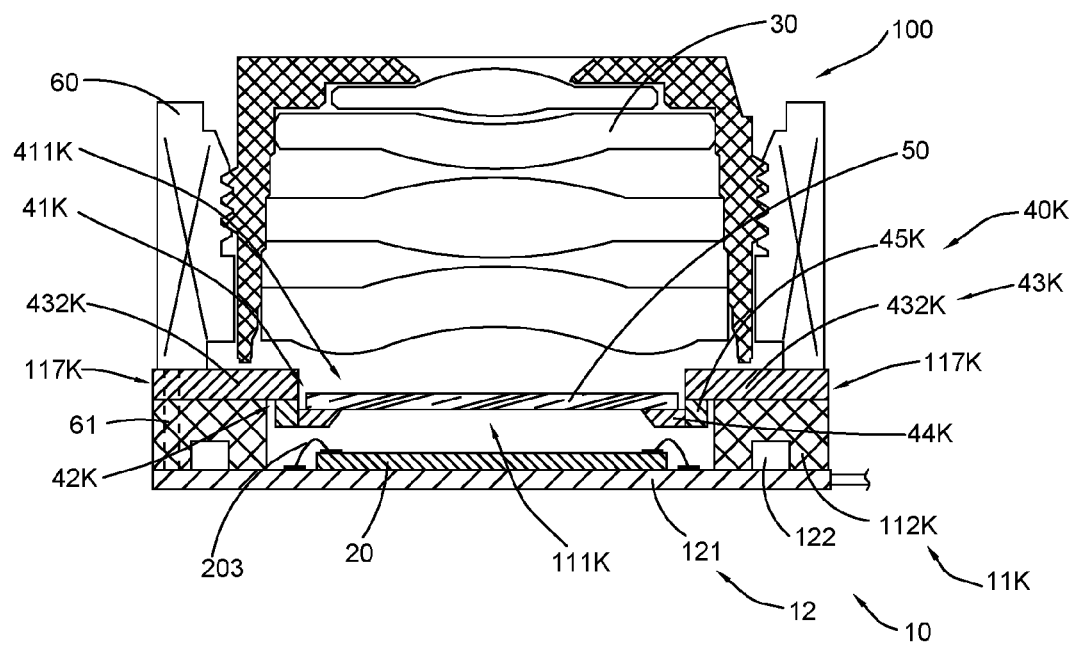
FIG. 19B is another sectional view from another direction of the camera module according to the seventh preferred embodiment of the present invention.

Referring to FIGS. 19A and 19B, a camera module according to a seventh preferred embodiment of the present invention is illustrated. FIGS. 19A and 19B are sectional views along two perpendicularly directions. The difference between this seventh preferred embodiment and the above sixth preferred embodiment and its alternative mode is that, the integral base 11K comprises one protrusion step 116K and three notches 117K. The protrusion step 116K is partially, integrally and upwardly extended from the base body 112K to form the installing groove 115K. In other words, the three sides which are not formed with the protrusion step 116K are formed with the three notches 117K respectively.

The light filter holder body 43K of the light filter holder 40K comprises at least one engaging edge 431K engaged with the installing groove 115I and at least one extending edge 432K filled into the notch 117K. In other words, the extending edge 432K is extended and filled into the respective notch 117K, so that a sealed and closed inner environment is defined within the integral base 11K and the light filter holder 40K.

According to this seventh embodiment of the present invention, the light filter holder body 43K of the light filter holder 40K comprises one engaging edge 43K and three extending edges 432K which are integrally and transversely connected to configure an endless structure adapted to fittingly sit and mount on top of a single installing groove 115K and the three notches 117K.

Four downward extending arms 45K are respectively longitudinally extended from the engaging edge 431K and the three extending edges 432K respectively, so as to define the engaging groove 42K below the light filter holder body 43K. Four inward extending arms 44K is transversely and integrally extended from the four downward extending arms 45K respectively to define the supporting groove 41K above the inward extending arms 44K.

The actuator 60 has at least a portion installed at the protrusion step 116K, so as to form an Auto Focus camera module. The actuator 60 is operatively connected to the circuit board 12 through at least one connecting pin 61. In other embodiments, the lens 30 may have at least a portion installed at the protrusion step 116K, so that a Fix Focus camera module is formed.

More specifically, the actuator 60 has one side supported at the protrusion step 116K, and the remaining three sides of the actuator 60 are respectively installed at the three extending edges 432K of the light filter holder 40K.

Figure 20A:
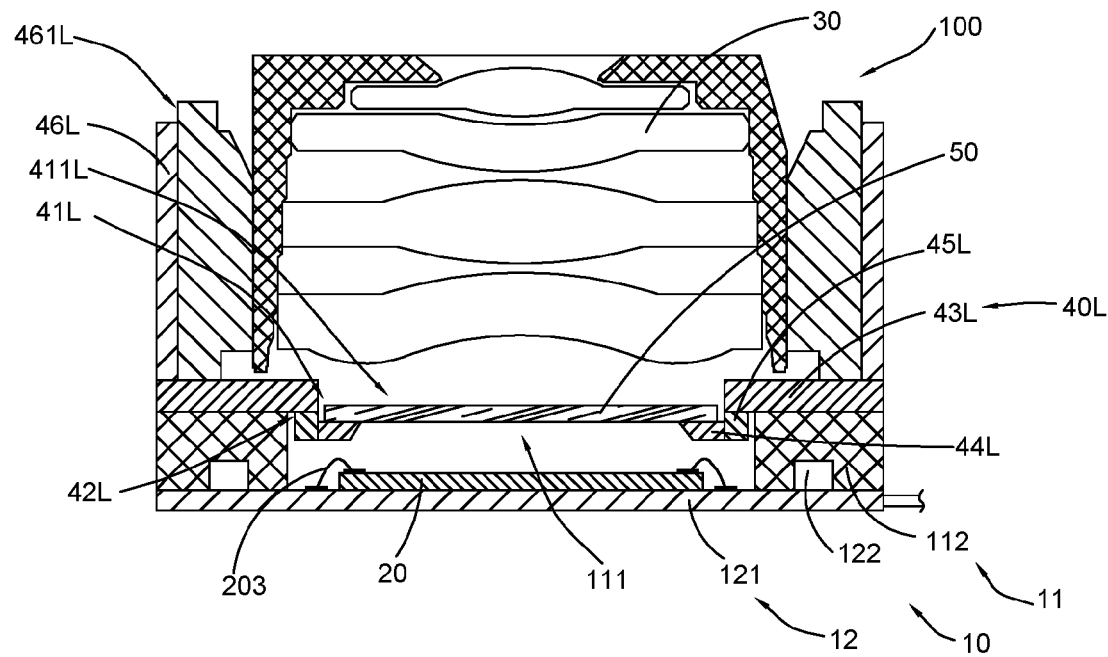
FIG. 20A is a sectional view of a camera module according to an eighth preferred embodiment of the present invention.
Figure 20B:
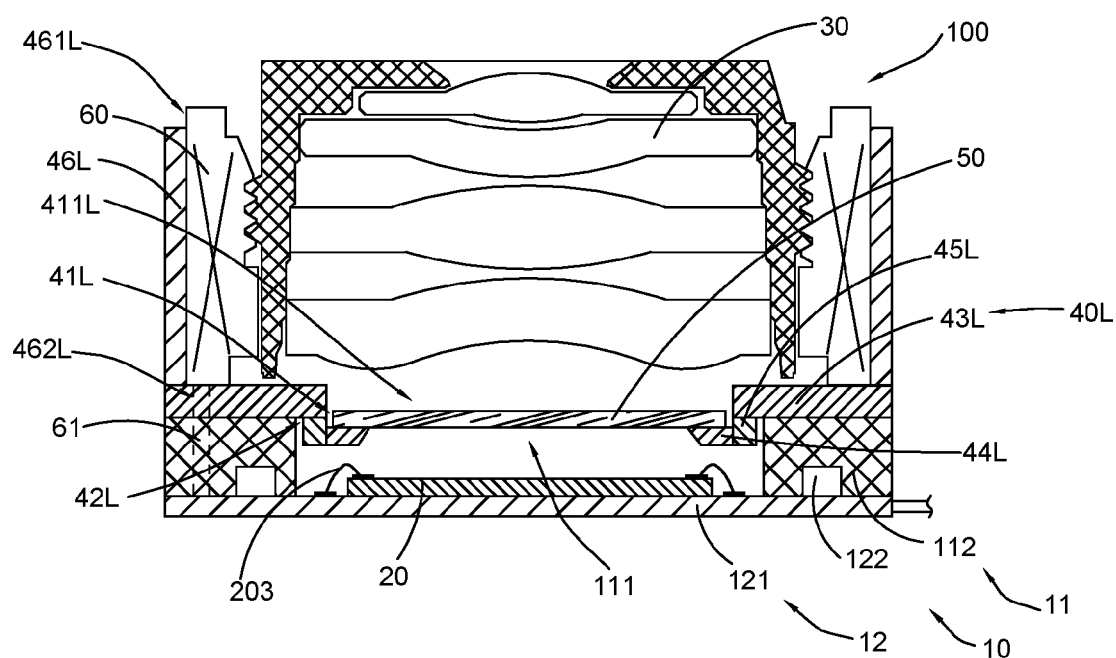
FIG. 20B is another sectional view of the camera module according to the above eighth preferred embodiment of the present invention.
Figure 21:
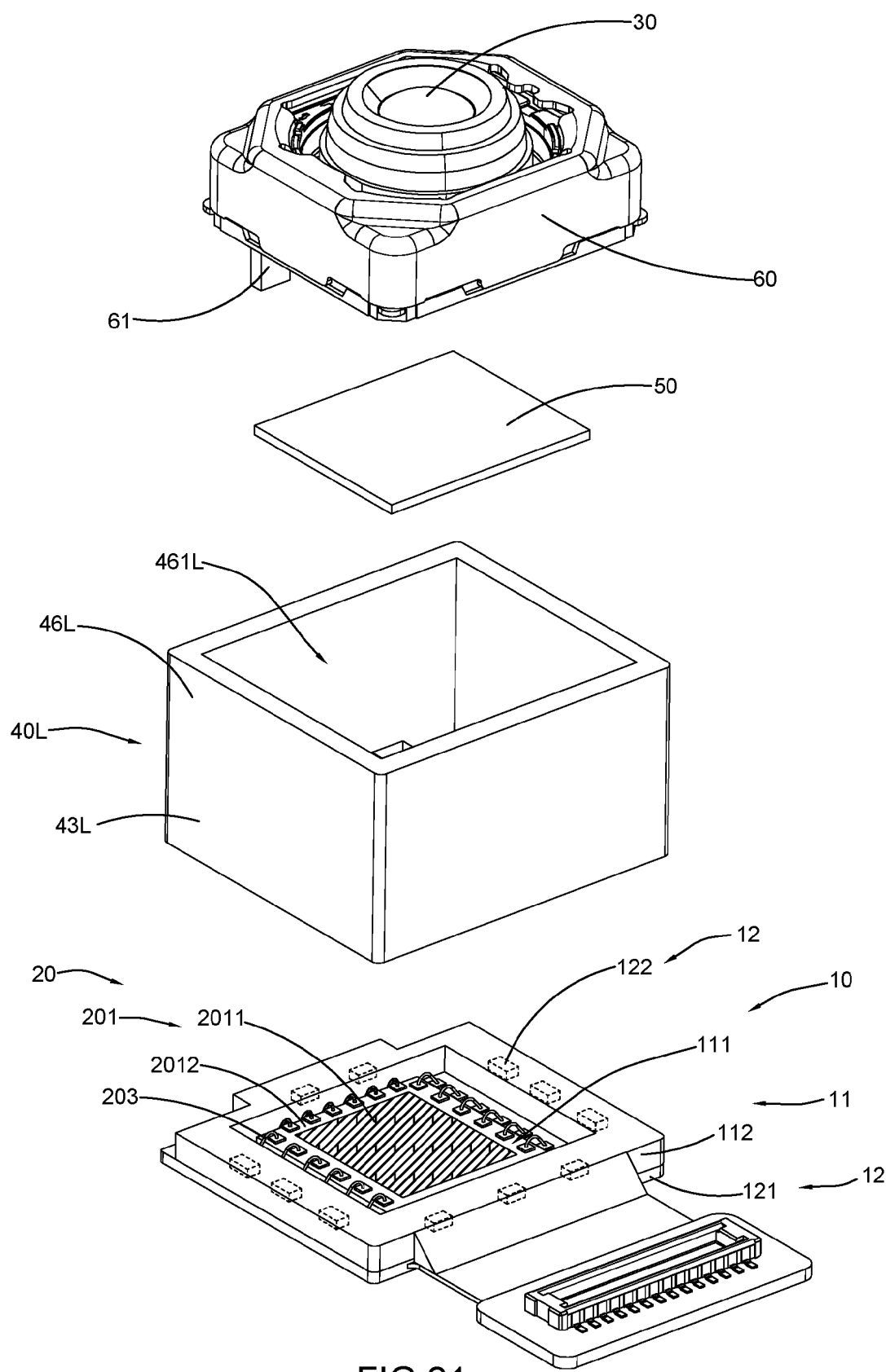
FIG. 21 is an exploded view of the camera module according to the above eighth preferred embodiment of the present invention.

As shown in FIGS. 20A to 21, a camera module according to an eighth preferred embodiment of the present invention is illustrated. The camera module can be a Fix Focus camera module as shown in FIG. 20A or an Auto Focus camera module as shown in FIG. 20B. The difference between this eighth embodiment and the above embodiments is that, the light filter holder 40L comprises an upward extending surrounding wall 46L which is upwardly extended from the light filter holder body 43L to from a retaining chamber 461L defined within the upward extending surrounding wall 46L for retaining an installed component(s), such as but not limiting the actuator 60 and/or the lens 30. In other words, when assembling the camera module, the actuator 60 and/or the lens 30 are/is installed in the retaining chamber 461L of the light filter holder 40L, so as to retain the actuator 60 and/or the lens 30 in position, and the light axis of the actuator 60 or lens 30 is aligned coaxially with the light axis of the photosensitive element 20. The size of the retaining chamber 461L is determined by the size and shape of the component to be installed.

In other words, the upward extending surrounding wall 46L performs a frame restricting function, so that when the actuator 60 or the lens 30 is installed at the light filter holder 40, excessive deviation is prevented, so as to ensure the consistence of the optical system of the camera module. At the same time, the upward extending surrounding wall 46L also can protect the installed component such as the actuator 60 or the lens 30, so as to avoid unwanted impacts, so that the actuator 60 and/or the lens 30 are/is stably installed, and dusts from outside will be blocked from entering the inner space of the camera module.

Furthermore, when the camera module is an Auto Focus camera module, as shown in FIG. 20B, the light filter holder 40 has at least one pin opening 462L for the connecting pin 61 of the actuator 60 to penetrate therethrough. In other words, when the actuator 60 is installed at the retaining chamber 461L of the light filter holder 40L, the connecting pins of the actuator 60 penetrate the corresponding pin openings 462L and are connected to the circuit board 12. Of course, when the camera module is a Fix Focus camera module, the light filter holder 40L may not need to form such pin openings 462L. It is worth mentioning that the pin opening 462L may not been seen in a sectional view along a central line, but in order for easy comprehension and description, dotted lines are used for illustrating the possible positions of the pin opening 462L. Accordingly, the positions of the pin opening 462L should be determined by the positions of the connecting pins 61, and are not limited in the present invention.

Figure 22:
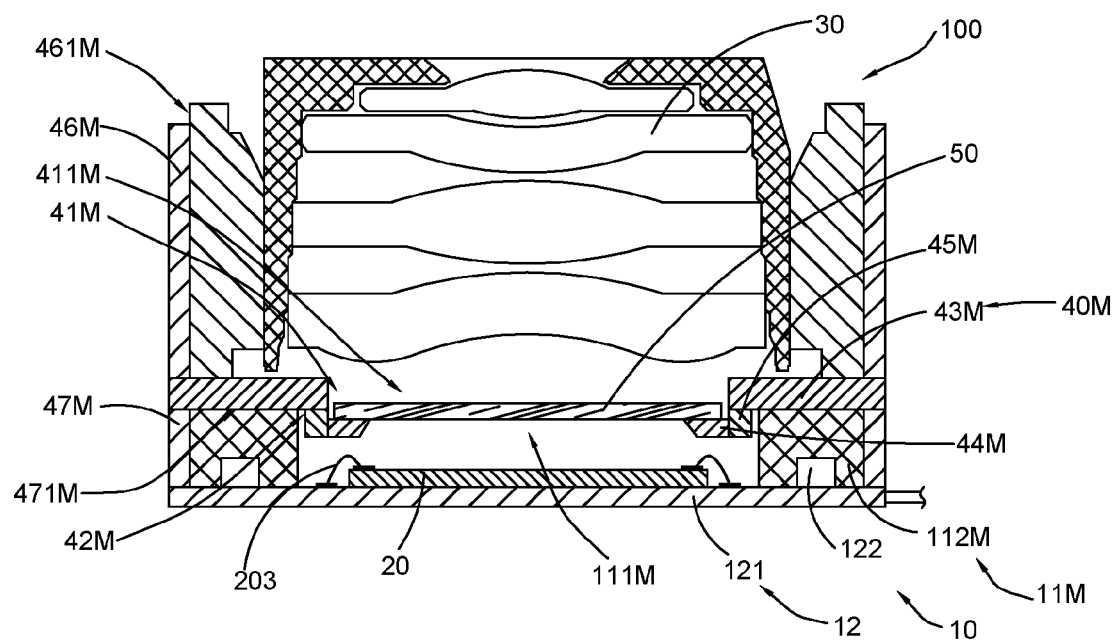
FIG. 22 is a sectional view of a camera module according to a ninth preferred embodiment of the present invention.

Referring to FIG. 22, a camera module according to a ninth preferred embodiment of the present invention is illustrated. The difference between this ninth embodiment and the above embodiments is that, the light filter holder 40M comprises an upward extending surrounding wall 46M upwardly and integrally extended from the light filter holder body 43M to form a retaining chamber 461M therein and an downward extending surrounding wall 47M which is downwardly and integrally extended from the light filter holder body 43M to define a lower housing chamber 471M therein. Particularly, the downward extending surrounding wall 47M is integrally extended from the upward extending surrounding wall 46M to form an integral outer blocking wall around the light filter holder body 43M.

The retaining chamber 461M is used for retaining an installed component, such as but not limiting the actuator 60 and/or the lens 30. The lower housing chamber 471M is used for receiving the integral base 11. In other words, during assembling the camera module, the actuator 60 or the lens 30 is installed in the retaining chamber 461M of the light filter holder 40M so as to retain and protect the actuator 60 or the lens 30 in position, and the light axis of the actuator 60 or lens 30 is aligned coaxially with the light axis of the photosensitive element 20. The integral base 11 is received in the lower housing chamber 471M, and the downward extending surrounding wall 47M protects the integral base 11, so that a regular integral structure of the camera module is achieved. Thus, it is easy to assemble and the aesthetic appearance is enhanced. The sizes of the retaining chamber 461M and the lower housing chamber 471M can be determined by the size and shape of the components to be installed, such as the actuator 60, the lens 30 and the integral base 11.

In one embodiment, the downward extending surrounding wall 47M can be extended to enclose the circuit board 12 too. For example, but not limiting, the downward extending surrounding wall 47M is adhered to the circuit board by a glue, so that the light filter holder 40M ca be more stably installed.

Figure 23:
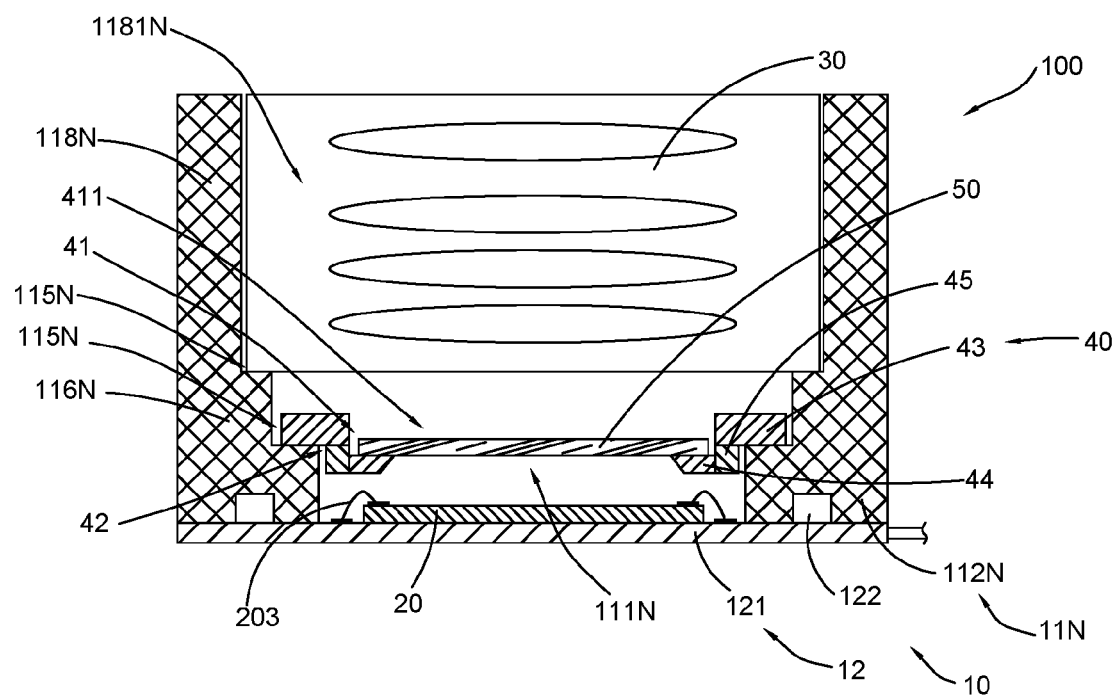
FIG. 23 is a sectional view of a camera module according to a tenth preferred embodiment of the present invention.

Referring to FIG. 23, a camera module according to a tenth preferred embodiment of the present invention is illustrated.

The integral base 11N comprises a lens barrel 118N which is at least partially and upwardly extended form the protrusion steps 116N to define a lens cavity 1181N therein for installing the lens 30, so as to form a Fix Focus camera module, and a set of installing grooves 115N, including an upper and a lower installing grooves.

More specifically, the protrusion steps 116N and the base body 112N form the lower installing groove 115N for installing the light filter holder 40. The lens barrel 118N and the protrusion steps 116N form another upper installing groove 115N for installing the lens 30. In other words, in this tenth embodiment, the integral base 11N has two installing grooves 115N, wherein the lower installing groove 11N is used for installing the light filter holder 40, and the upper installing groove 115N is used for installing the lens 30.

Furthermore, the engaging groove 42 of the light filter holder 40 is coupled with the installing groove 115N, such that the light filter holder body 43 is sat in the lower installing groove 115N and supported by the integral base 11N, wherein the light filter 40 is installed in the supporting groove 41 of the light filter holder 40 and aligned along the light passage of the photosensitive element 20, and the lens 30 is installed in the upper installing groove 115N.

The lens barrel 118N integrally and upwardly extended from the integral base 11N is used for providing an installation site of the lens 30 to retain the lens 30 in position, so that the light axis of the lens 30 is aligned coaxially with the light axis of the photosensitive element 20, and thus the installing accuracy thereof is enhanced.

Figure 24:
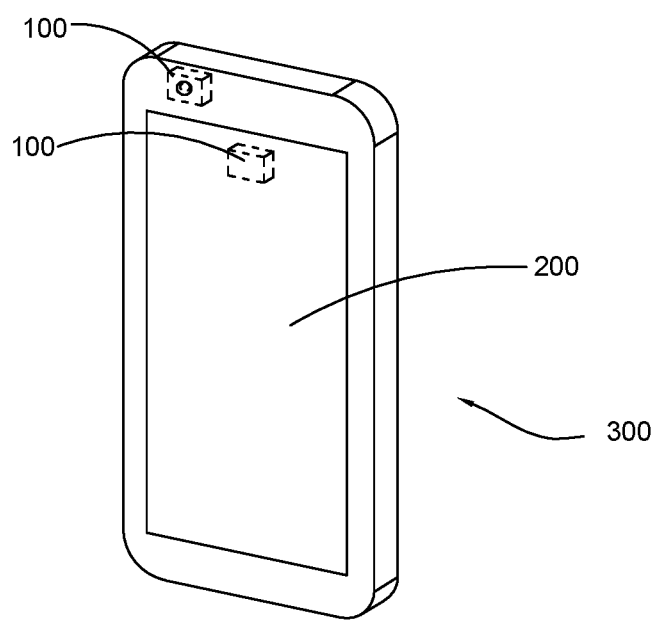
FIG. 24 is a schematic view illustrating an application of the camera module according to the above preferred embodiments of the present invention.

FIG. 24 illustrates an application of the camera modules according to the above preferred embodiments. The camera module 100 of the present invention can be incorporated into various electronic devices 300. Accordingly, the electronic device 300 comprises an electronic device body 200 and the camera module 100 is provided at the electronic device body 200 for cooperating with the electronic device body 200 to achieve the acquisition and reproduction of the images. The electronic device 300 can be, but not limited to, a smart phone, a wearable device, a computer device, a television, a transporting device, a digital camera, a monitoring device, and the like. The camera module 100 is incorporated in the electronic device 300 to implement the image acquisition and image reproduction of target objects. As shown in the drawings, the camera module 100 is applied in a smart phone for aiding the phone to capture and reproduce image information.

Figure 25A:
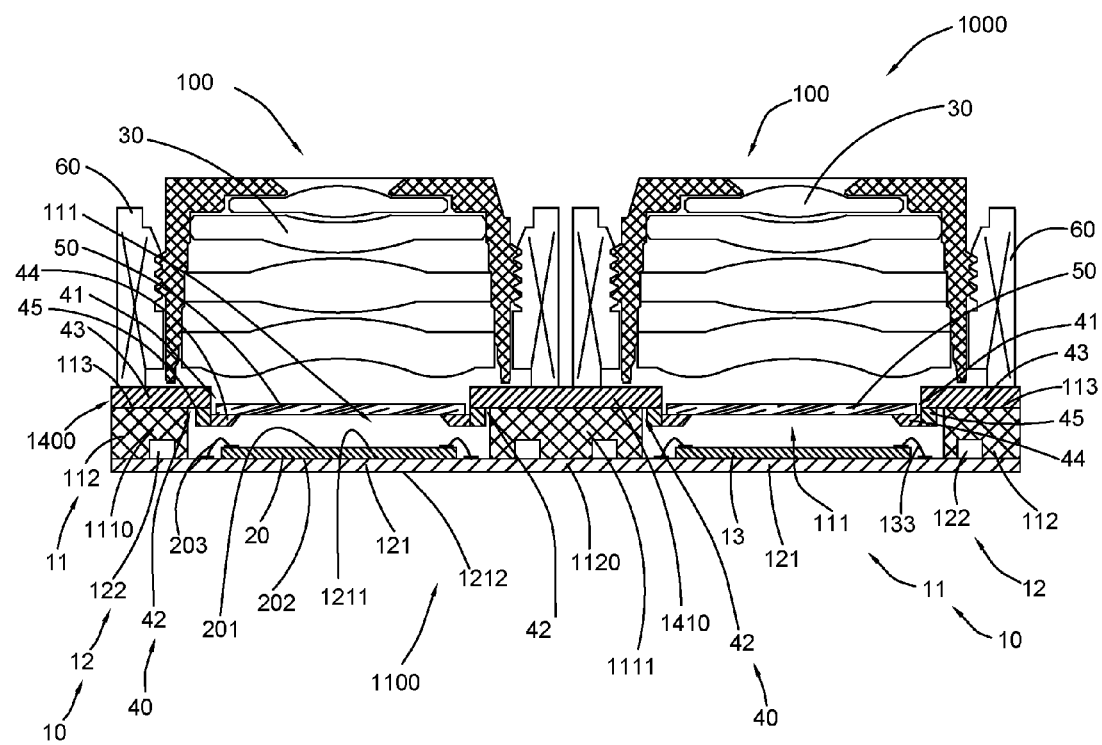
FIG. 25A is a sectional view from one direction of an array camera module according to an eleventh preferred embodiment of the present invention.
Figure 25B:
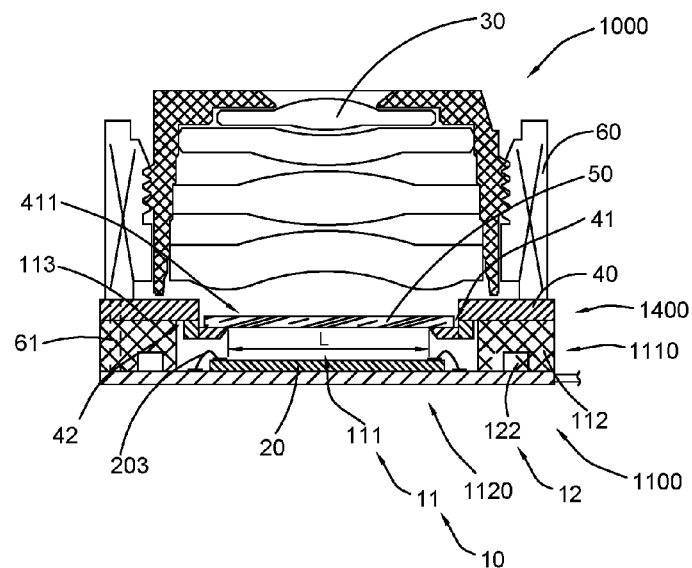
FIG. 25B is another sectional view from another direction of the array camera module according to the eleventh preferred embodiment of the present invention.
Figure 26:
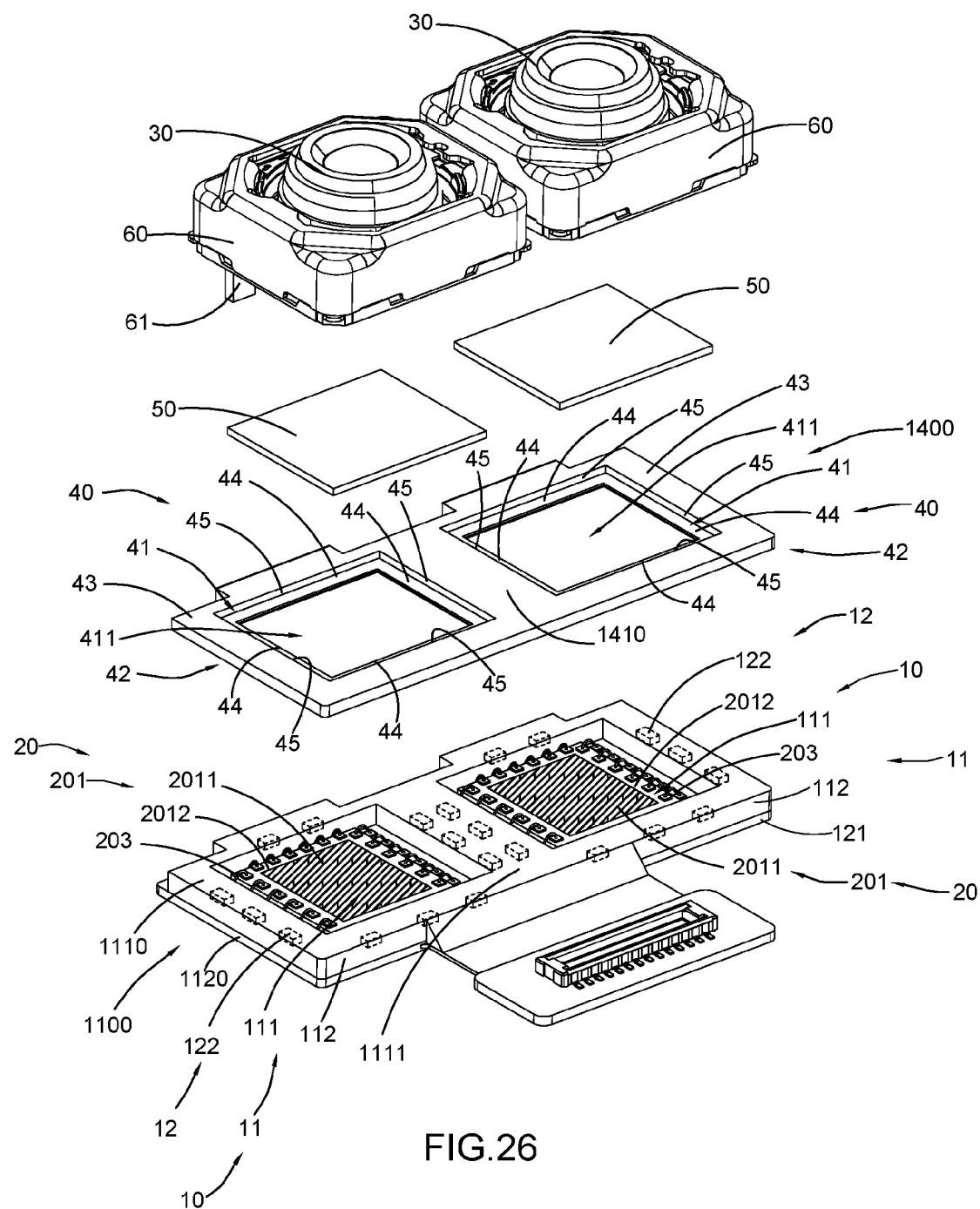
FIG. 26 is an exploded view of the array camera module according to the above eleventh preferred embodiment of the present invention.
Figure 27:
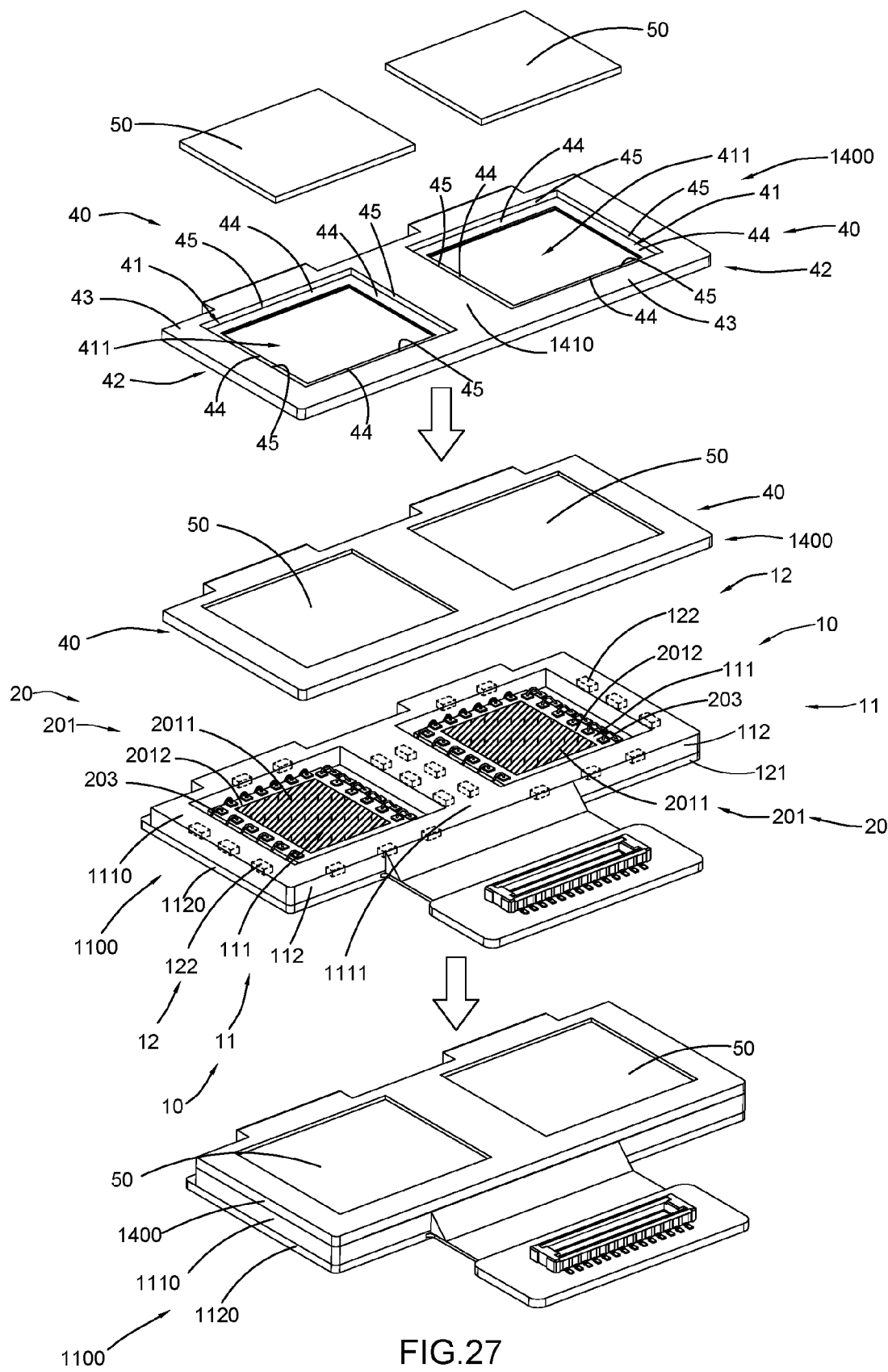
FIG. 27 is perspective view of an integral piece of light filter holders of the array camera module according to the above eleventh preferred embodiment of the present invention.

FIGS. 25 to 27 illustrate an array camera module according to an eleventh preferred embodiment of the present invention. The array camera module 1000 comprises two or more camera module units 100 cooperated to achieve a collection of image information. The array camera module 1000 also can be applied into various electronic devices such as smart phone, wearable device, computer device, television, transporting device, digital camera, monitoring device, and etc. The array camera module 1000 is equipped in the electronic device 300 to implement the image acquisition and image reproduction of target objects.

It is worth mentioning that, in order to facilitating the description, in the following embodiments and the accompanying drawings, the array camera module 1000 is illustrated to comprise two camera modules 100. In other words, a dual camera module is taken as an example for illustrating the array camera module. Accordingly, in other embodiments of the present invention, the array camera module 1000 may comprise multiple units, such as three or more than three units, and the camera module units 100 are arranged in an array, such as being arranged side by side or parallel to each other, to form the array camera module 1000.

It is still worth mentioning that the camera modules 100 according to the above first to the tenth embodiments of the present invention and the camera modules with the combining features, or the equivalent camera modules can be used for the camera module units 100 to form the array camera module 1000.

More specifically, each camera module unit 100 comprises an integral base assembly 10, a photosensitive element 20, a lens 30, a light filter holder 40, and a light filter 50.

The integral base assembly 10 of each camera module unit 100 comprises an integral base 11 and a circuit board 12, and the integral base 11 is integrally packaged on the circuit board 12. For example, but not limiting, the integral base 11 is molded to be integrally packaged on the circuit board 12 through a molding process. The light filter holder 40 is installed at the integral base 11 so that the integral base 11 and the light filter holder 40 are cooperative to replace the conventional holder or supporter of the conventional camera module, wherein a conventional packing process in which the holder or supporter has to be adhered to the circuit board by adhesive glue is not required. The photosensitive element 20 is operatively connected to the circuit board 12. Accordingly, the photosensitive element 20 is electronically connected to the circuit board 12 of the integral base assembly 10, the light filter holder 40 is installed with the integral base assembly 10, and the lens 30 is positioned in a photosensitive path of the photosensitive element 20.

The integral base 11 has a light window 111 therein and comprises a base body 112 surrounding the light window 111, wherein the light window 111 provides a light passage for the photosensitive element 20. More specifically, according to this eleventh embodiment, a periphery of the light window 111 is defined and surrounded by the base body 112 to construct a closed enclosure so as to provide a sealed inner environment for the lens 30.

The circuit board 12 of each camera module unit comprises a base board 121 and a plurality of electronic components comprising, but not limited to, resistors, capacitors, drives and etc. which are formed on the base board through a SMT adhering process. According to this eleventh preferred embodiment, the integral base 11 is integrally packaged on the base board 121 to embed or enclose the electronic components 122 therein so as to avoid a problem, as in the conventional camera module, that the dust and particles would adhere to electronic components 122 and adversely influence the image quality of the photosensitive element 20. It is understandable that in other embodiments, the electronic components 122 may be embedded in the base board 121, i.e. the electronic components 122 are not exposed to outside. The base board 121 of the circuit board 12 can be PCB rigid board, PCB flexible board, rigid-flexible combination board, ceramics board, and etc. It is worth mentioning that, according to this eleventh preferred embodiment, the integral base 11 can completely embed these electronic components 122, so that the electronic components 122 do not need to be embedded into the base board 121, and the base board 121 is only used for forming electrically conductive circuits, so that a thickness of the finally manufactured integral base assembly 10 would be relatively smaller.

More specifically, the base board 121 has a top surface 1211 which is facing towards the lens 30 and a bottom surface 1212 facing an opposite direction against the lens 30. The photosensitive element 20 has a front surface 201 which is facing towards the lens 30 and a back surface 202 facing the opposite direction against the lens 30 and is arranged above the top surface 1211 of the base board 121. The photosensitive element 20 is electronically connected to the base board 121 through at least one electrically connecting element 203 such as lead wire that can be, but not limited to, gold wire, silver wire, copper wire, and aluminum wire. The electrically connecting elements 203 can be arranged at one side, two sides, three sides or four sides of the photosensitive element 20. The photosensitive element 20 can be installed on the base board through a process which can be, but not limited to, a SMT (Surface Mount Technology) process or a COB (Chip On Board) process by electrically connecting the photosensitive element 20 with the base board 121 via gold wires. Of course, in other embodiments, the photosensitive element 20 may be connected to the base board via other connecting manners, such an embedding manner or a FC (Flip Chip) manner. The person of ordinary skilled in the art shall understand that the connecting and installing manner between the photosensitive element 20 and the circuit board 12 is not limited in the present invention.

More specifically, the front surface 201 of the photosensitive element 20 has a photosensitive region 1311 and non-photosensitive region 1312 positioned around the photosensitive region 1311. The photosensitive region 1311 is used for a photosensitive performance in which light signals are converted into electrical signals, and the non-photosensitive region 1312 is arranged with the electrically connecting elements 203 for transmitting the electrical signals to the circuit board 12. The lens 30 is optically coupled with the photosensitive element 20 in such a manner that a coaxial light axis is arranged, so that the light beams passing through the lens 30 can reach the photosensitive element 20 via the light window 111, and then undergo a light conversion process by the photosensitive element 20 so as to transmit the electrical signals to the circuit board 12, so that the camera module 100 is able to capture an image information.

As shown in FIGS. 25A to 26, the light filer 50 of each of the camera module units 100, which is used for filtering the light beams passing through the lens 30, can be but not limited to IR cut filter, blue glass light filter, wafer level IR cut filter, light filter of full spectrum, and light filter for filtering visible light. Each camera module unit 100 has its light filter 50 installed at its light filter holder 40 and positioned in the light passage of its photosensitive element 20. Each of the camera module units 100 may further comprise an actuator 60, such as a voice coil motor or a piezoelectric motor, and its lens 30 is installed with the actuator 60, so as to form an AF (Auto Focus) camera module. The actuator 60 comprises at least one connecting pin 61 which is arranged for operatively connecting the actuator 60 with the circuit board 12. The at least one connecting pin 61 can be embodied as a single pin, double pins, a single row of pins, or double rows of pins. In the drawings of the present invention, two pins are illustrated, but it is not a limitation to the scope of the present invention. The connecting pin 61 is usually positioned adjacent to the edge of circuit board 12. FIG. 26 is a sectional view along line A-A and is corresponding to the sectional view of FIG. 25A and FIG. 25B. The connecting pin 61 actually cannot be seen in the sectional view of FIG. 25A and FIG. 25B, but for easy to comprehend and describe, broken lines are used to illustrate the existence of the pins 61 in the corresponding sectional views. The person of ordinary skilled in the art shall understand that the type, shape and position of the connecting pins 61 are not limited in the present invention.

Referring to FIGS. 25A to 27, according to this eleventh embodiment of the present invention, for each camera module unit 100, the light filer 50 is installed at the light filter holder 40 and is supported downwardly into the light window 111 of the integral base 11. The integral base 11 of the integral base assembly 10 of each camera module unit 100 has a top surface 113 and the light filter holder 40 is supported on the top surface 113 so as to installed on top of the integral base 11, wherein the actuator 60 is installed on top of the light filter holder 40. According to this eleventh embodiment of the present invention, the top surface 113 of the integral base of each camera module unit 100 is a flat surface. In other words, the integral base 11 forms a flat step structure without protrusion step, and the light filter holder 40 is installed at the flat step structure. It is worth mentioning that in this configuration, the top surface 113 of the integral base 11 is flatly extended without any apparent bending angle being formed, so that during the integral packaging process, such as the molding process, a relative flat installing surface with no blurs is obtained, so as to provide a relatively good flat installing condition for the light filter holder 40.

More specifically, the light filter holder 40 of each camera module unit 100 has at least one supporting groove 41 formed for installing the light filter 50 thereat and at least one engaging groove 42 formed for installing light filter holder 40 on the integral base 11. The supporting groove 41 is communicated with the light window 111 and defines a receiving opening 411 for receiving the light filter 50. The engaging groove 42 is arranged surrounding a bottom periphery of the light filter holder 40 for sitting and mounting the light filter holder 40 on the integral base 11.

In other words, the supporting groove 41 forms an inner enclosure space for facilitating the installation of the light filter 50 at the light filter holder 40 along the light path of the photosensitive element 20. The engaging groove 42 forms an outer enclosure space for engaging with the integral base 11, and that the integral base 11 provides an installation site for the light filter holder 40.

More specifically, the engaging groove 42 is shaped to couple with the integral base 11, so that the light filter holder 40 can be fittingly and stably installed at the integral base 11.

More specifically, the light filter holder 40 of each camera module unit 100 comprises a light filter holder body 43, at least one inward extending arm 44 and at least one downward extending arm 45 which is longitudinally extended from the light filter holder body 43 so as to form the installation site of the light filter 50 positioned in the light window 111. The inward extending arm 44 is transversely extended from the downward extending arm 45 for providing a horizontal (transversal) installing position to the light filter 50, so that a light axis of the light filer 50 and a light axis of the photosensitive element are coaxially aligned. In the eleventh embodiment shown in the drawings, the light filter holder 40 of each camera module unit 100 comprises four integrally connected inward extending arms 44 and four integrally connected downward extending arms 45, wherein the four inward extending arms 44 and the four downward extending arms 45 are integrally extended from four sides of the integral base body 43 to form a ring shaped integral body as the light filter holder 40.

In one embodiment, the engaging groove 42 of the light filter holder 40 is shaped corresponding to the shape of the light window 111 of the integral base 11 of each camera module unit 100. The shape of the supporting groove 41 is also matched with the shape of the light filter holder 50. Particularly, the light filter 50 has a square shape and the supporting groove 41 as illustrated in FIGS. 26 and 27 has a ring shape correspondingly, such as a square ring shape.

It is worth mentioning that the downwardly extending distance of each downward extending arm 45 determines the downward distance of the light filter 50 positioned in the light window 111, and the transversally extending distance of each inward extending arm 44 determines the light passage area of the light filter 50. For example, when the downwardly extending distance of the downward extending arm 45 is larger, the deeper of the light filter 40 being sunk in the light window 111 and the shorter of the distance between the light filter 50 and the photosensitive element 20, so that the back focus length of the camera module also can be smaller. When the transversally extending distance of each inward extending arm 44 is larger, the smaller of the receiving opening 411 of the light filter holder 40 and the light passage area of the light filter is smaller, so that it is more convenient to equip and install a suitable light filter 50 that may simplify the assembling process and reduce the cost of the camera module unit 100. Of course, the downwardly extending distance of each downward extending arm 45 should also consider the image quality of the camera module, such as avoiding dark spots and image of dusts while reducing the back focus length. The transversally extending distance of the inward extending arm 44 also should consider the light path of the camera module unit 100, the layout of the photosensitive region 1311 and non-photosensitive region 1312 of the photosensitive element 20, and the margin width of the circuit board 12. For instance, as each inward extending arm 44 is designed to extend inwardly and transversally, in the condition that the light filter 50 is relatively small, each inward extending arm 44 must remain not to block the photosensitive region 1311 of the photosensitive element 20, so that it will not excessively block the light flux. In addition, the inward extending arms 44 can be extended more inwardly when there is a wider space remained after the integral packaging of the circuit board 12 (i.e. having a larger light window 111 or a wider distance between the photosensitive element 20 and the integral base 11), but can be extended less inwardly when there is a narrower space remained after the integral packaging of the circuit board 12 (i.e. having a smaller light window 111 or a narrower distance between the photosensitive element 20 and the integral base 11), so as to minimize the size and light passage area of the light filter 50 while ensuring the quality of the captured images.

For example, as shown in FIG. 25B, L denotes a distance between two opposing inward extending arms 44, and the size of the light filter 50 is merely required to be slightly larger than L. In other words, the light filter 50 can be supported by sitting the edges of the light filter 50 on the inward extending arms 44 respectively other than required to be supported at the integral base body 112 like the conventional art, so that the requiring light passage area and the size of the light filter 50 can be reduced accordingly.

The light filter holder 40 is shaped in correspondence with the integral base 11. In some embodiments, the integral base 11 has an approximately regular and symmetrical structure, such as a square ring shape. Correspondingly, the light filter holder 40 is constructed to have a symmetrical configuration while the light filter holder body 43 has a regular and symmetrical structure with the inward extending arms 44 and the downward extending arms 45 shaped in a uniform manner. According to some other embodiments, because the positions of the electronic components to be embedded are different, the integral base 11 may have inward protruding portions with different widths, so that the light filter holder body 43 may be provided with corresponding grooves or protrusions, or the lengths of the inward extending arms 44 are different, so as to match with the shape of the integral base 11 and the position of the photosensitive element 20, in order to facilitate the installation of the light filter 50.

According to some embodiments, the light filter holder 40 can be adhered to the integral base 50 by adhering glue and the thickness of the adhering glue can be adjusted and control to ensure the flatness and levelling of the light filter holder 40.

Moreover, according to the eleventh embodiment of the present invention, there are two camera module units 100 integrally connected to form an array structure of the array camera module 1000, as shown in FIGS. 25A to 27. Particularly, the two integral base assemblies 10 of the two camera module units 100 are integrally constructed and combined to from an integral piece of joint integral base assembly 1100, wherein the two circuit boards 12 of the two camera module units 100 can be integrally made to form an integral piece of joint circuit board 1120, and the two integral bases 11 are integrally molded and packaged to form an integral piece of joint integral base 1110. The two light filter holders 40 are integrally made to form an integral piece of joint light filter holder 1400. In other words, the integral piece of joint integral bases 1110, which is formed in an integral packing process, defines two light windows 111 side by side for providing two light passages for two photosensitive elements 20 provided on the two circuit boards 12 of the joint circuit board 1120 respectively. Alternatively, the two light filter holders 40 can also be two independent light filter holders without integrally connected with each other, which are respectively installed at the two integral bases 11 of the joint integral base 1110, and that the two integral bases 11 can also be two independent integral bases 11 independently molded and packaged on the joint circuit board 1120.

More specifically, in this eleventh preferred embodiment, the joint integral base 1110 is integrally packaged on the joint circuit board 1120, wherein the joint integral base 1110 has two light windows 111 for providing two light passages for the two photosensitive elements 20 and the two lenses 30 respectively. The joint light filter holder 1400 also form two supporting grooves 41 therein for installing the two light filters 50 respectively.

It is worth mentioning that this integral configuration of the two camera module units 100 to form a dual type array camera module 1000 is beneficial for enhancing the consistence of the two camera module units 100 with each other and is also space saving. For example, the joint light filter holder 1400 can provides two installation sites for the two light filters 50 respectively. So that, during the manufacturing process, by controlling the consistence of the two supporting grooves by molding and packaging the joint integral base 1110 on the joint circuit board 1120, consistent installing environments can thus be provided for the two light filters 50.

The joint integral base 1110 comprises an integral joint portion 1111 between the two connecting adjacent integral bases 11. The joint light filter holder 1400 has a bridge portion 1410 between the two integrally connecting light filter holders 40 and is bridged right above the integral joint portion 111 of the joint integral base 1110. More specifically, the light filter holder bodies 43 of the two light filter holders 40 have two adjacent edges integrally connected to form the bridge portion 1410.

Figure 28A:
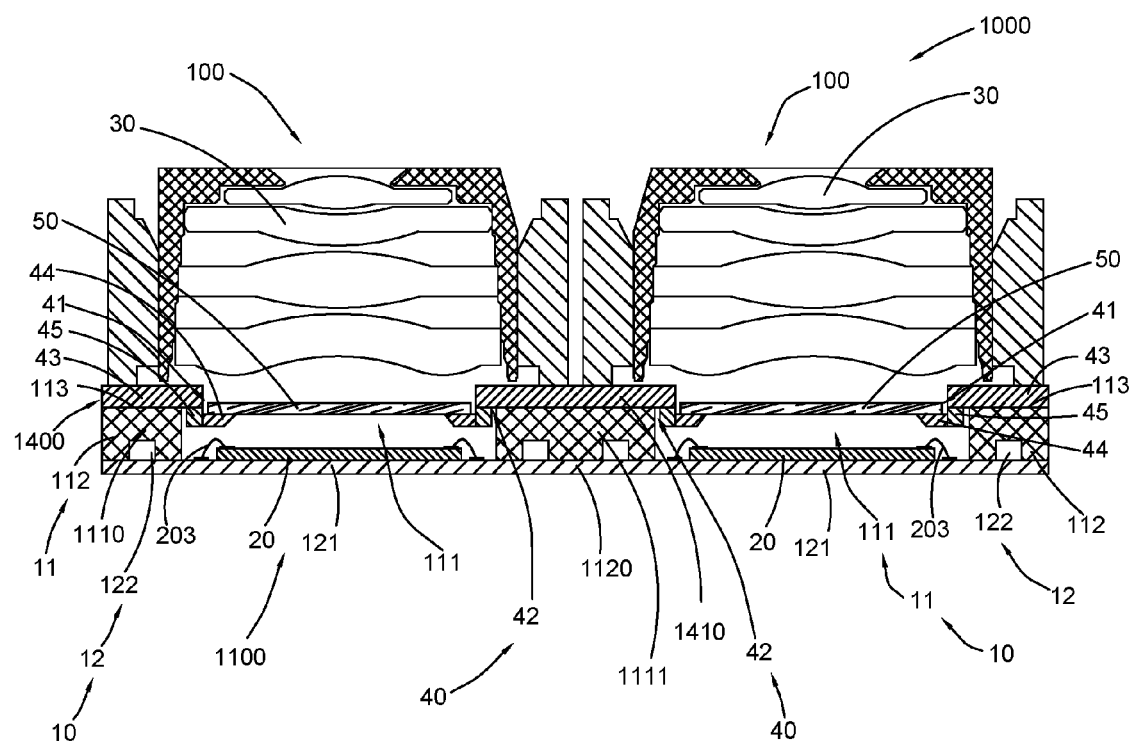
FIG. 28A is a sectional view illustrating another example of the array camera module according to the above eleventh preferred embodiment of the present invention.
Figure 28B:
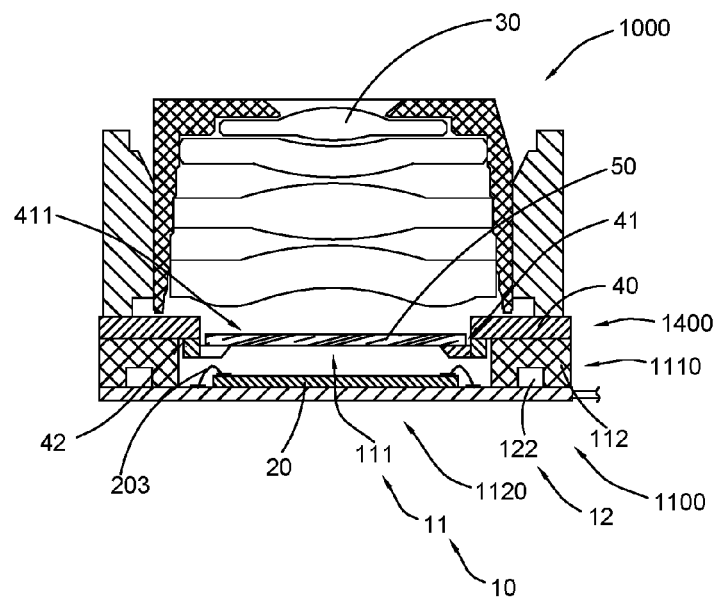
FIG. 28B is another sectional view illustrating the another example of the array camera module according to the above eleventh preferred embodiment of the present invention.
Figure 29A:
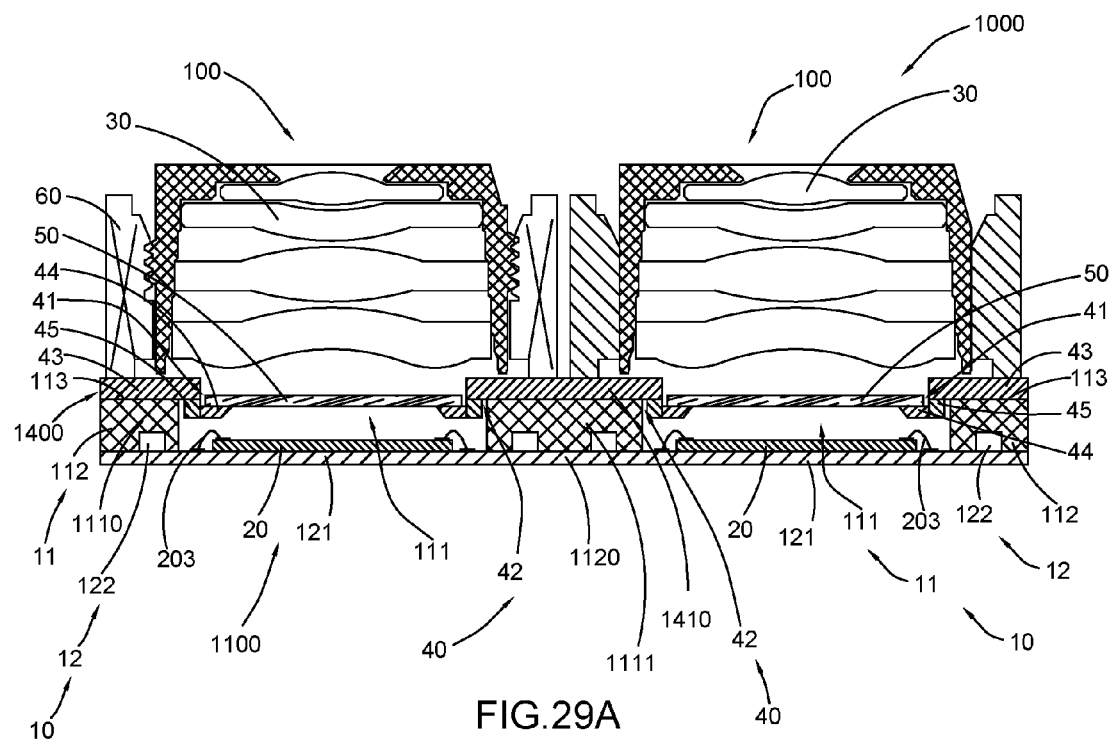
FIG. 29A is a sectional view illustrating another example of the array camera module according to the above eleventh preferred embodiment of the present invention.
Figure 29B:
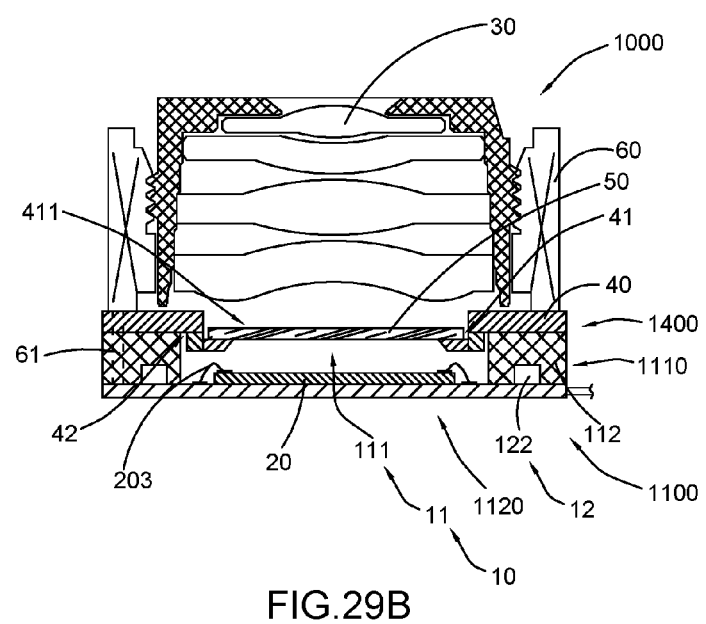
FIG. 29B is a sectional view illustrating the another example of the array camera module according to the above eleventh preferred embodiment of the present invention.

It is worth mentioning that, according to this eleventh embodiment of the present invention, as shown in FIGS. 25A and 25B, each of the two camera module units 100 comprises an actuator 60. In other words, the two camera module units 100 are both Auto Focus camera modules, and the two Auto Focus camera modules are cooperative in image acquisition. According to some other embodiments, the array camera module also can be configured with camera module units 100 of other combinations. In one embodiment, as shown in FIGS. 28A and 28B, both of the two camera module units 100 are not provided with the actuators 60. In other words, both of the two camera module units 100 are Fix Focus camera modules which are cooperative in image acquisition. In one embodiment, as shown in FIGS. 29A and 29B, one of the camera module units 100 of the array camera module 1000 is provided with the actuator 60 so as to form an Auto Focus camera module, while the other camera module unit 100 is not provided with the actuator 60 so as to form a Fix Focus camera module, wherein the Auto Focus camera module is cooperative with the Fix Focus camera module to achieve the image acquisition.

Figure 30A:
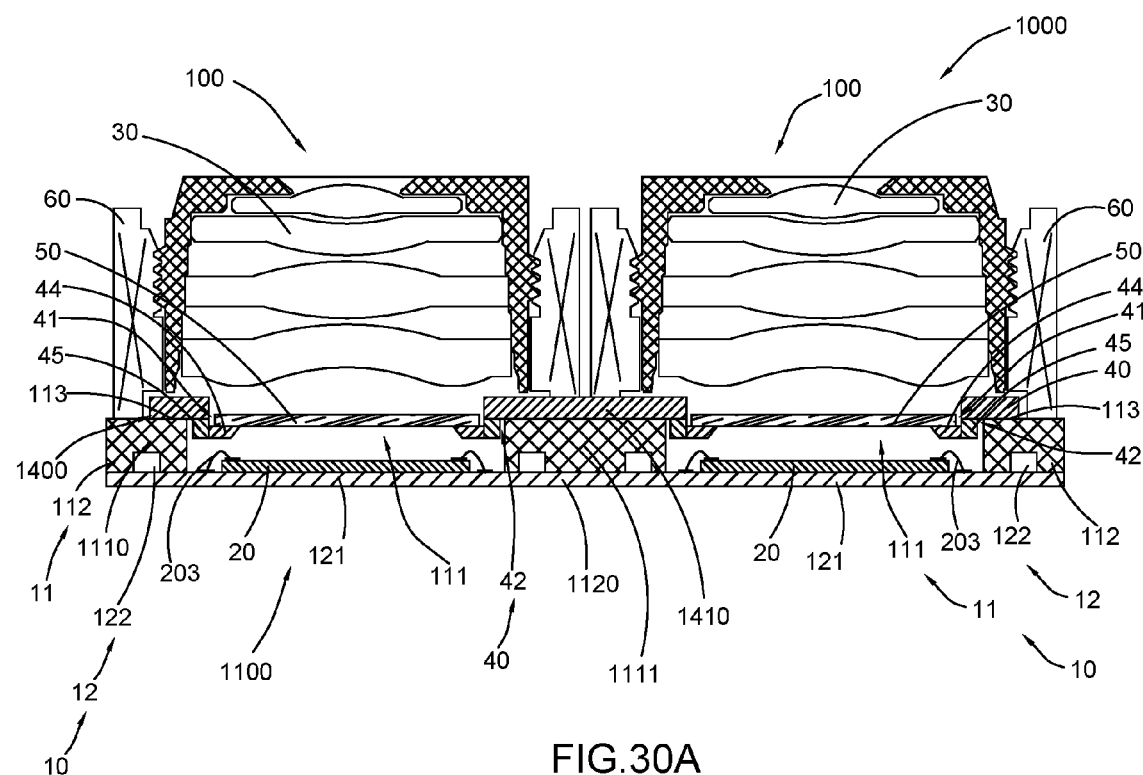
FIG. 30A is a schematic view from one direction illustrating an alternative mode of the array camera module according to the above eleventh preferred embodiment of the present invention.
Figure 30B:
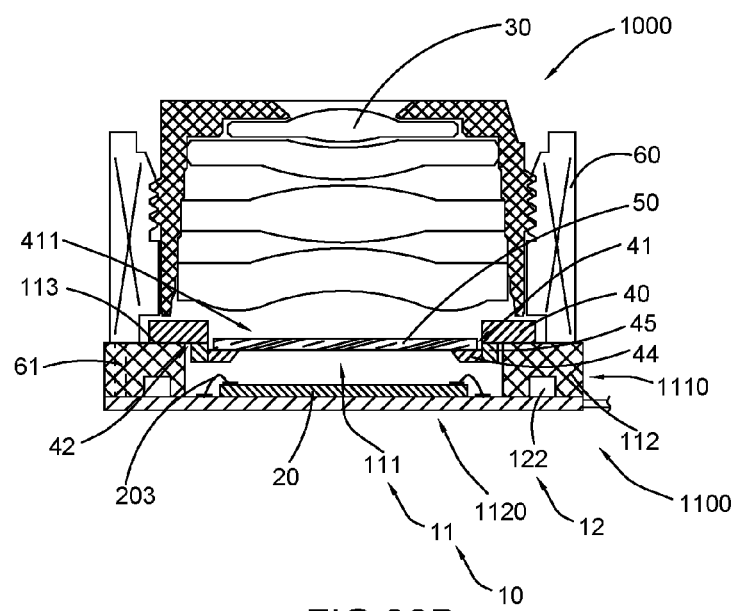
FIG. 30B is a schematic view from another direction illustrating the alternative mode of the array camera module according to the above eleventh preferred embodiment of the present invention.

According to this eleventh embodiment, the joint light filter holder 1400 is installed at the joint integral base 1110, and the two actuators 60 are installed on the joint integral light filter holder 1400. In other words, the joint light filter holder 1400 is installed between the actuators 60 and the joint integral base 1110. And in one alternative mode of the eleventh embodiment, as shown in FIGS. 30A and 30B, the joint light filter holder 1400 and portions of the two actuators 60 are installed on the top surface 113 of the joint integral base 1110. More specifically, the joint light filter holder 1400 is installed on the joint integral base 1110 while at least two outer sides of the top surface 113 of joint integral base 1110 are remained opened for installing portions of the two actuators 60 respectively, so that the two actuators 60 and the joint light filter holder 1400 coordinate to share the top surface 113 of the joint integral base 1110.

Figure 31:
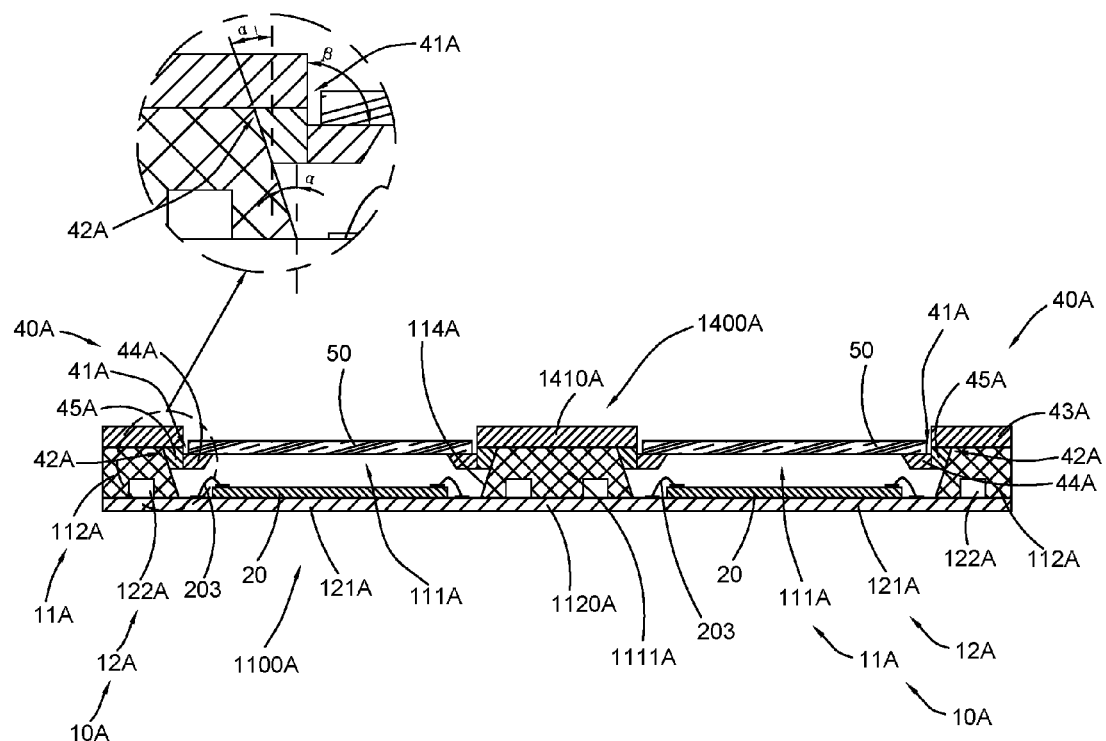
FIG. 31 is a sectional view illustrating a first alternative mode of the integral pieces of base assemblies and the integral piece of light filter holders of the array camera module according to the above eleventh preferred embodiment of the present invention.

Referring to FIG. 31, a first alternative mode of the joint integral base and the joint light filter holder according to the eleventh preferred embodiment of the present invention is illustrated. In this first alternative mode, the inner side surfaces of each of the integral bases 11A are inclinedly extended from bottom to top to form the light windows 111A respectively, wherein each of the light windows 111A has a size increasing from bottom to top. More specifically, each inner side surface 114A of each integral base 11A defines an inclination angle $\alpha$ with respect to the light axis of the camera module 100A, so that the opening of each of the light windows 111A has an increasing size for facilitating the manufacture of the integral bases 11A. The inclination angle $\alpha$ has a range of 3°~30°. In some embodiments, the value of a is within 3°~15°, 15°~20° or 20°~30°. Accordingly, the engaging groove 42A of each light filter holder 40A defines an engaging angle $\alpha 1$ corresponding to the inclination angle $\alpha$, so that the shape of the engaging groove 42A matches the inclined shape of the inner side surface 114A and thus each light filter holder 40A can be more stably installed in position.

In other words, each downward extending arm 45A is inclinedly and downwardly extended from the light filter holder body 43A and defines the engaging angle $\alpha 1$ corresponding to the inclination angle $\alpha$. Each inward extending arm 44A is transversely and inwardly extended from the light filter holder body 43A and defines a supporting angle $\beta$ which may equal to or larger than 90°, so as to facilitate the assembly of the light filter 50. Of course, the integral base 11 having the inclination angle $\alpha$ can also be installed with the light filter holder 40 which does not form the engaging angle $\alpha 1$ and the supporting angle $\beta$.

Figure 32A:
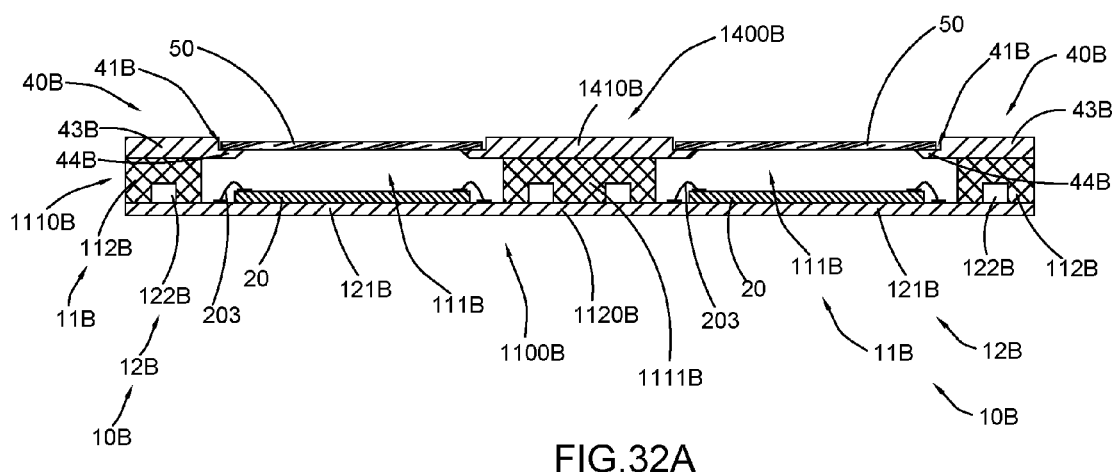
FIG. 32A is a sectional view illustrating a second alternative mode of the array camera module according to the above eleventh preferred embodiment of the present invention.

As shown in FIG. 32A, a second alternative mode of the joint integral base assembly and the joint light filter holder according to the eleventh preferred embodiment of the present invention is illustrated. Each of the light filter holders 40B simply forms a supporting groove 41B communicated with the light window 111B of the respective integral base 11B for providing an installation site for the respective light filter 40B. In other words, the light filters 50 are installed at the supporting grooves 41B respectively.

More specifically, each of the light filter holders 40B comprises the light filter holder body 43B and at least one inward extending arm 44B only which is transversely, integrally and inwardly extended from a lower portion of the light filter holder body 43B to define the supporting groove 41B on top of the inward extending arm 44B, wherein the light joint filter holder 40B having the two filter holder body 43B is adapted to sit and attach on the joint integral base 1110B having the two integral bases 11B.

In other words, each of the light filter holders 40B does not have the downward extending arm 45 and the engaging groove 42B. Therefore, the installation sites of the light filters are not sunk in the light windows 111B. However, through the inward extending distance of each inward extending arm 44B, the light passage area of the light filter 50 also can be reduced, wherein the light filter 50 is received in the respective supporting groove 41B, so that the relative height of the light filter 50 with respect to the light filter holder 40B is reduced.

Figure 32B:
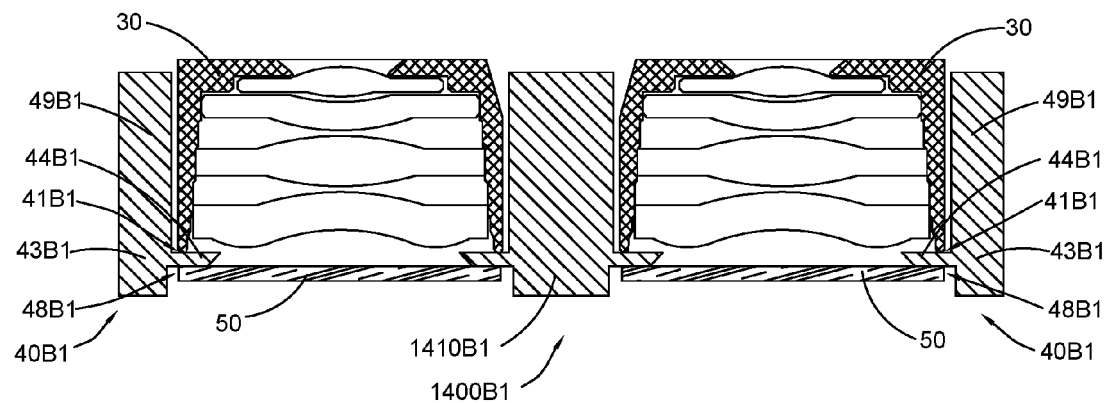
FIG. 32B is a schematic view illustrating an alternative example of the second alternative mode of the integral pieces of base assemblies and the integral piece of light filter holders of the array camera module according to the above eleventh preferred embodiment of the present invention.

FIG. 32B illustrates an alternative example of the second alternative mode of the joint integral base assembly and the joint light filter holder according to the eleventh preferred embodiment of the present invention. Each light filter holder 40B1 has a supporting groove 41B1 and an attaching groove 48B1 for providing assembling sites for the lens 30 and the light filter 50 respectively.

More specifically, each light filter holder 40B1 comprises a light filter holder body 43B1 and at last one inward extending arm 44B1 which is transversely, integrally and inwardly extended from a lower portion of the light filter holder body 43B1 to form the supporting groove 41B1 on top of the inward extending arm 44B1 and the attaching groove 48B1 below the inward extending arm 44B1. Each light filter holder 40B1 further has a lens supporting portion 49B1 integrally and upwardly extended from the light filter holder body 43B1 for receiving the lens 30. According to this alternative example, each of the light filters 50 is attached to a bottom side of the respective inward extending arm 44B1.

Furthermore, in this alternative example, each lens supporting portion 49B1 has a flat inner side surface without screwing threads for installing the lens 30 without engaging screw threads.

In other words, when each camera module unit 100B1 is a Fix Focus camera module, the lens 30 can be directly installed within the light filter holder 40B1, so as to retain the lens 30 in position. Particularly, there may be gap between the lens 30 and the lens supporting portion 49B1 to facilitate the assembly and adjustment of the lens 30 before the lens 30 is fixed in position by such as gluing.

Figure 32C:
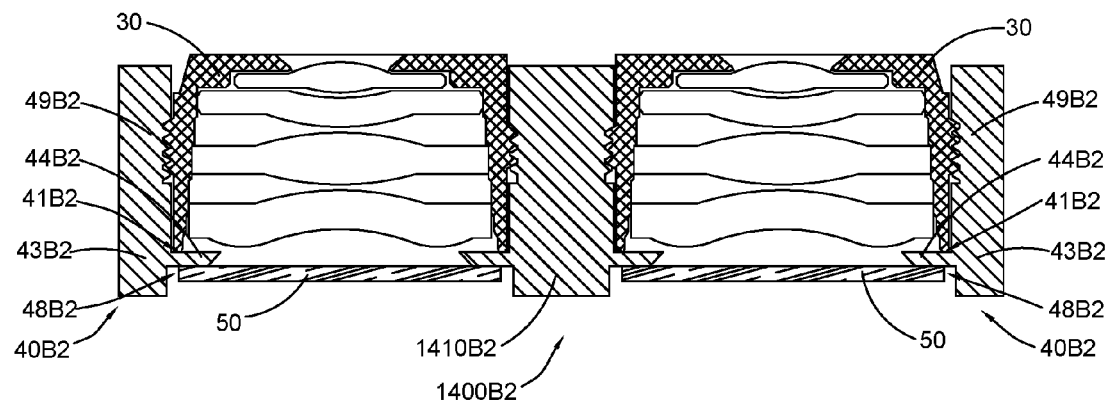
FIG. 32C is a schematic view illustrating another alternative example of the second alternative mode of the integral pieces of base assemblies and the integral piece of light filter holders of the array camera module according to the above eleventh preferred embodiment of the present invention.

FIG. 32C illustrates another alternative example of the second alternative mode of the joint integral base assembly and the joint light filter holder according to the eleventh preferred embodiment of the present invention. Each light filter holder 40B2 has a supporting groove 41B2 and an attaching groove 48B2 for providing assembling sites for the lens 30 and the light filter 50 respectively.

More specifically, each light filter holder 40B2 comprises a light filter holder body 43B2 and at last one inward extending arm 44B2 transversely, integrally and inwardly extended from a lower portion of the light filter holder body 43B2 to form the supporting groove 41B2 on top of the inward extending arm 44B2 and the attaching groove 48B2 below the inward extending arm 44B2. The light filter holder 40B2 further has a lens supporting portion 49B2 integrally and upwardly extended from the light filter holder body 43B2 for receiving the lens 30. According to this alternative example, each of the light filters 50 is attached to a bottom side of the respective inward extending arm 44B2.

Furthermore, in this alternative example of the present invention, each lens supporting portion 49B2 has an inner screwing structure for installing the lens 30 with engaging screw threads.

In other words, when each camera module unit 100B2 is a Fix Focus camera module, the lens 30 can be directly screwed to install within the light filter holder 40B2, so as to retain the lens 30 in position.

It is worth mentioning that in the above two alternative examples, the possible alternative modes of each light filter holder illustrating that the lens 30 can be directly installed in the light filter holder 40B1 or 40B2 are exemplary only but not a limitation to the present invention.

Figure 33A:
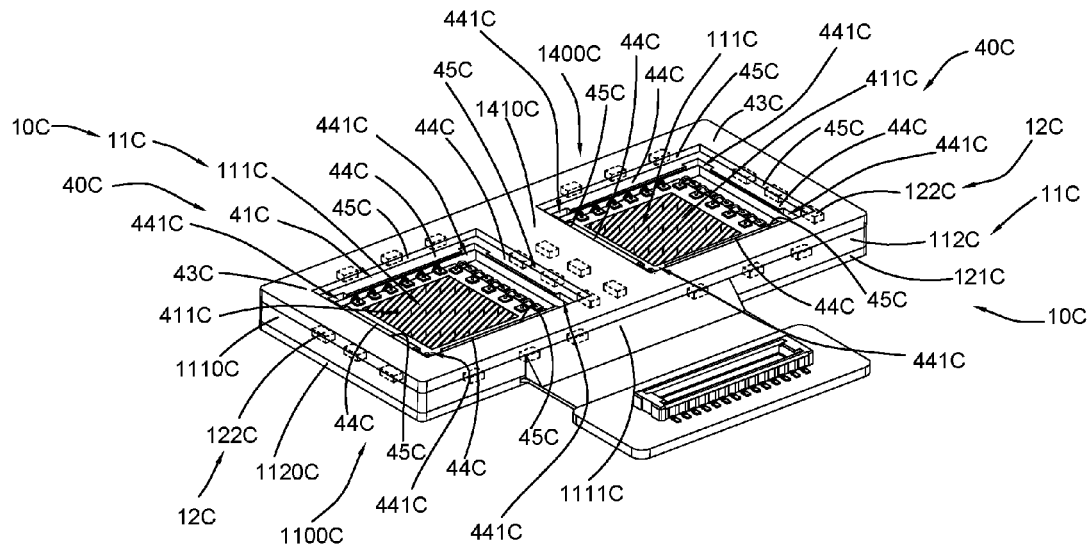
FIG. 33A is a schematic view illustrating a third alternative mode of the integral pieces of base assemblies and the integral piece of light filter holders of the array camera module according to the above eleventh preferred embodiment of the present invention.

Referring to FIG. 33A, a third alternative mode of the joint light filter holder according to the eleventh preferred embodiment of the present invention is illustrated. In this third alternative mode, each of the light filter holders 40C has at least one corner opening 441C provided at a corner position of the receiving opening 411C thereof, for facilitating the assembling of the light filter 50 and reducing the edge shadow of the image of the camera module unit 100 which may be resulted from a sharp corner. More specifically, the corner opening 441C is formed between two adjacent inward extending arms 44C and extended upwardly to communicate the light window 111C with outside so as to increase the light flux at the corner position of the light filter holder 40C of the camera module unit. In other words, the two adjacent inward extending arms 44C form the corner opening 441C therebetween which is communicated to outside so as to increase light flux at the corner opening 441C of the light filter holder 40C, and thus the edge shadow is reduced.

More specifically, in one embodiment, each corner opening 441C is an expanded square corner opening. For example, but not limiting, each light filter holder 40C has four such expanded square corner openings at the four corner positions thereof. In other embodiments, each corner opening 441C may be a corner opening with an arc angle so as to increase the light flux at the corner of the light filter holder 40C. Of course, there may have no such corner openings 441C formed in some embodiments. The person of ordinary skilled in the art should understand that the shape, number, and position of the corner opening 441C would not limit the scope of the present invention.

Figure 33B:
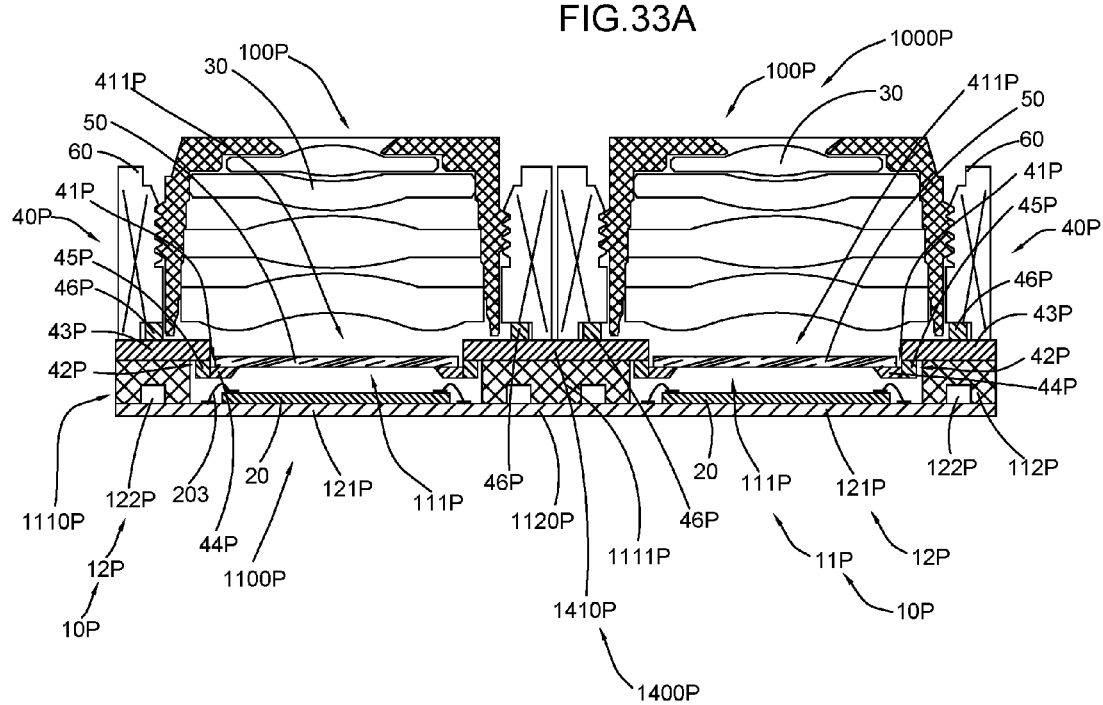
FIG. 33B is a schematic view illustrating a fourth alternative mode of the integral piece of base assemblies and the integral piece of light filter holders of the array camera module according to the above seventh preferred embodiments of the present invention.

As shown in FIG. 33B, a fourth alternative mode according to the eleventh preferred embodiment of the present invention is illustrated. Each of the light filter holders 40P of the joint light filter holder 1400P comprises at least one retaining protrusion 46P which is at least partially, protrudedly and upwardly extended from the top of the light filter holder body 43P, so as to retain an installed component or prevent dusts or lights from reaching the inner space of the camera module unit 100P. For example, but not limiting, each retaining protrusion 46P is used for retaining the actuator 60 or the lens 30 in position. Particularly, for example, the retaining protrusion 46P is provided at a middle position of the light filter holder body 43P for dividing the light filter holder body 43P into two portions, including an outer portion used for installing the actuator 60 and an inner portion used for installing the lens 30. In such a configuration, each retaining protrusion 46P can retain the respective actuator 60 in position, so as to decrease the deviation of the actuator 60. And, during the assembling process, the retaining protrusion 46P can prevent the adhering glue which is used for adhering the actuator 60 in position from overflowing into the inner space to contaminate the lens or other inner components. Particularly, the retaining protrusion 46P can be a ring shaped protrusion so as to integrally retaining the actuator 60 in position and block the adhering glue from overflowing into the inner space.

It is worth mentioning that according to other embodiments of the present invention, a surface of the retaining protrusion 46P can be provided with screwing threads for directly installing the lens 30. And when the retaining protrusion 46P is provided with screwing threads at an outer side thereof, it is suitable for coupling with the lens 30 with a relatively large pore diameter.

Figure 34A:
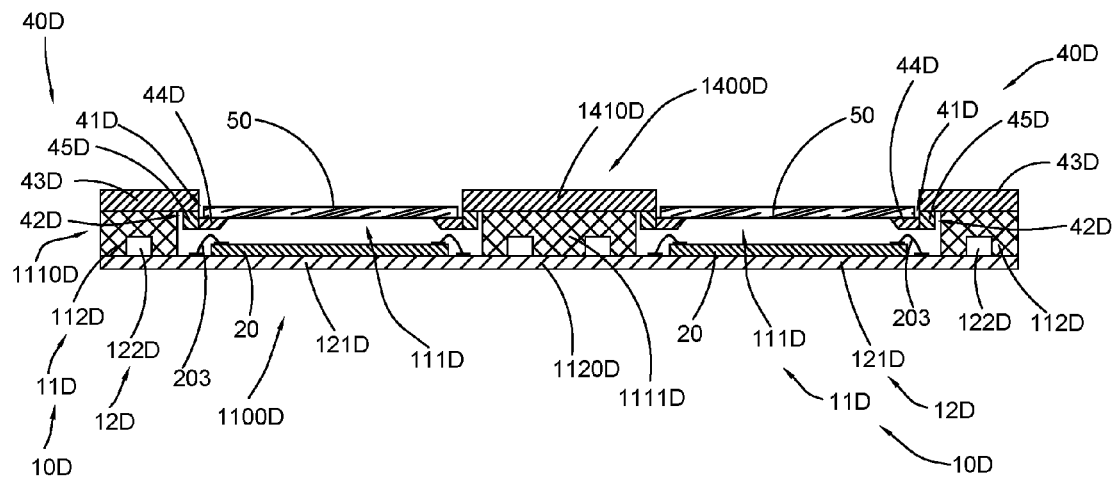
FIG. 34A is a sectional view from one direction illustrating an array camera module according to a twelfth preferred embodiment of the present invention.
Figure 34B:
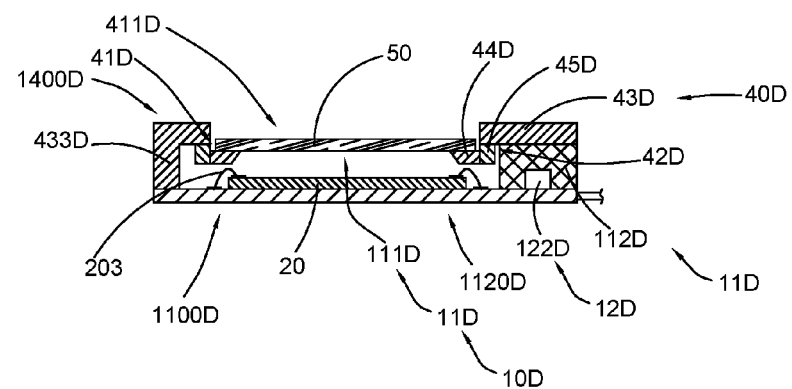
FIG. 34B is another sectional view from another direction illustrating the array camera module according to the twelfth preferred embodiment of the present invention.
Figure 35:
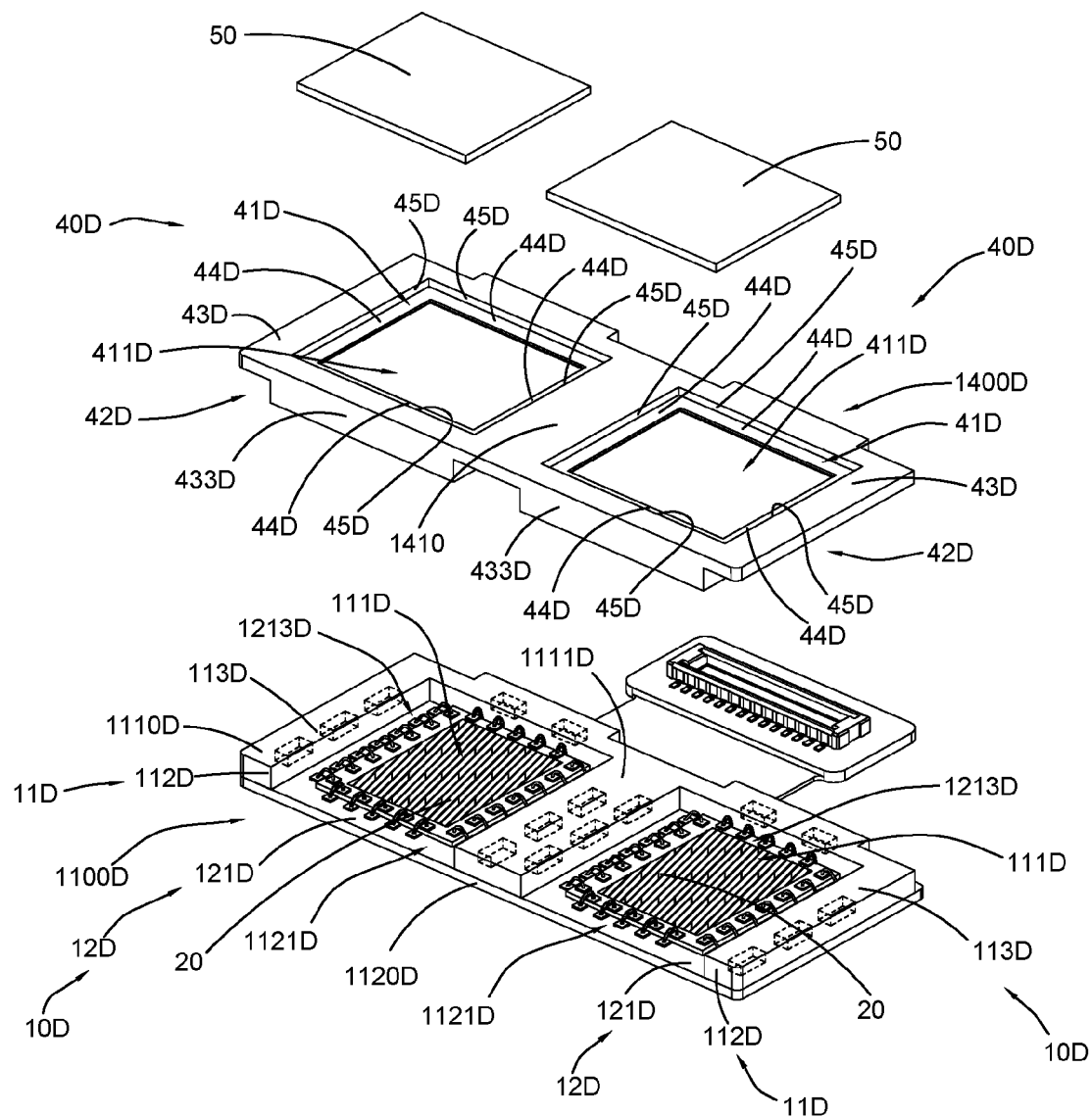
FIG. 35 is an exploded view illustrating an array camera module according to the twelfth preferred embodiment of the present invention.

Referring to FIGS. 34A to 35, a joint integral base assembly according to a twelfth preferred embodiment of the present invention is illustrated. Each of the integral bases 11D of the joint integral base assembly 1100D comprises an integral base body 112D with at least one light window 111D therein for providing the light passage for the respective photosensitive element 20. More specifically, the integral base body 112D has at least one side opening 1121D which communicates the light window 111D to outside, and the light filter holder 40D covers the side opening 1121D so as to form the light window 111D sealingly surrounded by the light filter holder 40D and the base body 112D.

Each of the light filter holders 40D comprise at least one extending leg 433D integrally and downwardly extended from a bottom of its light filter holder body 43D to the respective base board. 121D, so as to cover and enclose the side opening 1121D. For example, but not limiting, the extending leg 433D is connected to the base board 121D and/or the integral base body 112D by adhering.

More specifically, each integral base body 112D has a U-shaped structure, and the light filter body 43D of the light filter holder 40D is engaged with the U-shaped integral base body 112D, and the extending leg 433D is downwardly extended to the side opening 1121D of the U-shaped structure, so as to form a closed structure for the integral base 11D, so that a sealed and enclosed inner environment is formed.

In other words, in this twelfth embodiment, each of the integral bases 11D integrally combines with the respective light filter holders 40D to function as the conventional holder of the camera module unit, so that the advantages of integral encapsulating process and the function of the light filter holder 40D are incorporated in the present invention.

It is worth mentioning that since the requirement for the size of the camera module is higher and higher, the layout of the electronic components 122D of the circuit boards 12D, the positions of the electronically connecting elements 203, and the packaging positions of the integral bases 11D should be properly configured, i.e. while full utilizing the base boards 121D, the occupying areas of these components should be smaller, so as to reduce the size of the array camera module. According to this twelfth embodiment of the present invention, the positions of the electronic components 122D are used for integral packaging, that is to say the electronic components 122D are embedded in the integral bases 11D, and thus the space around the electronic components 122D are utilized, and the electromagnetic interference between the electronic components 122D and the electrically connecting elements 203 is reduced, and the position at one side of each of the base boards 121D which is not provided with the electronic components 122D is provided with the extending leg 433D of the respective light filter holder 40D, so as to fully utilize the remaining positions of the base boards 121D. On the other hand, by introducing the joint light filter holder 1400D, having the two light filter holders 40D and being installed by adhering, the flatness and levelling of the integral bases 11D of the joint integral base 1110D can be adjusted and compensated, so as to provide a good installing condition for the array camera module.

Figure 36A:
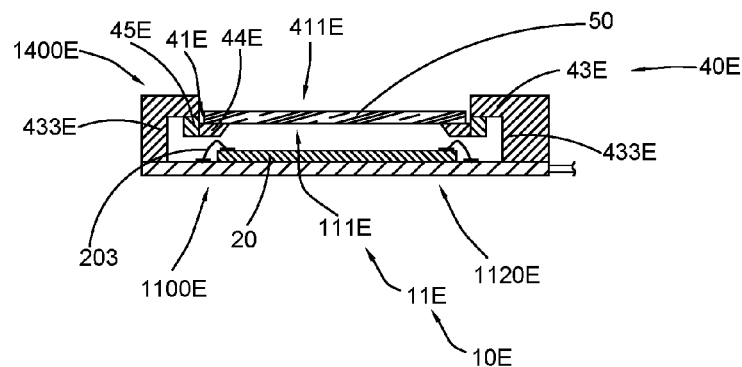
FIG. 36A is a sectional view from one direction illustrating the array camera module according to the twelfth preferred embodiment of the present invention.
Figure 36B:
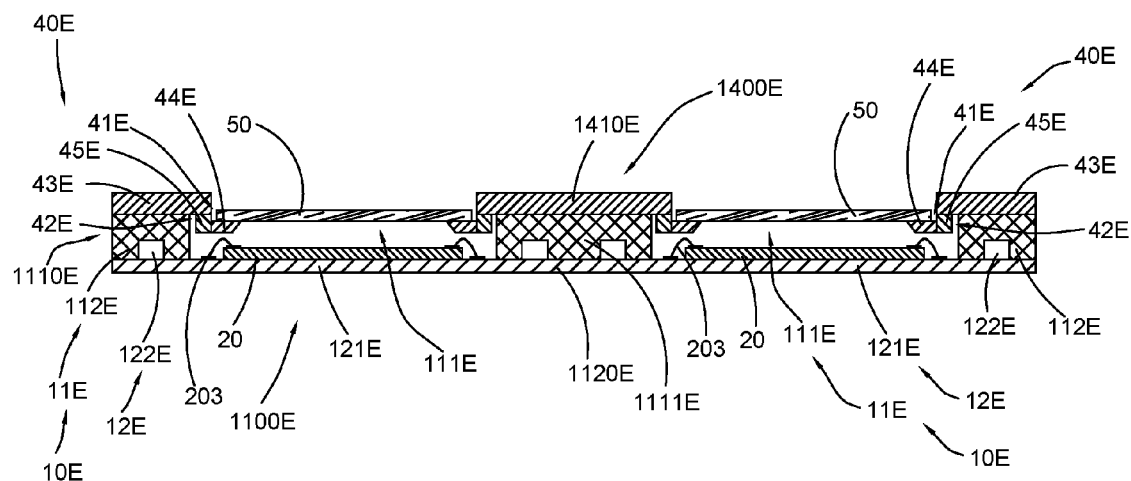
FIG. 36B is another sectional view from another direction illustrating the array camera module according to the twelfth preferred embodiment of the present invention.
Figure 36C:
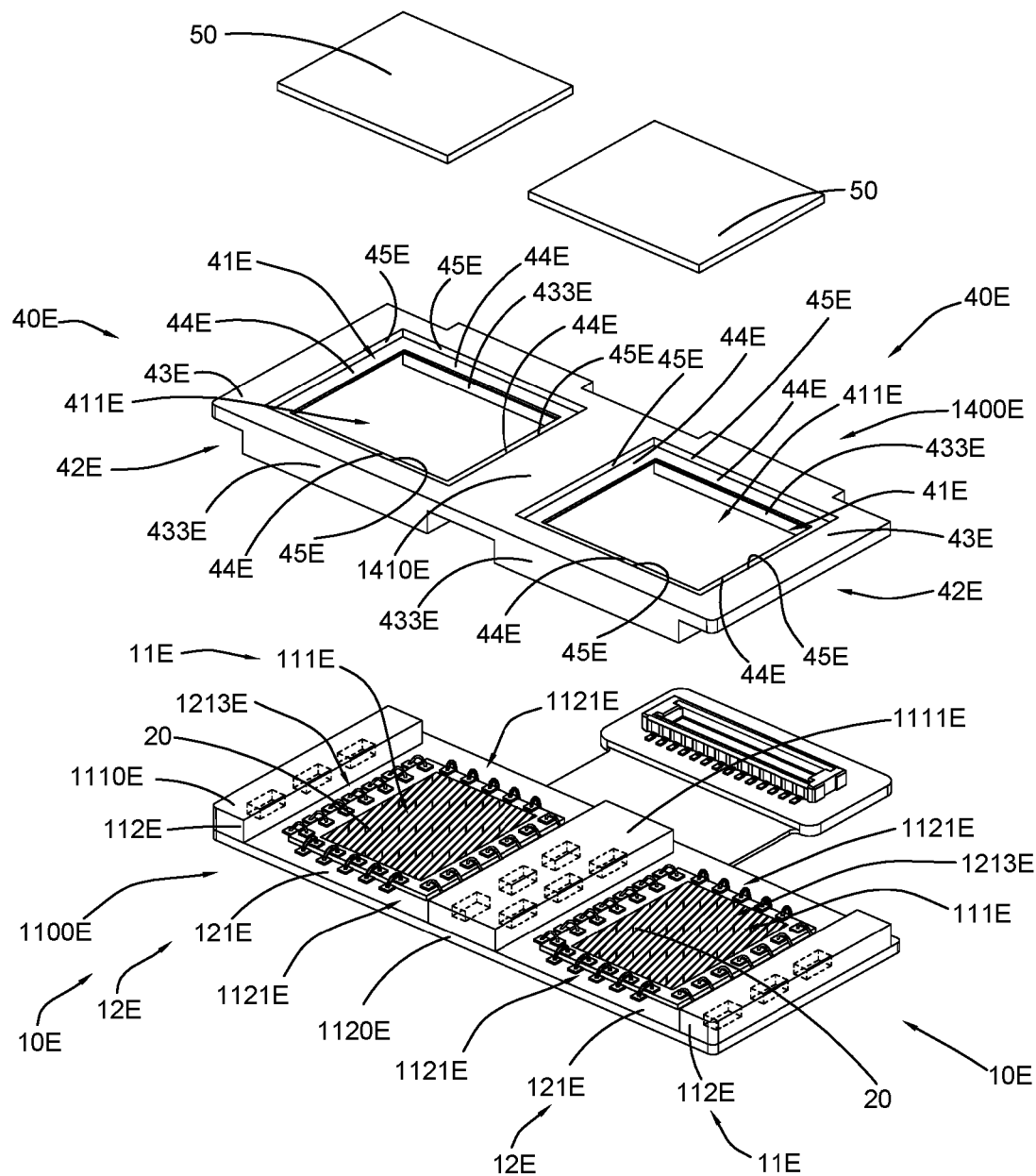
FIG. 36C is an exploded view illustrating the integral piece of bases and the integral piece of light filter holders of the array camera module according to the above twelfth preferred embodiment of the present invention.

As shown in FIGS. 36A to 36C, an alternative mode of the joint integral base assembly and the joint light filter holder of the array camera module according to the twelfth preferred embodiment of the present invention is illustrated. Each integral base 11E of the joint integral base 1110E of the joint integral base assembly 1100E comprises an integral base body 112E having at least one light window 111E formed therein for providing the light passage for the respective photosensitive element 20 of the joint circuit board 1120E. More specifically, each of the integral base bodies 112E has two side openings 1121E communicating the light window 111E to outside, and the respective light filter holder 40E has means for covering to the side openings 1121E so as to sealingly enclose the light window 111E.

Each of the light filter holders 40E comprises two extending legs 433E respectively, integrally and downwardly extended from the light filter holder body 43E to the respective base board 121E so as to fittingly and sealingly cover and close the openings 1121E. For example, but not limiting, each of the extending legs 433E is connected to the respective base board 121E and/or the respective integral base body 112E by adhering. More specifically, according to one embodiment, the integral base bodies 112E of the joint integral base 1120E are integrally connected side by side parallelly, and the light filter holder bodies 43E of the two light filter holders 40E of the joint light filter holder 1400E are also connected side by side parallelly and mounted on the integral base bodies 112E respectively, the extending legs 443E of each of the light filter holders 40E are downwardly extended to fill and cover the side openings 1121E formed at two sides of the respective integral base body 112E, so that the integral base body 112E forms a sealed and closed inner environment as the light window 111E. In some embodiments, two inner adjacent extending legs can be integrally connected to form a combined extending leg. Particularly, the combined extending leg is positioned between the two light windows 111E that separates the two light windows 111E and the two light passages of the two camera module units. In other words, according to this embodiment, the joint light filter holder 1400E comprises three extending legs 433E, including two outer extending legs 433E and a middle extending leg 433E which are parallel to each other, wherein the middle extending leg 433E is positioned between the light windows 111E to separate the two light windows 111E, and the other two outer extending legs 433E are respectively inwardly extended to fill and cover the two outer side openings 1121E of the joint integral base 1110E, so that two independent enclosed light windows 111E are formed. In other words, in the array camera module 1000E, the two light windows 111E of the two camera module units 100E are communicated with each other before installing the joint light filter holder 1400E, and the joint light filter holder 1400E comprises the two outer extending legs 433E to cover the two outer side openings 1121E of the joint integral base 1110E and the middle extending leg 433E to incorporate with the joint integral base 1110E to position between the two light windows 111E to form two separated and sealed light windows 111E. The adjacent extending legs 433E of the light filter holders 40E actually form a combined portion, i.e. the middle extending leg, that may substantially substitute the integral joint portion 1111E of the integral piece of bases 1110E. In one embodiment, the two adjacent extending legs 433E are actually integrally formed and an integral combined extending leg 433E is presented.

Figure 37A:
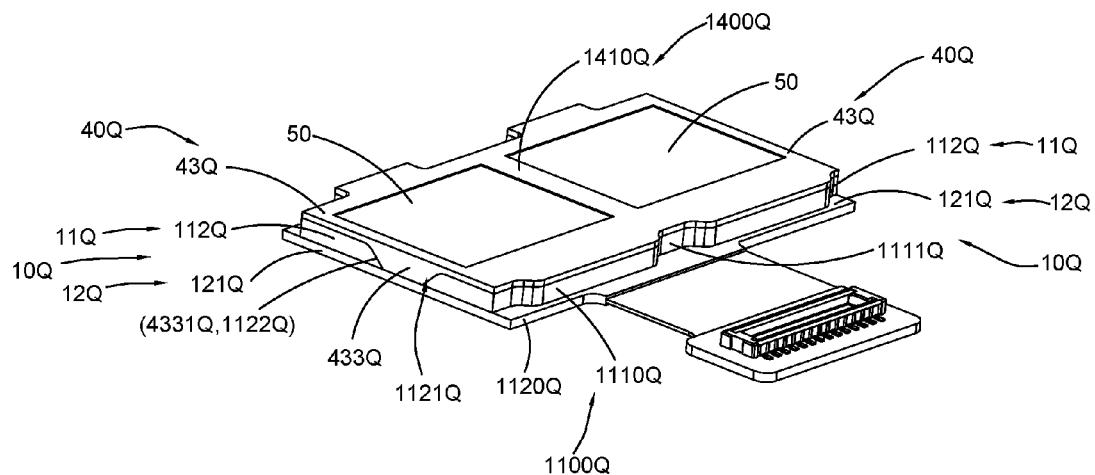
FIG. 37A is a perspective view of the integral piece of base assemblies and the integral piece of light filter holders of the array camera module according to the above twelfth preferred embodiment of the present invention.
Figure 37B:
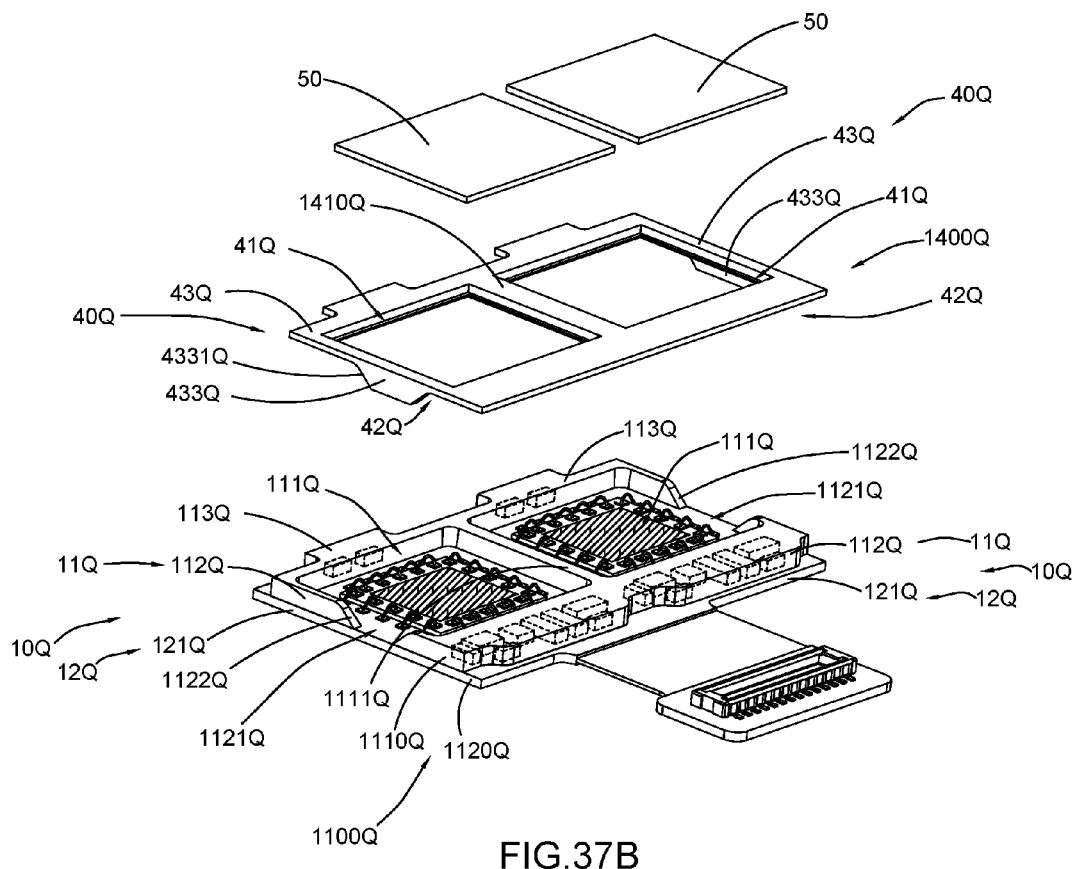
FIG. 37B is an exploded view of the integral piece of base assemblies and the integral piece of light filter holders of the array camera module of FIG. 37A.

Referring to FIGS. 37A to 37B, another alternative mode of the joint integral base and joint light filter holder according to the twelfth preferred embodiment of the present invention is illustrated. In this alternative mode, each of the integral bases 11Q of the joint integral base 1110Q of the joint integral base assembly 1100Q comprises an integral base body 112Q having at least one light window 111Q formed for providing the light passage for the respective photosensitive element 20 electrically connected on the joint circuit board 1120Q. More specifically, the joint integral base 1110Q has two side openings, for example at two opposing outer sides, communicating the two light windows 111Q to outside respectively, wherein the joint light filter holder 1400D comprises means for covering and closing the two side openings 1121Q to enclose the periphery of the light window 111Q. The difference between this alternative mode with the above embodiments is that the two side openings 1121Q of the two integral base bodies 112Q of the joint integral base assemblies 1100Q are arranged at opposite sides, so as to facilitate the positioning of the joint light filter holder 1400Q on the joint integral base 1110Q and retain the joint light filter holder 1400Q in position at two sides thereof.

Furthermore, each side opening 1211Q is constructed to have a reversed trapezoidal shape, so as to retain and install the corresponding light filter holder 40Q in position. Accordingly, each joint light filter holder 1400Q comprises two extending legs 433Q integrally and downwardly extended from the two light filter holder bodies 43D to the base board 121Q respectively, so as to sealedly cover and close the side openings 1121Q respectively. More specifically, the two extending legs 433Q are arranged at two opposite sides, and each of which has a reversed trapezoidal structure for fittingly covering the respective side opening 1121Q. For example, when the light filter holder 40Q is being installed, each extending leg 433Q is retained at the side opening 1121Q, so as to seal and close the corresponding side opening 1121Q.

The person of ordinary skilled in the art should understand that the shape and size of the opening 1121Q in the embodiment of the present invention is exemplary only but is not limiting the scope of the present invention.

Particularly, in some embodiments, the electronic components 122Q can be collectively arranged at just one side of the base board 121Q, and are embedded by at least a portion of the respective integral base body 112Q, and more particularly, they are embedded by the integral base body 112Q at a wider area thereof. The other side of the base body 121Q which is not provided with the electronic components 122Q is corresponding to the relatively narrower portion of the respective integral base body 112Q. Each of the light filter holders 40Q is installed at the respective integral base body 112Q and the each of the extending legs 433Q is downwardly extended to fill and cover the respective side opening 1121Q between the two wider and narrower portions of the respective integral base body 112Q.

Furthermore, each of the integral base bodies 112Q has at least one opening wall 1122Q, actually two opening walls 1122Q, forming the corresponding side opening 1121Q. Each opening wall 1122Q is inclinedly, integrally and upwardly extended from the base board 121Q, so as to form the reversed trapezoidal shaped opening 1121Q. Correspondingly, each of the extending legs 433Q has at least one complementary wall 4331Q which is formed corresponding to the opening wall 1122Q, so that the configuration of each extending leg 433Q is suitable to be fittingly inserted into the opening 1121Q, so as to seal and enclose the periphery of the opening 111Q.

Particularly, the complementary wall 4331Q of each of the extending legs 433Q and the corresponding opening wall 1122Q of each of the integral base bodies 112Q are connected and sealed by adhering glue.

Figure 38A:
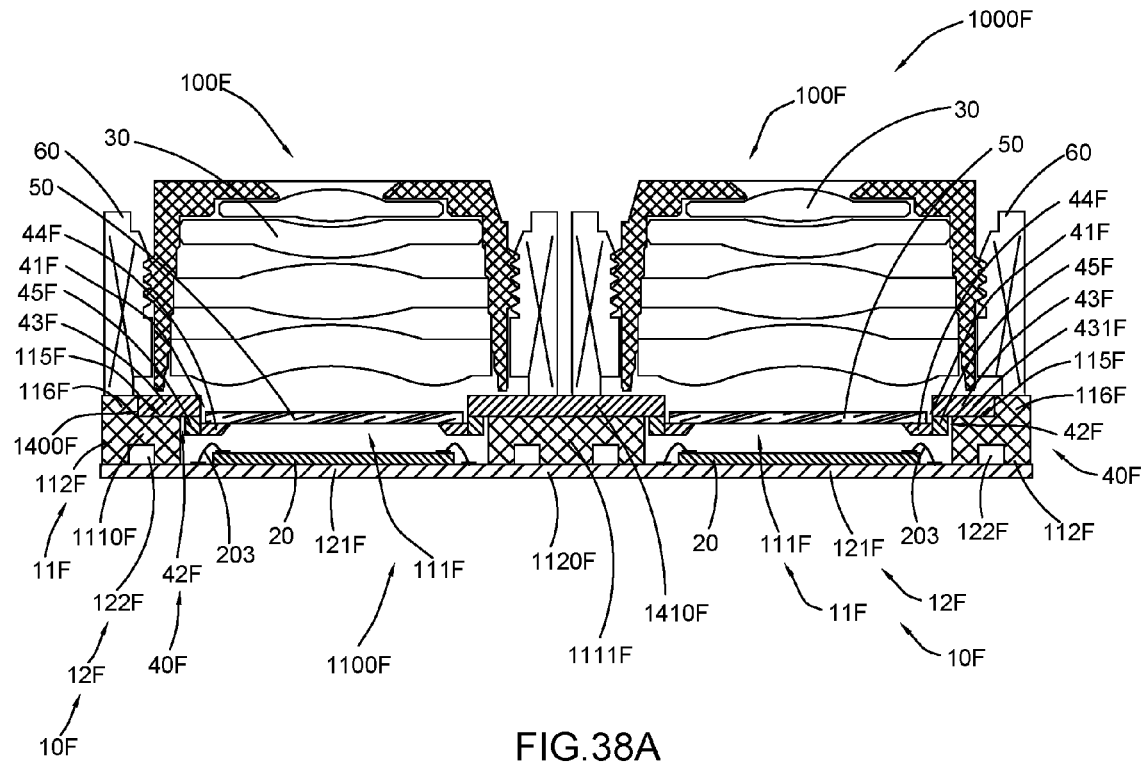
FIG. 38A is a sectional view from one direction illustrating an array camera module according to a thirteenth preferred embodiment of the present invention.
Figure 38B:
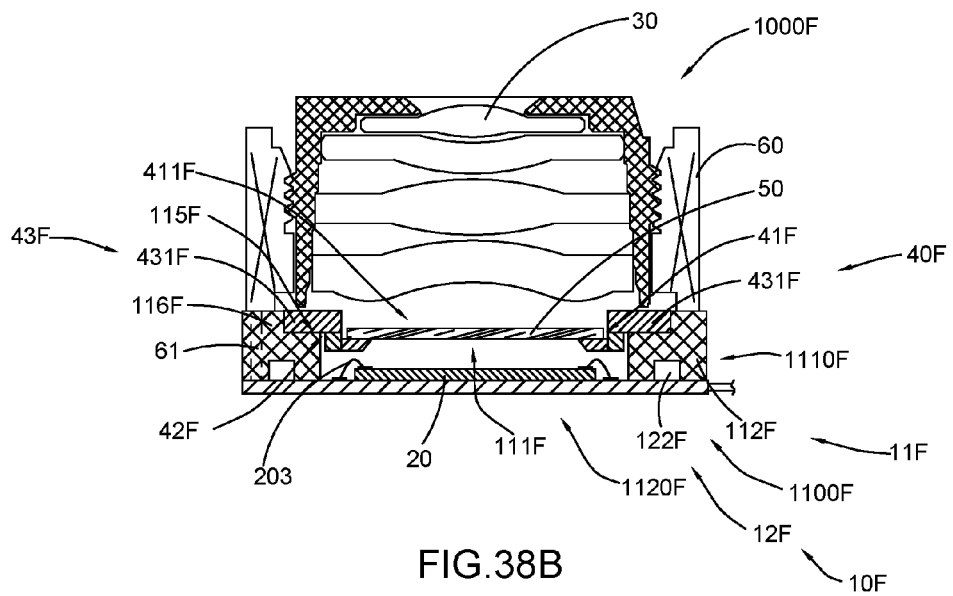
FIG. 38B is another sectional view from another direction illustrating the array camera module according to the thirteenth preferred embodiment of the present invention.
Figure 39:
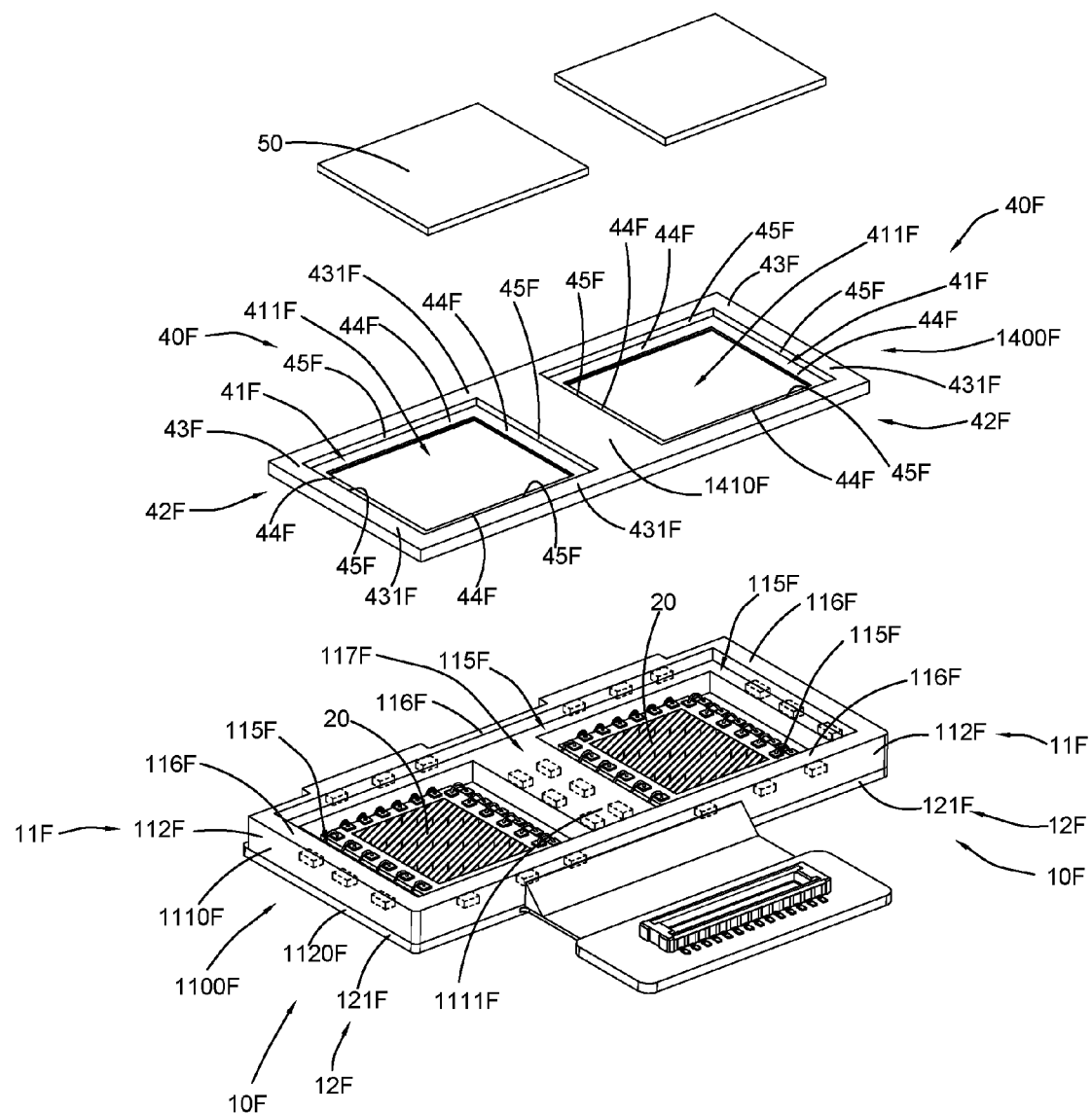
FIG. 39 is an exploded view illustrating the integral piece of bases and the integral piece of light filter holders of the array camera module according to the above thirteenth preferred embodiment of the present invention.

Referring to FIGS. 38A to 39 of the drawings, an array camera module according to a thirteenth preferred embodiment of the present invention is illustrated. Each of the integral bases 11F of the joint integral base 1110F of the joint integral base assembly 1100F has an installing groove 115F formed on top thereof and communicated to the light window 111F of the respective light filter holder 43F of the joint light filter holder 1400F and at least one notch 117F formed between the two integral bases 11F. According to this thirteen embodiment of the present invention, the notch 117H is provided at a middle position which is the joint portion of the two integral bases 11F, i.e. the position above the integral joint portion 1111F of the joint integral base 1110F, and is communicated to the two light windows 111F. In other words, the notch 117F connects the two installing grooves 115F and receives a bridge portion 1410F of the joint light filter holder 1400F.

The light filter holders 40F are installed in the two installing grooves 15F respectively so as to fittingly mount the joint light filter holder 1400F on joint integral base 111F. More specifically, each of installing grooves 115F is a U-shaped groove, and the top opening of the U-shaped groove corresponds to and communicates with the notch 117F. Particularly, the U-shaped grooves of the two light filter holders 40F are connected with each other through the notch 117F to form an enclosed chamber with inner receiving space to fittingly receive the joint light filter holder 1400 therein, wherein when the joint light filter holder 1400 is installed at the joint integral base 1110F, the bridge portion 1410F of the joint light filter holder 1400F is bridged and positioned in the middle notch 117F.

More specifically, the engaging groove 42F of each of the light filter holders 40F is engaged to the installing groove 115F of the respective integral base 11F, so that the light filter holder bodies 43F of the light filter holders 40F are supported and received in the installing grooves 115F respectively.

Each light filter holder body 43F of each of the light filter holders 40F has a predetermined thickness avoiding any contact with any components positioned above it, such as the actuator 60 or the lens 30. Preferably, when each of the light filter holders 40F is installed in the respective installing groove 115F, a top surface of the light filter holder 40F is in the same plane with a top surface of the respective integral base body 112F, so that the light filter holders 40 will not protrude from the integral base bodies 112F and in contact with the actuator 60 or the lens 30 installed above it.

More specifically, each of the integral bases 11F comprises a plurality of protrusion steps 116F which is protruded and extended from the integral base body 112F to define the installing groove 115F. Each of the integral bases 11F has one side, the inner side according this thirteen embodiment, which does not form the protrusion step so as to form the notch 117F.

According to this thirteenth embodiment of the present invention, each of the integral bases 11F comprises three such protrusion steps 116F which are integrally connected to form a U-shaped protrusion structure. And the inner side of each of the integral bases 11F without forming the protrusion step forms the notch 117F.

The light filter holder body 43F of each of the light filter holders 40F comprises at least one engaging edge 431F used for engaging with the installing groove 115F and an inner engaging edge being filled in the notch 117F. In other words, the inner engaging edge is downwardly extended into the notch 117F so that the notch 117F is filled to define two sealed inner environments as the two light windows 111F. In this thirteenth embodiment, the two extending edges of the two light filter bodies 43F of the two light filter holders 40F are combined to form the bridge portion 1410F of the joint light filter holder 1400F.

According to this thirteenth embodiment, the light filter holder body 43F of each of the light filter holders 40F comprises three engaging edges 431F and one inner extending edge. The engaging edges 431F and the inner extending edge 432F are integrally connected to form a square shape to fit the shape of the respective installing groove 115F.

The downward extending arms 45F of each of the light filter holder bodies 43F are respectively and longitudinally extended from the engaging edge 431F and the inner extending edge so as to form the engaging groove 42F. The inward extending arms 44F are transversely and integrally extended from the downward extending arms 45F respectively to form the supporting groove 41F.

It is worth mentioning that the electronic components 122F may be arranged at different positions of the base board 121F of the circuit board 12F, and each of the integral bases 11F embeds the electronic components 122F. When configuring the positions of the electronic components 122F, if the required thickness of each of the integral bases 11F is larger, it is more convenient to form the installing groove 115F. And the positions without electronic components 122F may have a relatively smaller thickness, so as to reduce the size of the circuit board 12F. In this thirteen embodiment of the present invention, a portion of each of the integral bases 11F corresponding to the three engaging edges 431F is arranged with the electronic components 122F and this portion of the integral base 11F has a larger transverse width, wherein the installing groove 115F is formed. Also, another portion of the integral base 11F corresponding to the extending edge 432F has a smaller transverse width and is not used for forming the installing groove 115F. The inner extending edges are connected to form the bridge portion 1410F for filling in the notch 117F that functions as the protrusion step 116F here.

Each of the actuators 60 has at least a part installed at the protrusion steps 116F, so as to form an Auto Focus camera module. Each of the actuator 60 is operatively connected to the circuit board 12F through at least one connecting pin 61. In other embodiments, the lens 30 may have at least a part installed at the protrusion steps 116F, so that a Fix Focus camera module is formed.

More specifically, each of the actuators 60 has three edges which are respectively installed at the protrusion steps 116F and a remaining edge which is installed at the inner extending edge (i.e. the bridge portion 1410F) of the respective light filter holder 40F. In some embodiments, a gap may be formed between each of the actuators 60 and the inner extending edge (i.e. the bridge portion 1410F), and an adhering glue is used for filling the gap so as to provide a sealed and enclosed inner environment for the respective camera module unit 100F of the array camera module 1000F. In other words, the top surface of the inner extending edge (the bridge portion 1410F) is lower than the top surface of each protrusion step 116F, and the adhering glue can be used to fill and make up the height difference therebetween. Particularly, each of the actuator 60 is adhered to the protrusion steps 116F while the light axis of the respective lens 30 is coaxially aligned with the light axis of the respective photosensitive element 20.

Referring to FIGS. 40A to 42 of the drawings, an array camera module according an fourteenth preferred embodiment of the present invention is illustrated.

Figure 40A:
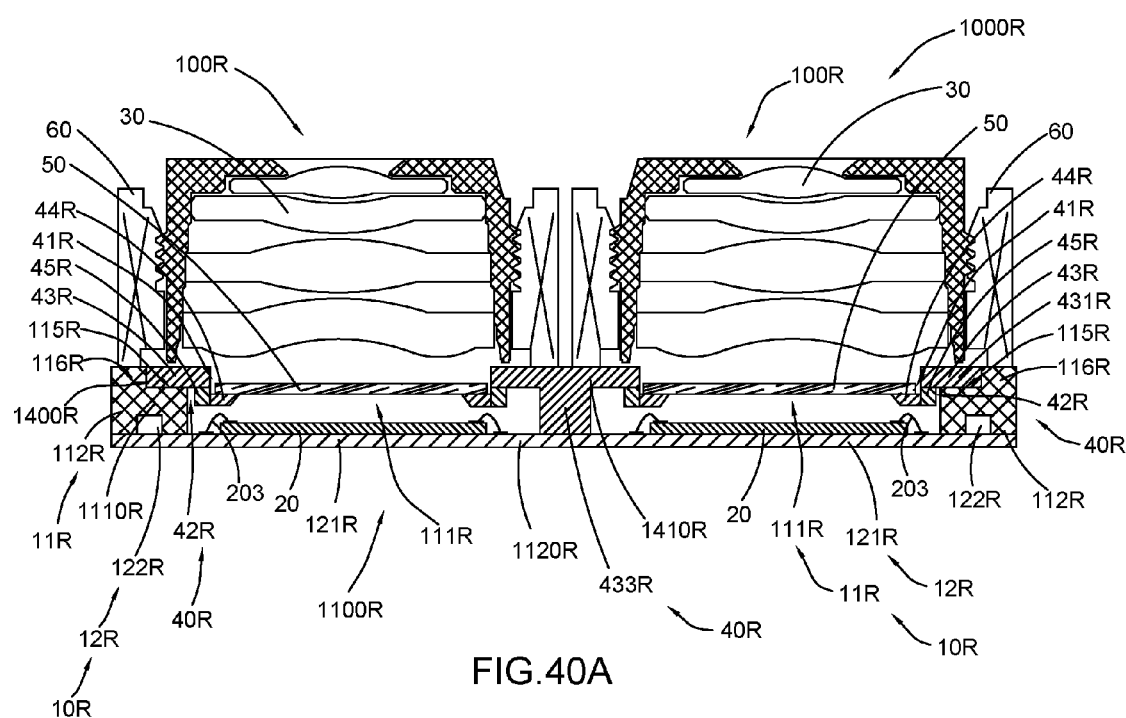
FIG. 40A is a sectional view from one direction illustrating an array camera module according to a fourteenth preferred embodiment of the present invention.
Figure 40B:
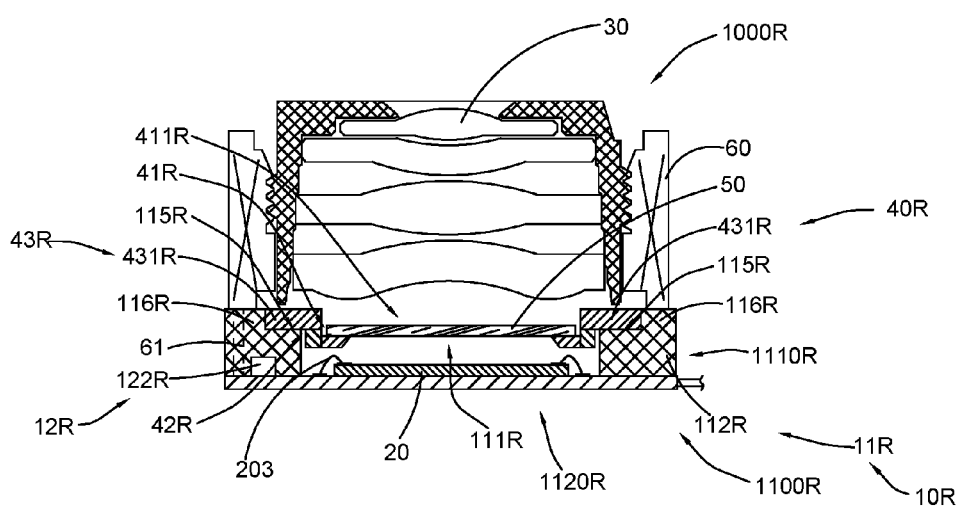
FIG. 40B is another sectional view from another direction illustrating the array camera module according to the fourteenth preferred embodiment of the present invention.
Figure 41:
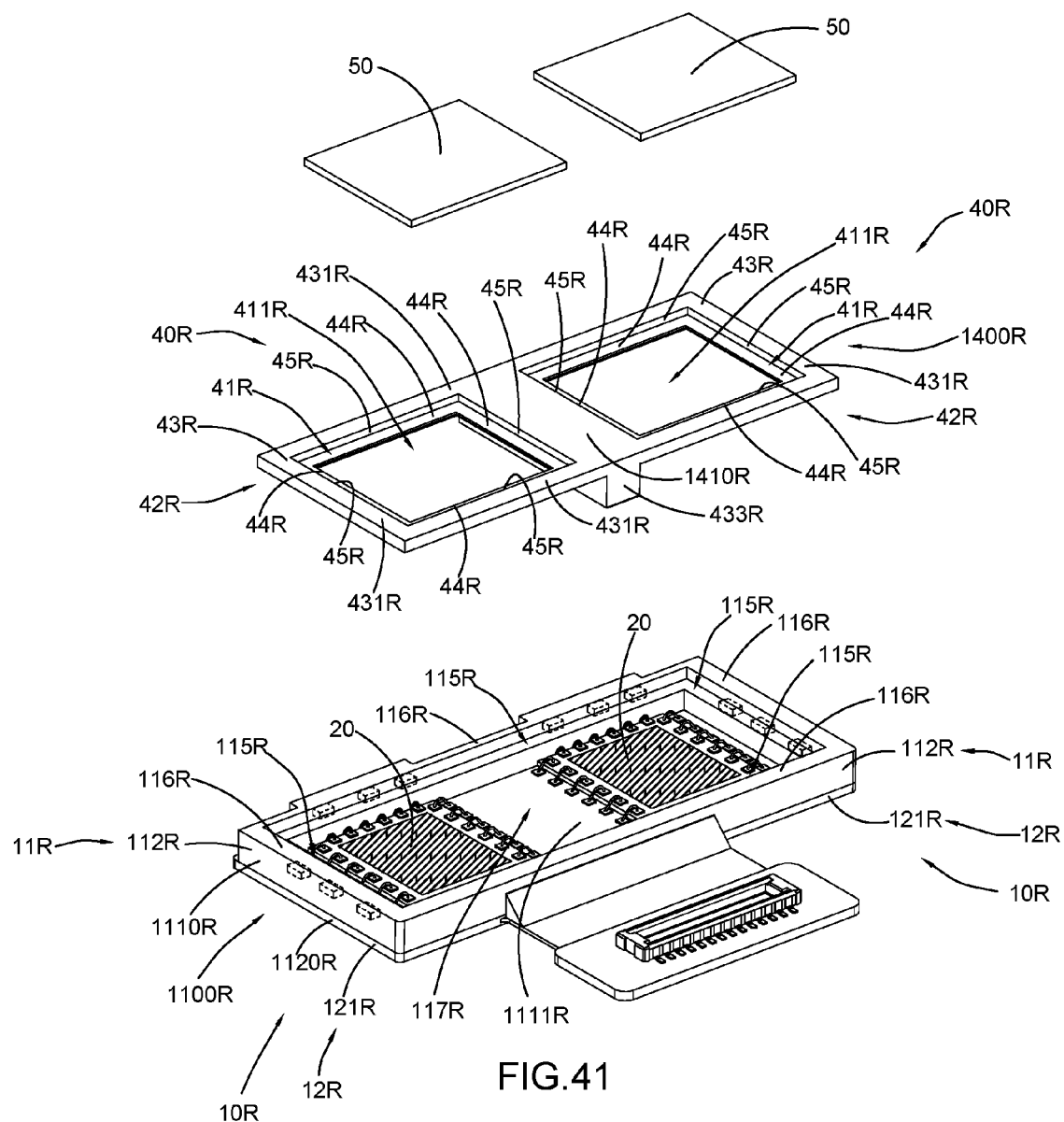
FIG. 41 is an exploded view illustrating the integral piece of bases and the integral piece of light filter holders of the array camera module according to the above fourteenth preferred embodiment of the present invention.

Each of the integral bases 11R of the joint integral base 1110R comprises an integral base body 112R having at least one light window 111R formed for providing a light passage to the respective photosensitive element 20 provided on the joint circuit board 1120R. More specifically, each of the integral base bodies 112R has a U-shaped body and an inner side opened to form an integral joint portion 1111R which is a middle opening communicating the two light windows 111R with each other in a middle portion of the joint integral base assembly 1100R, as shown in FIGS. 40A and 41, while the two U-shaped integral base bodies 112R integral combined to form the rectangular ring shaped joint integral base 1110R. The joint light filter holder 1400R comprises the two light filter holders 40R integrally connected and means for filling the middle opening to separate the two light windows 111R according to this fourteen embodiment of the present invention.

Each of the light filter holders 40R of the joint light filter holder 1400R comprises at least one extending leg 433R integrally and downwardly extended from the respective light filter holder body 43R to the base board 121R, wherein the two extending legs 433R combine to form the integral filling means inserted into the middle opening. For example, but not limiting, the extending legs 433R are connected to the base board 121R and/or the integral base bodies 112R by adhering.

In some embodiments, two adjacent extending legs 433R are integrally connected to form a combined extending leg, i.e. the filling means. Particularly, the combined extending leg separates the two light windows 111R and forms two light passages for the two camera module units 100R. In other words, the combined extending leg of the joint light filter holder 1400R, i.e. the two integrally combined extending legs 433R, is positioned in the middle between the two light windows 111R and separates the two light windows 111R, so as to form two sealed and independent light windows 111R.

Each of the integral bases 11R has an installing groove 115R communicated to the light window 111R and at least one notch 117R which communicates with the two light windows 111R at two sides thereof. Each of the light filter holders 40R is installed at the corresponding installing groove 115R.

According to this fourteenth embodiment of the present invention, each of the integral bases 11R comprises three protrusion steps 116R which are protruded and extended from the integral base body 112R to form the installing groove 115R.

The light filter holder body 43R of each of the light filter holders 40R comprises at least one engaging edge 431R used for engaging with the installing groove 115R and the combined extending leg 433R which can be filled into the notch 117R positioned at the middle opening of the integral joint portion 1111R.

According to this fourteenth embodiment, the light filter holder body 43R of each of the light filter holders 40R comprises four engaging edges 431R integrally connected to form a square shaped structure. The engaging edges 431R of the two light filter holder bodies 43R are integrally connected while the inner side engaging edges 431R of the two light filter holder bodies 43R integrally combined in the middle to form the bridge portion 1410R while the combined extending leg 433R is downwardly extended therefrom. In other words, in this fourteenth embodiment, the middle opening notch 117R is provided at the joining portion of the two integral bases 11R of the joint integral bases 1110R. The extending leg 433R of the joint light filter holder 1400R is provided at the corresponding joining portion thereof for integrally forming the bridge portion 1410R.

The downward extending arms 45R are longitudinally extended from the engaging edges 431R respectively to define the engaging groove 42R. the inward extending arms 44R are transversely and integrally extended from the downward extending arms 45R respectively to define the supporting groove 41R. It is worth mentioning that the electronic components 122R, which may be arranged at different positions of the base bodies 121R of the circuit board 12R, are embedded by the integral bases 11R. When configuring the positions of the electronic components 122R, if the required thickness of the integral base 11R is larger, it is more convenient to form the installing groove 115R. Also, the positions without electronic components 122R may have a relative smaller thickness, so as to reduce the size of the circuit board 12R. In this fourteen embodiment of the present invention, a portion of each of the integral bases 11R corresponding to the two engaging edges 431R is arranged with the electronic components 122R, and this portion of the integral base 11F has a larger transverse width, and the installing groove 115R is formed. And that another portion of the integral base 11F corresponding to the protrusion steps 116R has a smaller transverse width and it is not used for forming the installing groove 115R.

Each of the actuators 60 has at least a part installed at the protrusion steps 116R, so as to form an Auto Focus camera module. Each of the actuators 60 is operatively connected to the circuit board 12R through at least one connecting pin 61. In other embodiments, the lens 30 may have at least a part installed at the protrusion steps 116R, so that a Fix Focus camera module is formed.

More specifically, each of the actuators 60 is installed at the protrusion steps 116R and has two edges which are respectively installed at the protrusion steps 116R which forms the installing groove 115R, and that one remaining edge is installed at the protrusion step 116R which is not used for forming the installing groove 115R while another remaining edge is installed at the extending edge 432R of the respective light filter holder 40R.

Figure 42A:
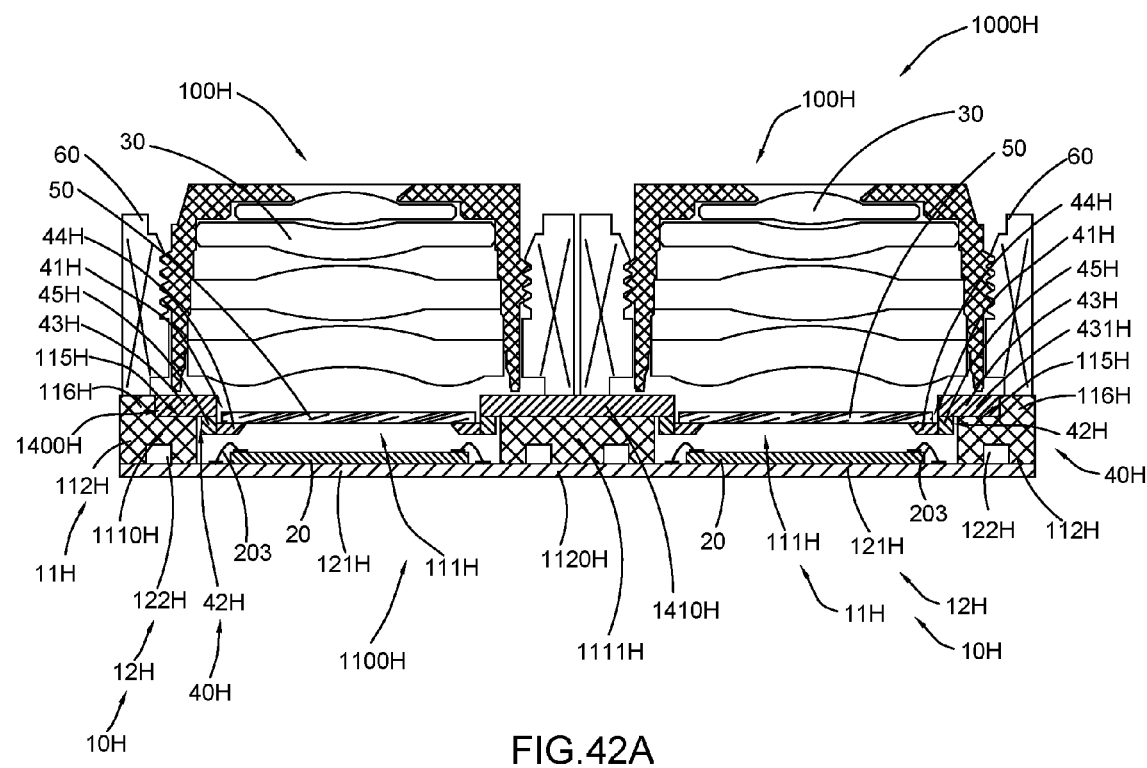
FIG. 42A is a sectional view from one direction illustrating an alternative mode of the array camera module according to the above fourteenth preferred embodiment of the present invention.
Figure 42B:
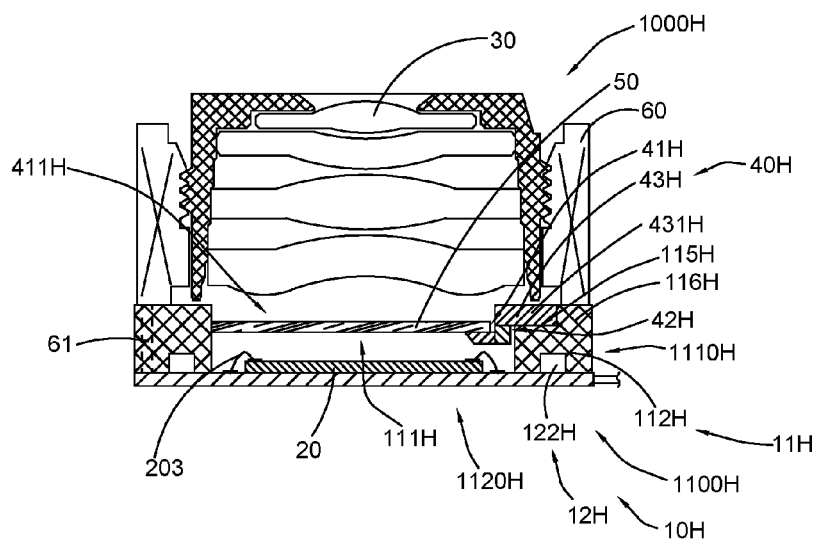
FIG. 42B is another sectional view from another direction illustrating the alternative mode of the array camera module according to the above fourteenth preferred embodiment of the present invention.
Figure 43:
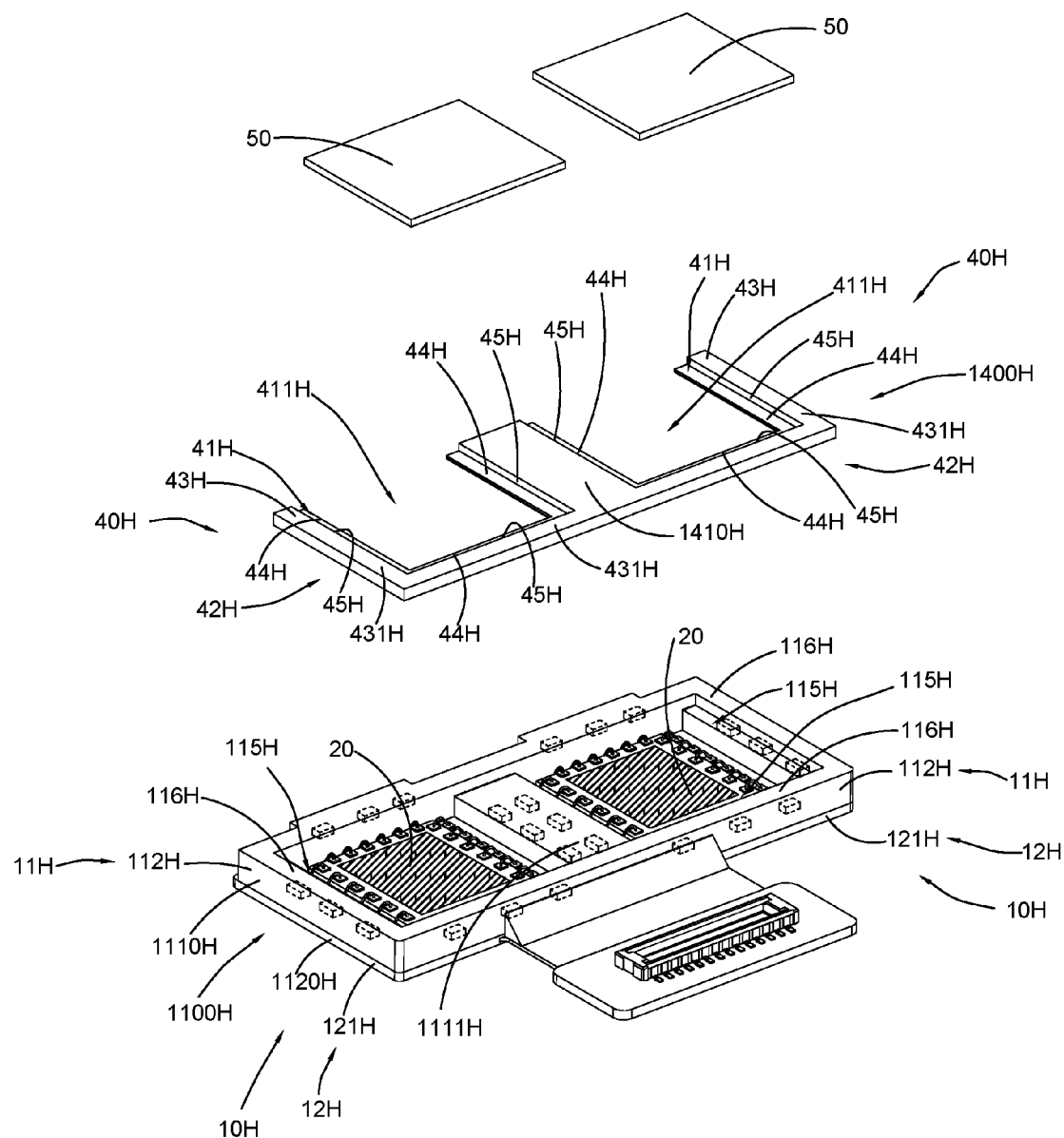
FIG. 43 is an exploded view illustrating the alternative mode of the integral piece of bases and the integral piece of light filter holders of the array camera module according to the above fourteenth preferred embodiment of the present invention.

As shown in FIGS. 42A to 43, an alternative mode of the array camera module according to the fourteenth embodiment of the present invention is illustrated. Each of the integral bases 11H of the joint integral base 1110H of the joint integral base assembly 1100H comprises three protrusion steps 116H which are integrally connected in which two protrusion steps 116H and the corresponding integral base body 112H form an installing groove 115H, while the remaining protrusion step 116H which is integrally and upwardly extended from the base body 112H is not used for forming the installing groove 115H. The two integral bases 11H are not provided with the protrusion steps at the joining portion, and thus a notch 117H is formed thereon. In other words, each of the joint integral bases 1110H has two parallel installing grooves 115H and the notch 117H is formed between the two installing grooves 115H. Accordingly, each of the light filter holders 40H forms a U-shaped structure and the opening of the U-shaped structure is opposite to the protrusion step 116H without forming the installing groove 115H. In other words, the joint light filter holder 1400H has a E-shaped structure when viewed from top, wherein the middle portion of the E-shaped structure is bridged above the integral joint portion 1111H of the joint integral base 1110H.

The light filter holder body 43H of each of the light filter holders 40H comprises at least one engaging edge 431H adapted to sit and mount in the installing groove 115H.

According to this alternative mode of the fourteenth embodiment of the present invention, the light filter holder body 43H of each of the light filter holders 40H comprises three engaging edges 431H integrally and transversely connected with each other, so as to form a U-shaped structure with an opening, so as to match with the shape of the installing groove 115H.

The downward extending arms 45H of each of the light filter holders 43H are respectively longitudinally extended from the engaging edges 431H thereof respectively, so as to engage with the installing groove 115H. The inward extending arms 44H of each of the light filter holders 43H are transversely and integrally extended from the downward extending arms 45H thereof respectively to form the supporting groove 41H, so as to provide the installation site for the respective light filter 50. The difference between this alternative mode and the above fourteen embodiment is that each of the engaging grooves 42H and the supporting grooves 42H is a U-shaped structure, but not a closed structure, with an opening at one side thereof. In other words, when the light filter 50 is installed at the respective light filter holder 40H, only three edges are fixed and supported while the remaining edge is biasing against an inner wall of the protrusion step 116H without forming the installing groove 115H.

It is worth mentioning that the electronic components 122H may be arranged at different positions of the base bodies of the circuit boards 12H of the joint circuit board 1120H and are embedded by the integral bases 11H of the joint integral base 1110H. When configuring the positions of the electronic components 122H, if the required thickness of the integral base 11H is larger, it is convenient to form the installing groove 115H. Also, the positions without electronic components 122H may have a relatively smaller thickness, so as to reduce the size of the circuit boards 12H of the joint circuit board 1120H, and these positions are not used for forming the installing groove 115H. In this alternative mode of the fourteenth embodiment of the present invention, a portion of each of the integral bases 11H corresponding to the three engaging edges 431 H is arranged with the electronic components 122H, and this portion of the respective integral base 11H has a larger transverse width, and the installing groove 115H is formed. And that another portion of each of the integral bases 11H corresponding to the protrusion step 116H without forming the installing groove 115H has a smaller transverse width.

Each of the actuators 60 has at least a part installed at the protrusion steps 116H, so as to form an Auto Focus camera module. Each of the actuators 60 is operatively connected to the respective circuit board 12H through at least one connecting pin 61. In other embodiments, each of the lenses 30 may have at least a part installed at the protrusion steps 116H, so that a Fix Focus camera module is formed.

More specifically, each of the actuators 60 has three edges which are respectively installed at the protrusion steps 116H for forming the installing groove 115H, and the remaining edge is installed at the protrusion step 116H without forming the installing groove 115H.

In other words, differing from the above preferred embodiments, each of the light filter holders 40H of this alternative mode is not provided with the engaging edge but forms an open U-shaped structure, and the protrusion steps 116H of the respective integral base 11H are upwardly extended to form a closed U-shaped structure while no notch is formed.

Figure 44A:
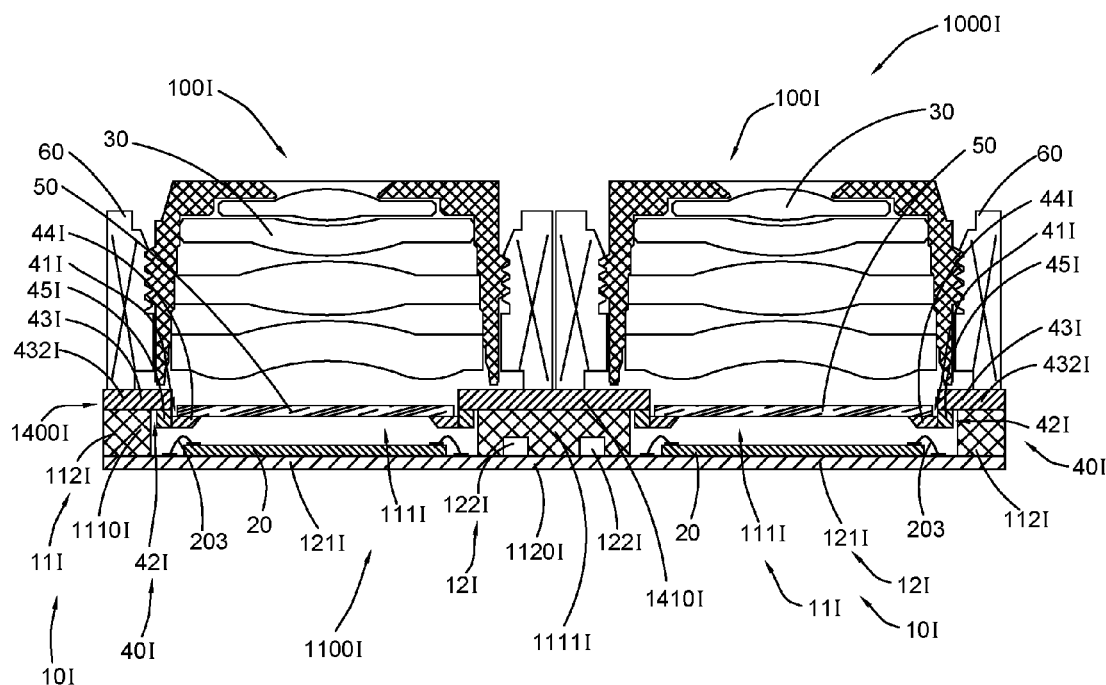
FIG. 44A is a sectional view from one direction illustrating an array camera module according to a fifteenth preferred embodiment of the present invention.
Figure 44B:
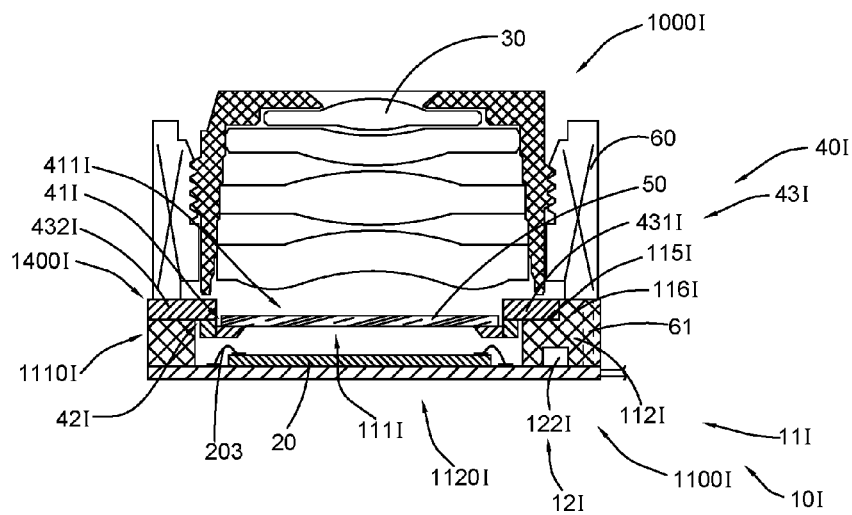
FIG. 44B is another sectional view from another direction illustrating the array camera module according to the fifteenth preferred embodiment of the present invention.
Figure 45:
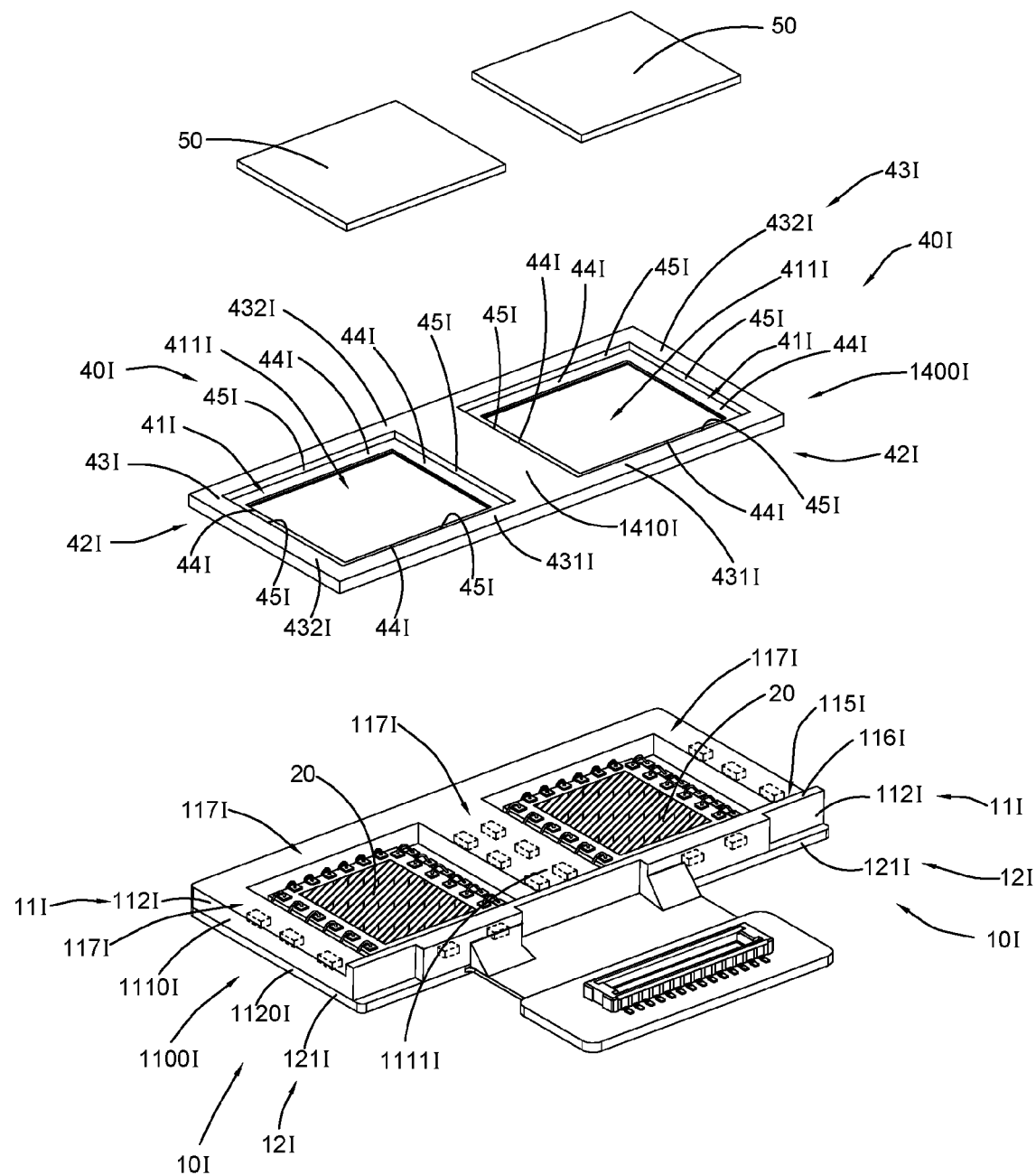
FIG. 45 is an exploded view illustrating the integral piece of bases and the integral piece of light filter holders of the array camera module according to the above fifteenth preferred embodiment of the present invention.

Referring to FIGS. 44A, 44B and 45, an array camera module according to a fifteenth preferred embodiment of the present invention is illustrated.

The difference between this fifteenth embodiment and the above preferred embodiments is that, each of the integral bases 11I of the joint integral base 1110I comprises one protrusion step 116I and has three notches 117I, wherein the protrusion step 116I is integrally and partially extended from the integral base to form the installing groove 115I. In other words, the three sides of the respective integral base 11I without forming the protrusion steps 116I are formed with the notches 117I.

The light filter holder body 43I of each of the light filter holders 40I comprises at least one engaging edge 431I adapted to sit and mount in the installing groove 115I and at least one extending edge 432I adapted to insert and fill in the notch 117I. In other words, the extending edge 432I is extended into the notch 117I to fittingly fill the notch 117I, so that a sealed and enclosed inner environment is formed.

According to this fifteenth embodiment of the present invention, the light filter holder body 43I of each of the light filter holders 40I comprises one engaging edges 43I and three extending edge 432I which are integrally and transversely connected to match the shape of the installing groove 115I. It is worth mentioning that in this array camera module 1000I, the two adjacent extending edges 432I of the two light filter holders 40I of the joint light filter holder 1400I are integrally connected to form an integral piece functioned as a combined portion, the bridge portion 1310I, of the two camera module units 100I.

The downward extending arms 45I of each of the light filter holders 43I are respectively longitudinally extended from the engaging edge 431I and the extending edges 432I thereof, so as to form the engaging groove 42I. The inward extending arms 44I of each of the light filter holders 43I are transversely and integrally extended from the downward extending arms 45I respectively to form the supporting groove 41I.

Furthermore, the two protrusion steps 116I of the two integral bases 11I of the joint integral base 1110I are integrally extended to form a linear groove structure. The notches are adjacent to each other to form an E-shaped structure. Accordingly, the extending edges 432I of each of light filter holders 40I form a U-shaped structure and the engaging edge 431I is provided at the opening of the U-shaped structure. In the joint light filter holder 1400I, two adjacent extending edges 432I are integrally combined to form the bridge portion 1410I for fitting the integral portion 1111I of the integral piece of bases 1110I to sit and mount thereon.

According to an alternative mode, two engaging edges 43I can be jointed with each other and two notches 117I are adjacent to each other. In other words, the two protrusion steps 116I from an L-shaped structure, so as to form an L-shaped installing groove 115I. The two notches 117I are adjacent to each other to form an L-shaped structure. Accordingly, the two engaging edges 431I of the light filter holder 40I are adjacent to each other, so as to match with the L-shaped installing groove 115I, and that the two extending edges 432I are adjacent to each other, so as to be filled in the notches 117I to form a sealed and closed inner environment. Each of the actuators 60 has at least a part installed at the protrusion steps 116I, so as to form an Auto Focus camera module. Each of the actuators 60 is operatively connected to the circuit board 121 through at least one connecting pin 61. In other embodiments, each of the lenses 30 may have at least a part installed at the protrusion steps 116I and/or the respective light filter holder body 43I, so that a Fix Focus camera module is formed. More specifically, each of the actuators 60 has two edges respectively installed at the protrusion steps 116I, and the remaining edges are installed at the extending edges 432I of the light filter holder 40I respectively.

Figure 46A:
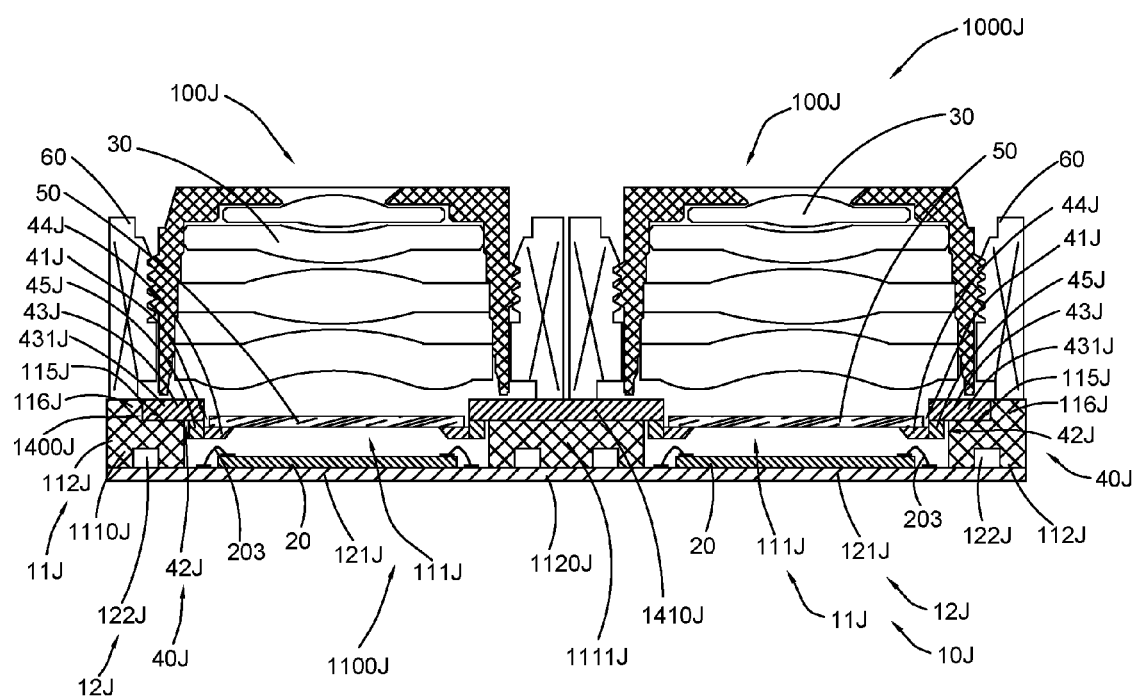
FIG. 46A is a sectional view from one direction illustrating an alternative mode of the array camera module according to the above fifteenth preferred embodiment of the present invention.
Figure 46B:
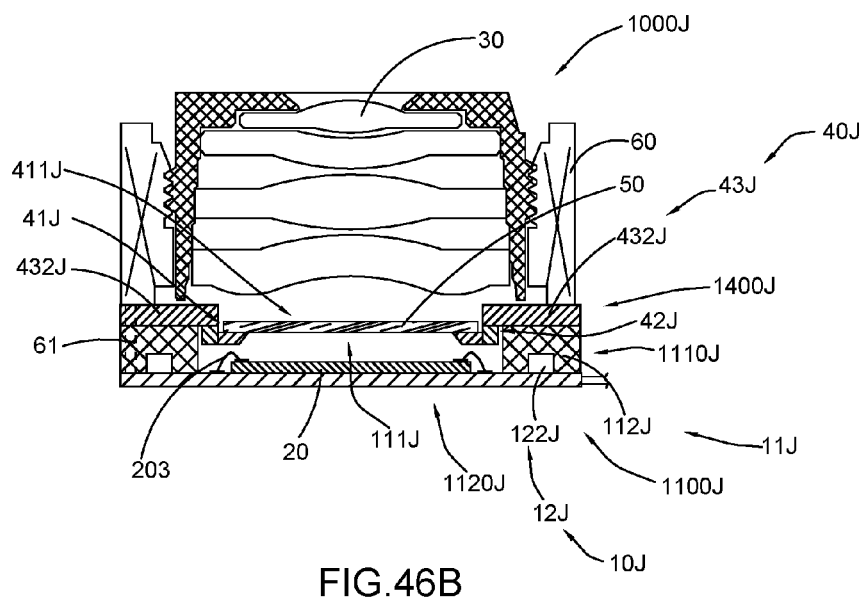
FIG. 46B is another sectional view from another direction illustrating the alternative mode of the array camera module according to the above fifteenth preferred embodiment of the present invention.
Figure 47:
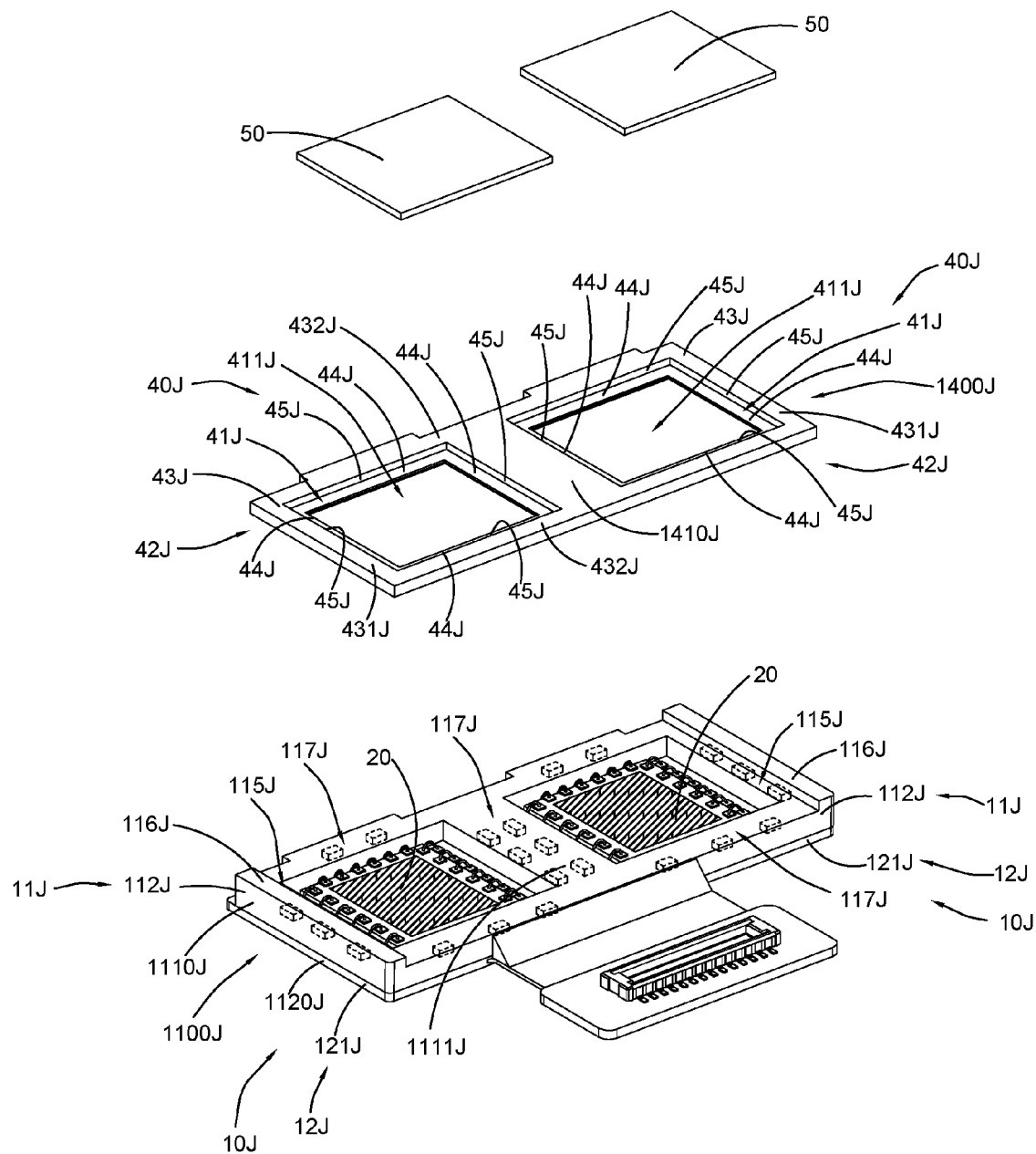
FIG. 47 is an exploded view illustrating the alternative mode of the integral piece of bases and the integral piece of light filter holders of the array camera module according to the above fifteenth preferred embodiment of the present invention.

As shown in FIGS. 46A and 47, an alternative mode of the array camera module according to a fifteenth preferred embodiment of the present invention is illustrated, wherein the positions of the protrusion steps 116J are different from the above embodiments. Accordingly, in the joint integral base 1110J of the array camera module 1000J, the two protrusion steps 11J of the two integral bases 11J are provided at two opposing outer sides of the two integral bases 11J respectively in a parallel manner so as to form the installing groove 115J on top of the two integral base bodies 111J. In other words, each of the two opposite sides of the two integral bases 11J is formed with a portion of the installing groove 115J. In comparison with the above embodiments, the two protrusion steps 116J of the joint integral base 1110J are changed to a parallel configuration, rather than the linear configuration.

Figure 48A:
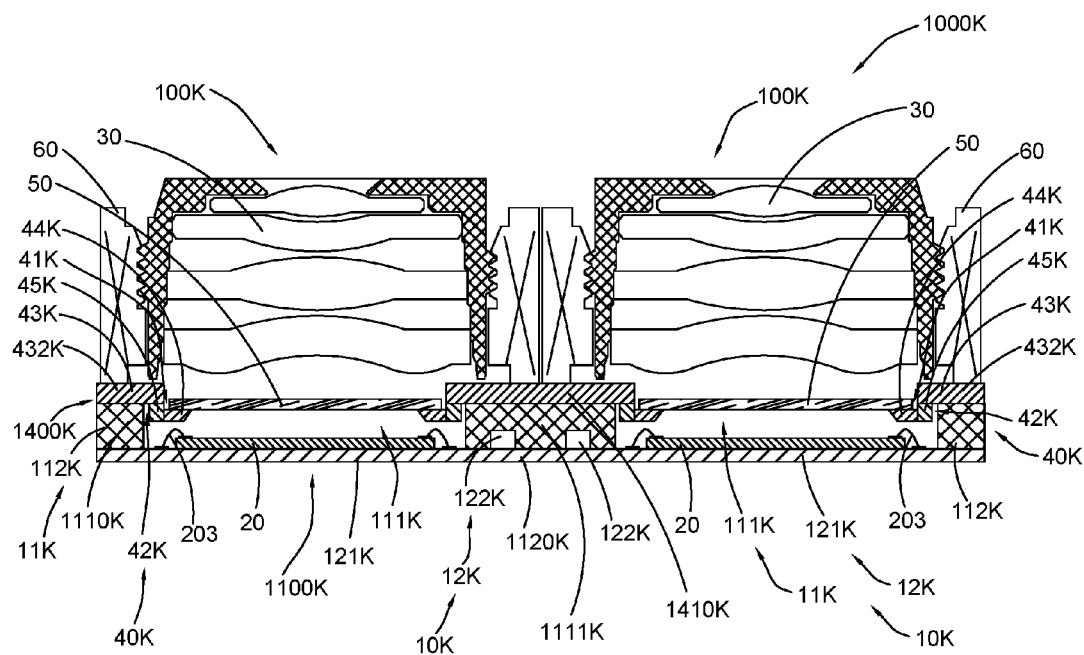
FIG. 48A is a sectional view from one direction illustrating an array camera module according to a sixteenth preferred embodiment of the present invention.
Figure 48B:
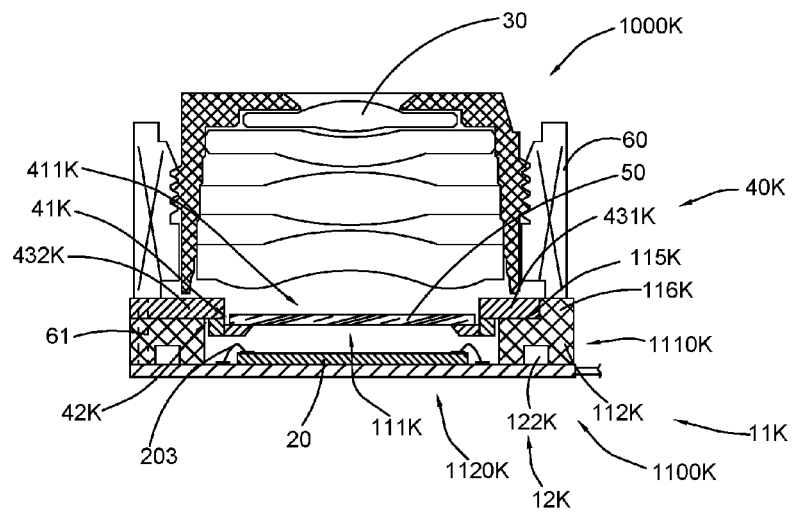
FIG. 48B is another sectional view from another direction illustrating the array camera module according to the sixteenth preferred embodiment of the present invention.
Figure 49:
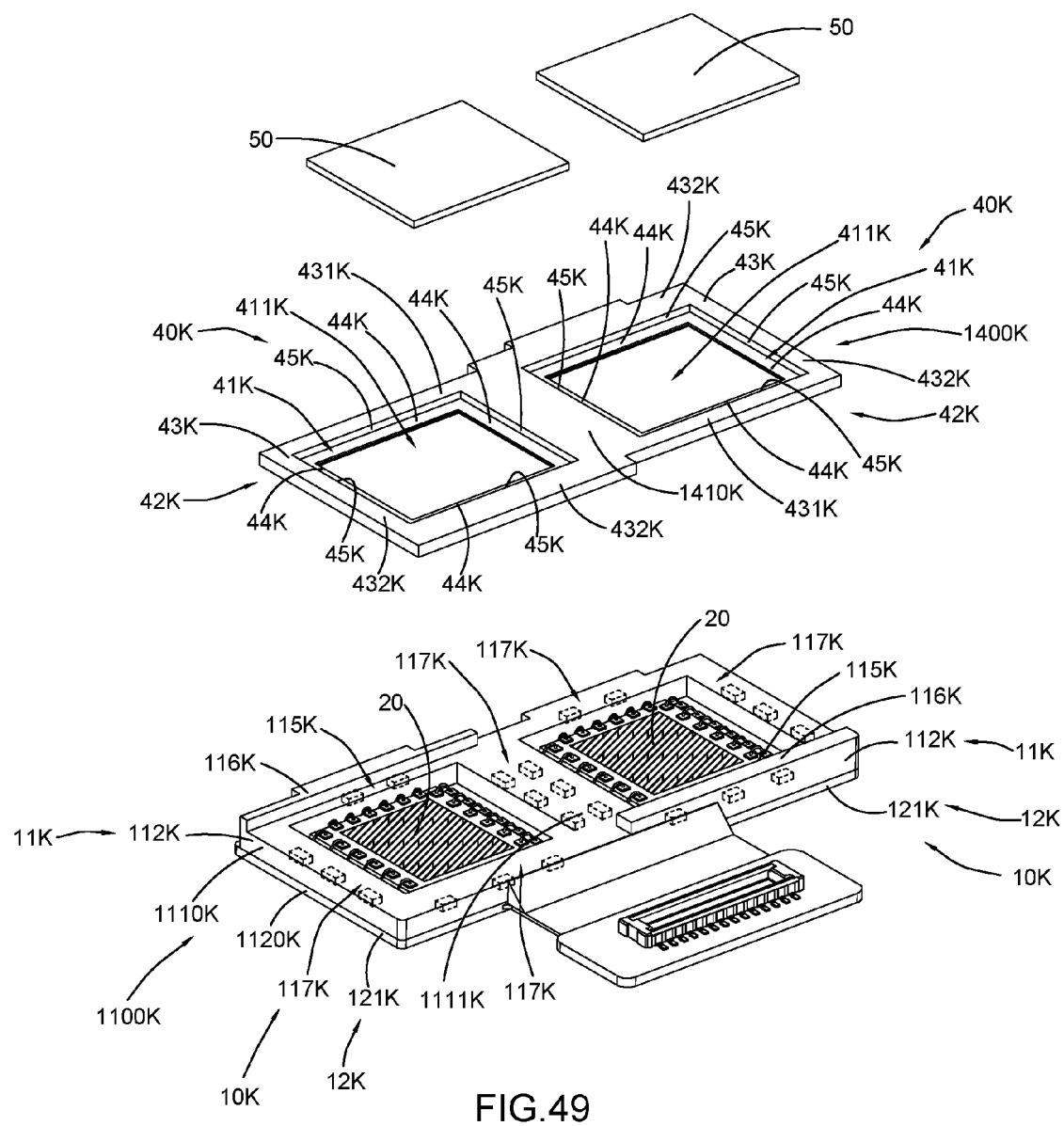
FIG. 49 is an exploded view illustrating the integral piece of bases and the integral piece of light filter holders of the array camera module according to the above sixteenth preferred embodiment of the present invention.

Referring to FIGS. 48A, 48B and 49, an array camera module according to a sixteenth preferred embodiment of the present invention is illustrated. The difference between this sixteenth embodiment and the above embodiments is that, each of the integral bases 11K of the joint integral base 1110K comprises one protrusion step 116K and has three notches 117K. The protrusion step 116K is partially, integrally and upwardly extended from the respective integral base body 112K to form the installing groove 115K. In other words, the three sides without forming with the protrusion step are formed with the three notches 117K respectively.

The light filter holder body 43K of each of the light filter holders 40K comprises at least one engaging edge 431K adapted to sit and mount in the installing groove 115I and at least one extending edge 432K adapted to insert and fill in the notch 117K. In other words, the extending edge 432K is downwardly extended into the notch 117K to fittingly fill the notch 117K, so that a sealed and enclosed inner environment is formed.

According to this sixteenth embodiment of the present invention, the light filter holder body 43K of each of the light filter holders 40K comprises one engaging edge 43K and three extending edges 432K which are integrally and transversely connected to match and fit with the shape of the installing groove 115K formed by the notches 117K. Two adjacent extending edges are integrally connected to form the bridge portion 1410K of the joint light filter holder 1400K which is bridged to fittingly mount on the integral joint portion 1111K of the joint integral base 1110K.

The downward extending arms 45K of each of the light filter holders 40K are respectively longitudinally extended from the engaging edge 431K and the extending edges 432K thereof respectively, so as to form the engaging groove 42K. The inward extending arms 44K of each of the light filter holders 40K are transversely and integrally extended from the downward extending arms 45K thereof respectively to form the supporting groove 41K.

Each of the actuators 60 has at least a part s installed at the protrusion step 116K, so as to form an Auto Focus camera module. Each of actuators 60 is operatively connected to the respective circuit board 12K through at least one connecting pin 61. In other embodiments, each of the lenses 30 may have at least a part installed at the protrusion step 116K, so that a Fix Focus camera module is formed.

More specifically, each of the actuators 60 has one side supported at the protrusion step 116K, while the other three sides are installed at the extending edges 432K of the light filter holder 40K respectively.

It is worth mentioning that according to this sixteenth embodiment of the present invention, the two protrusion steps 116K of the two integral bases 11K of the joint integral base 1110K are parallel with each other, so as to provide the installation site of the joint light filter holder 1400K. However, in other embodiments of the present invention, the relative positions of the protrusion steps 116K can be arranged in other configurations, such as being arranged in parallel or vertical directions. The person of ordinary skilled in the art should understand that the configuration of each two protrusion steps 116K is not limited in the present invention.

Figure 50A:
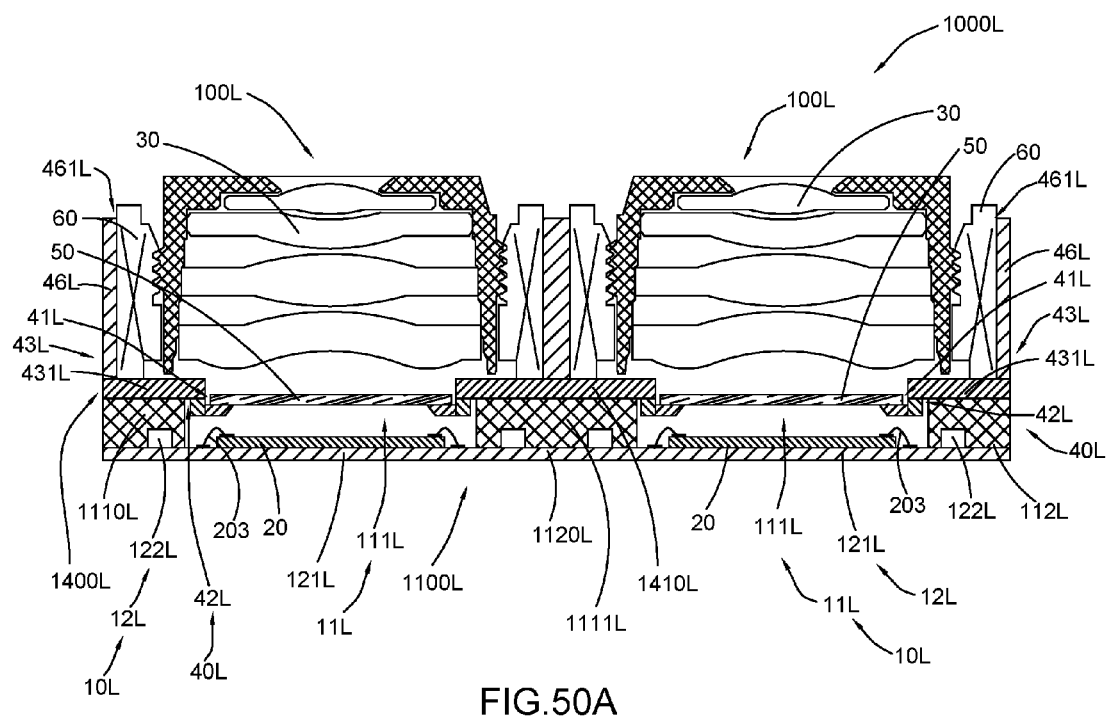
FIG. 50A is a sectional view from one direction illustrating an array camera module according to a seventeenth preferred embodiment of the present invention.
Figure 50B:
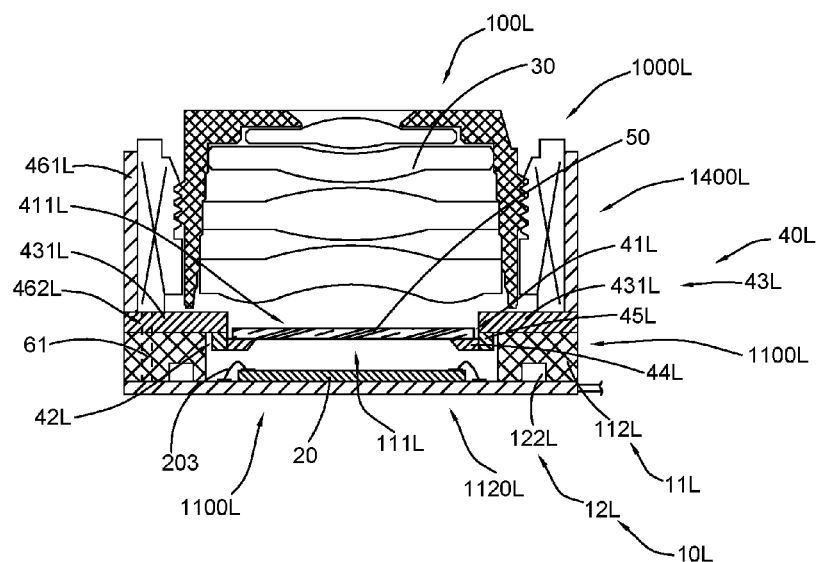
FIG. 50B is another sectional view from another direction illustrating the array camera module according to the seventeenth preferred embodiment of the present invention.
Figure 51:
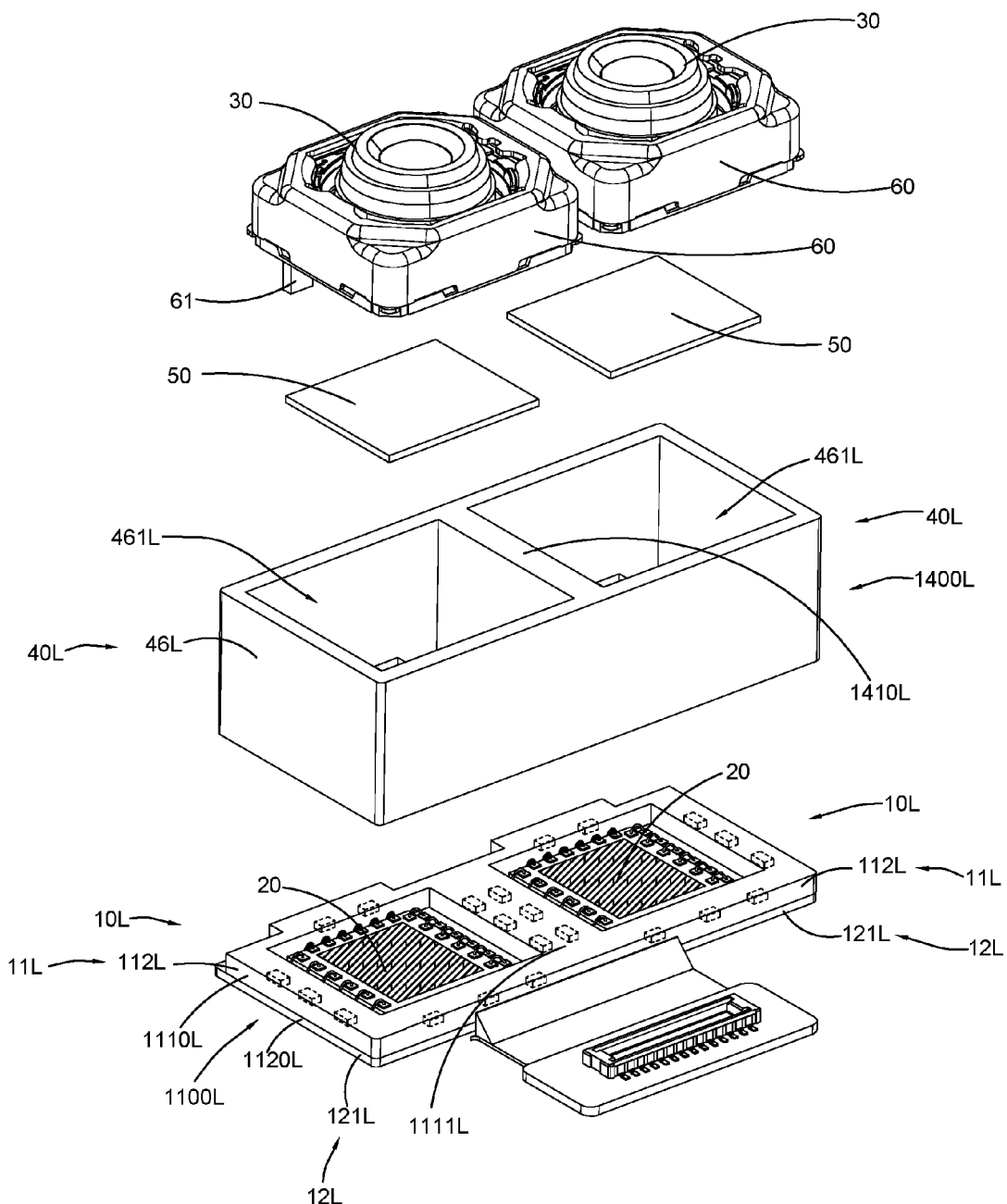
FIG. 51 is an exploded view illustrating the array camera module according to the above seventeenth preferred embodiment of the present invention.

As shown in FIGS. 50A to 51, an array camera module according to a seventeenth preferred embodiment of the present invention is illustrated. The difference between this seventeenth embodiment and the above embodiments is that, each of the light filter holders 40L of the joint light filter holder 1400L comprises an upward extending surrounding wall 46L upwardly extended from the light filter holder body 43L defining a retaining chamber 461L therein for retaining an installing component, for example, but not limiting, the lens and/or the actuator 60. In other words, when assembling the array camera module 1000L, the lens 30 and/or the actuator 60 is installed and retained in the retaining chamber 461L of the respective light filter holder 40L, while the light axis of the actuator 60 and/or lens 30 is coaxially aligned with the light axis of the photosensitive element 20 provided on the respective circuit board 12L. The size of the retaining chamber 461L is determined by the size of the installing component to be installed.

In other words, each of the upward extending surrounding wall 46L performs a frame retaining function that, when the lens 30 and/or the actuator 60 is installed inside the retaining chamber 461L of the respective light filter holder 40, excessive deviation is prevented so as to ensure the consistence of the optical system of the respective camera module unit 100L. At the same time, the upward extending surrounding wall 46L also can protect the installing component such as the actuator 60 and/or the lens 30, so as to avoid unwanted impacts while ensuring the lens 30 and/or the actuator 60 be stably installed and blocking any dust outside from entering the interior space of the respective camera module unit 100L. As shown in FIG. 51, the two upward extending surrounding walls 46L of the two camera module units 100L of the array camera module 1000L can be integrally constructed to form a single body having the two retaining chambers 461L formed in a side by side manner to respectively mount on the two integral bases 11L of the joint integral base 1110L such that the two lenses 30 received in the two retaining chambers 461L respectively are aligned along the light paths of the two photosensitive elements 20 provided on the two circuit boards 12L of the joint circuit board 1120L respectively.

Furthermore, when the camera module unit 100L is an Auto Focus camera module, each of the light filter holders 40L has at least one pin opening 462L for the connecting pin 61 to penetrate therethrough for electrically connecting the installing component, such as the actuator 60, to the respective circuit board 12L. In other words, when the actuator 60 is installed at the retaining chamber 461L of the respective light filter holder 40L, the connecting pin 61 of the actuator 60 penetrates the corresponding pin openings 462L and is connected to the circuit board 12L. Of course, when the camera module is a Fix Focus camera module, the light filter holder 40L has no need to provide such pin opening 462L.

It is worth mentioning that the pin opening 462L may not been seen in a sectional view along a central line, but in order for easy comprehension and description, dotted lines are used for illustrating the possible position of the pin opening 462L. However, it is not intended to imply that the actual positions of the pin opening 462L and the connecting pin 61 should be limited to the positions as shown in the drawings.

It is worth mentioning that each of the lenses 30 and/or the actuators 60 of the array camera module 1000L is retained within the respective surrounding wall 46L so as to ensure the consistence of the light axis of the each of two camera module units 100L, and the two camera module units 100L are also controlled in accordance with each other.

Figure 52:
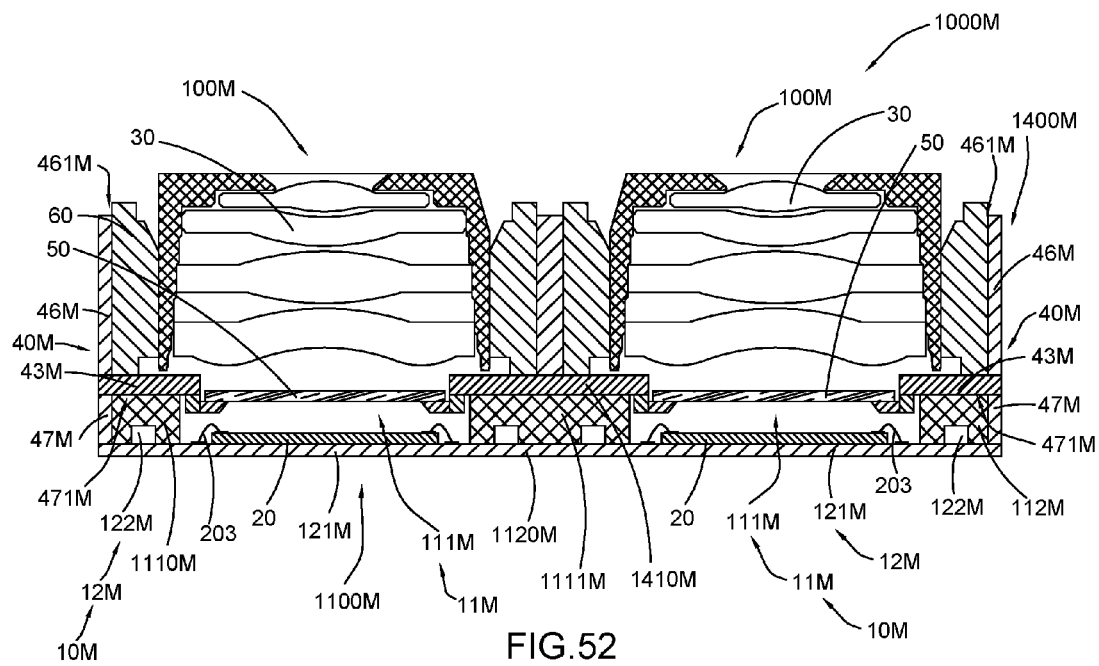
FIG. 52 is a sectional view of an array camera module according to an eighteenth preferred embodiment of the present invention.

Referring to FIG. 52, an array camera module according to an eighteenth preferred embodiment of the present invention is illustrated. The difference between this eighteenth embodiment and the above embodiments is that each of the light filter holders 40M of the joint light filter holder 1400M comprises an upward extending surrounding wall 46M upwardly and integrally extended from the top of the respective light filter holder body 43M to form a retaining chamber 461M therein, and a downward extending surrounding wall 47M downwardly and integrally extended from the bottom of the respective light filter holder body 43M to form a lower housing chamber 471M. Particularly, the base surrounding wall 47M can be integrally and downwardly extended from the upward extending surrounding wall 46M to form an integral outer blocking wall.

The retaining chambers 461M are used for retaining the installing components, such as but not limiting the lenses 30 and/or the actuators 60. Correspondingly, the downward extending surrounding walls 47M are used for receiving the two integral bases 11M respectively. In other words, when assembling the camera module, the lenses 30 and/or the actuators 60 are installed in the retaining chambers 461M of the light filter holders 40M respectively, so as to retain and protect the lenses 30 and the actuators 60 in position, and the light axis of each of the lenses 30 is coaxially aligned with the light axis of the respective photosensitive element 20. Each of the integral bases 11M is received in the respective lower housing chamber 471M while the downward extending surrounding wall 47M surrounds and protects the respective integral base 11M, so that a regular integral structure of the array camera module is achieved, and thus it is easy to assemble and an aesthetic appearance is enhanced. The sizes of the retaining chamber 461M and the lower housing chamber 471M can be determined by the size of the installing components to be installed, such as the actuator 60, the lens 30 and the integral base 11M.

In one embodiment, the downward extending surrounding wall 47M can be extended to surround and protects the sides of the circuit board 12M too. For example, but not limiting, the downward extending surrounding wall 47M is adhered to the side edges of the circuit board 12M by adhering glue, so that the light filter holder 40M can be more stably installed.

Figure 53:
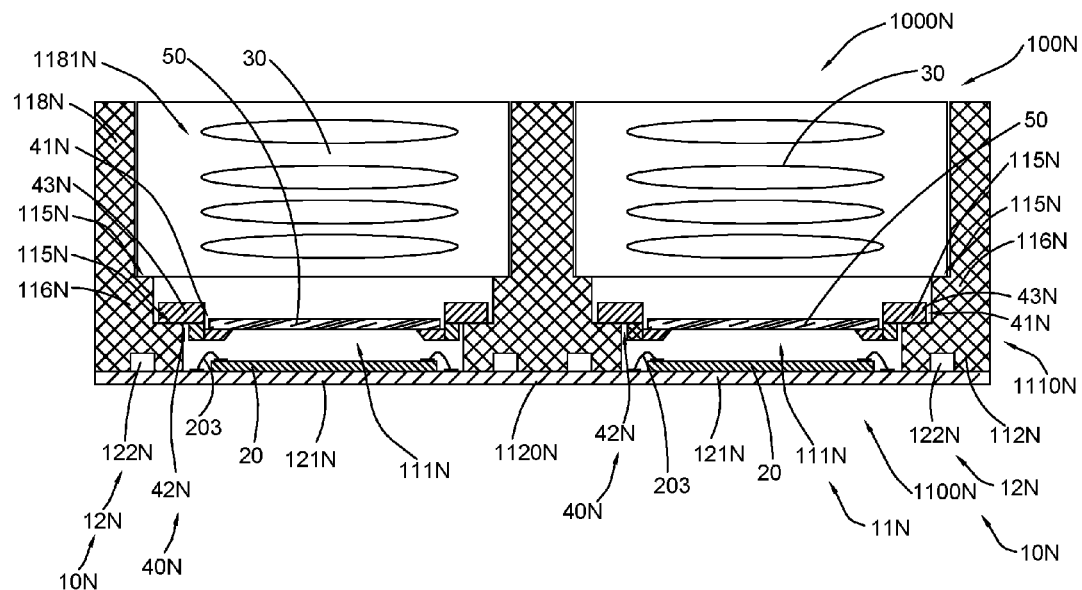
FIG. 53 is a sectional view of an array camera module according to a nineteenth preferred embodiment of the present invention.

Referring to FIG. 53, an array camera module according to a nineteenth preferred embodiment of the present invention is illustrated.

Each of the integral bases 11N comprises a lens barrel 118N which is at least partially and upwardly extended form the protrusion steps 116N to define a lens cavity 1181N for installing the lens 30, so as to form a Fix Focus camera module.

More specifically, the protrusion steps 116N and the base body 112N form the installing groove 11N for installing the respective light filter holder 40N. The lens barrel 118N and the protrusion steps 116N form another installing groove 115N for installing the lens 30. In other words, in this nineteenth embodiment, each of the integral bases 11N has two installing grooves 115N, one of which is used for installing the respective light filter holder 40N, and the other of which is used for installing the respective lens 30.

Furthermore, the engaging groove 42N of each of the light filter holders 40N is coupled with the installing groove 115N, and the light filter 50 is installed in the supporting groove 41N of the respective light filter holder 40N. The lens 30 is installed in the other installing groove 115N.

The lens barrel 118N is used for providing an installation site for the lens 30 to retain the lens 30 in position, so that the light axis of the lens 30 is coaxially aligned with the light axis of the photosensitive element 20, and thus the installing accuracy thereof is enhanced.

Figure 54A:
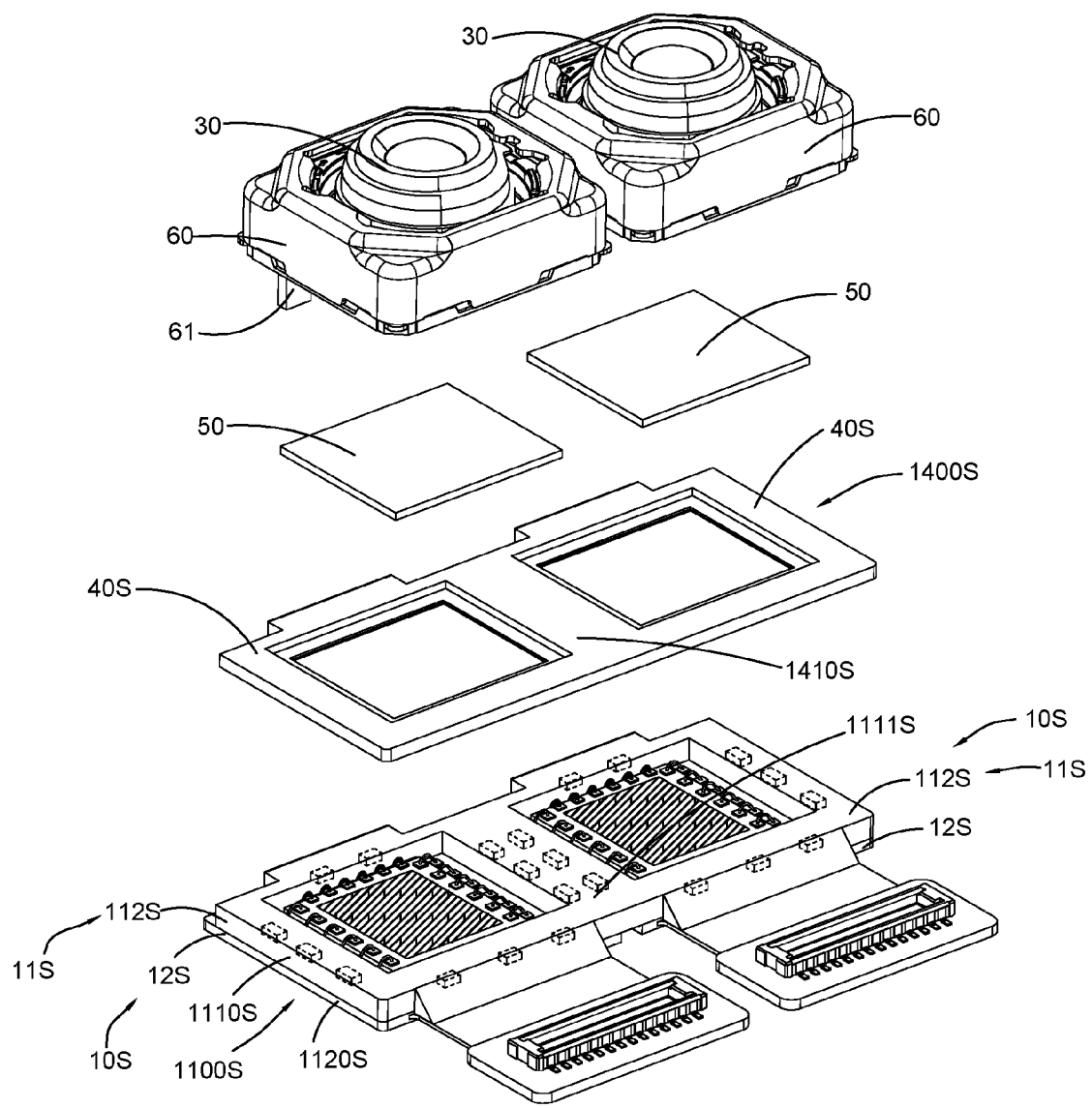
FIG. 54A is a sectional view of an array camera module according to a twentieth preferred embodiment of the present invention.

FIG. 54A is an exploded view of an array camera module according to a twentieth preferred embodiment of the present invention. The array camera module 1000S comprises two camera module units 1005 each comprising an integral base assembly 10S which comprises a circuit board 12S, an integral base 11S and a light filter holder 40S. The difference between this twentieth embodiment and the above embodiment is that, the two circuit boards 12S of the two camera module units 100S are not integrally formed, but are connected to each other, and the two integral bases 11S are integrally formed to form a joint integral base 1110S such that the two integral bases 11S sit and attach on the two circuit boards 12S respectively. According to another embodiment, the two circuit boards 12S are not connecting with each other and have a gap therebetween, i.e. the two circuit boards 12S are independent with each other.

Figure 54B:
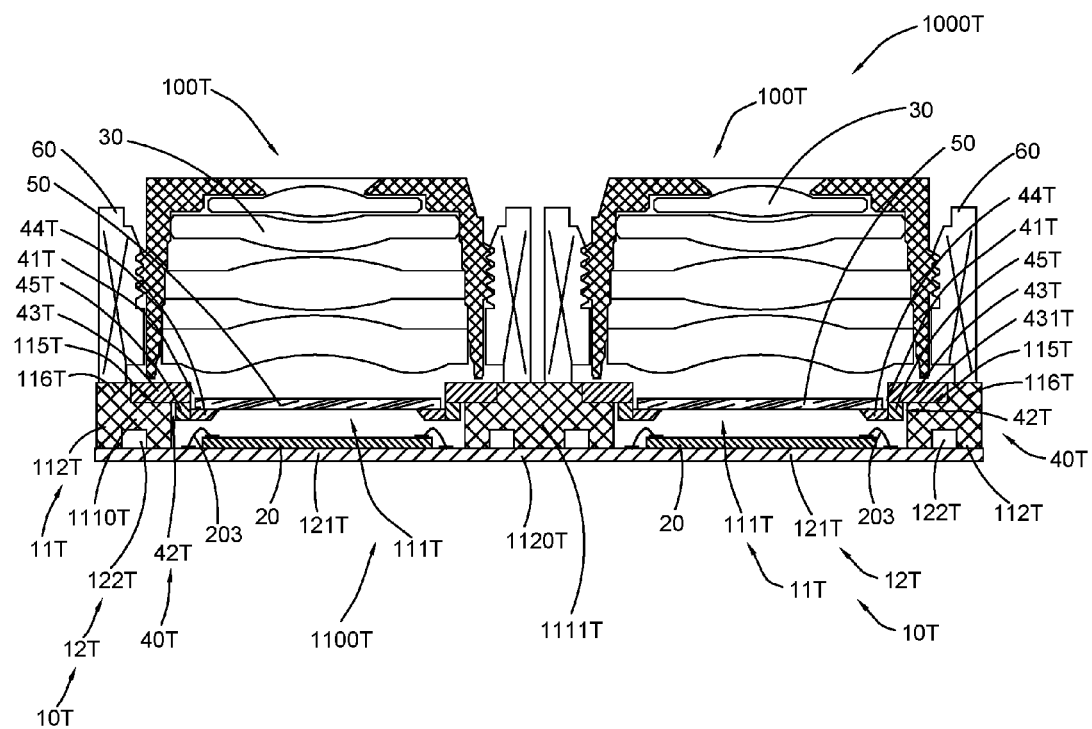
FIG. 54B is a sectional view of an array camera module according to a twenty first preferred embodiment of the present invention

FIG. 54B is a sectional view of an array camera module according to a twenty first preferred embodiment of the present invention. The array camera module 1000T comprises two camera module units 100T. The array camera module 1000T comprises a joint circuit board 1120T providing two circuit boards 12T, a joint integral base 1110T providing two integral bases 11T integrally packaged to the joint circuit board 1120T and defining two light windows 111T for providing two light passages for the two lenses 30 and the two photosensitive elements 20 provided on the two circuit boards 12T of the joint circuit board 1120T respectively. Two installing grooves 115T are formed at a top side of the joint integral base 1110T for respectively installing two independent light filter holders 40T for supporting two light filters 50 respectively. It is appreciated that in other embodiments, the top side of the joint integral base 1110T may not be formed with the installing groove 115T, but is formed with a flat surface for installing the two light filter holders 40T. It is worth mentioning that each of the light filter holders 40T can be constructed to have any features identified in the above embodiments.

It is worth mentioning that a dual camera module comprising two camera module units 100 is taken as an example for illustrating the array camera module in the above embodiments. However, in other embodiments, the array camera module 1000 may comprise more camera module units 100. In the above embodiments, features of the camera module units may be symmetrically arranged to form the array camera module 1000. However, in other embodiments, each camera module unit 100 may have various combined features, and an array camera module 1000 with unsymmetrical configuration can be provided, the present invention is not limited in this aspect.

Figure 55:
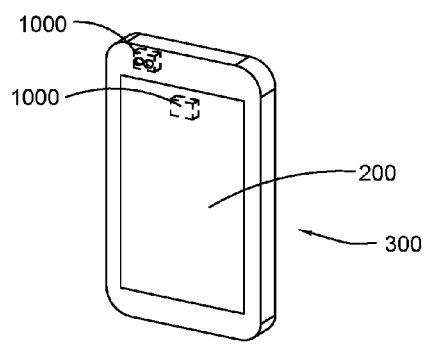
FIG. 55 is a schematic view illustrating an application of the array camera module according to the above preferred embodiments of the present invention.

FIG. 55 illustrates an application of multiple array camera modules according to the above embodiments. The array camera module 1000 can be equipped in an electronic device body 200 to form an electronic device 300 with the array camera module 1000.

As shown in FIG. 55, the array camera module is equipped in a smart phone to implement image acquisition and image reproduction. In other embodiments, the array camera module 1000 can be provided at other electronic device bodies to form different electronic devices 300 which can be but not limited to a smart phone, a wearable device, a computer device, a television, a transporting device, a digital camera and a monitoring device.

It is worth mentioning that the light filter holder is complemented into the camera module based on the integral packaging process for cooperating with the integral base to overtake the function of the conventional holder, so that when utilizing the advantages of the integral packaging process, the light filter holder can overcome and compensate the disadvantages of the integral packaging process. On the other hand, the light filter holder can be integrally formed such as being formed by injection molding, so that a good flatness can be provided. And preferably, the characteristic of the material of the light filter holder can be utilized to reduce a reflectivity of incident light beams. In addition, in view of the above embodiments, for matching with the shape of the integral base, the light filter holder can be configured in various alternative modes, and they are also easy in constructing and convenient in manufacturing. More preferably, when appropriate plastic material is used, no etching process is required and no blackening and abrading treatment is needed, wherein the light filer holder will be able to reduce the reflectivity of the incident light beams so as to avoid stray lights.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
    at least a photosensitive element having a top surface defining a photosensitive area having a photosensitive path and a non-photosensitive area positioned around said photosensitive area;
    at least an integral base assembly, which comprises at least an integral base and at least a circuit board, wherein said integral base has at least a light window and comprises a base body defining said light window therein to provide a light passage for said photosensitive element, wherein said circuit board comprises a base board electrically connected with said non-photosensitive area of said photosensitive element installed therewith while said photosensitive area of said photosensitive element is positioned within said light window and facing said light passage, wherein said circuit board further comprises one or more electronic components provided on said base board, wherein said base body of said integral base is molded to be integrally packaged with said circuit board with said electronic components being embedded therein, wherein said light window is defined by an inner surrounding wall of said base body and has a size larger than said photosensitive area of said photosensitive element;
    at least a light filter having a size smaller than said size of said light window of said integral base;
    at least a light filter holder installed on said integral base assembly, wherein said light filter holder, which is made of a material more flexible than said integral base of said integral base assembly, has a top side, a bottom side installed with said integral base, and at least a supporting groove which is provided in said top side and has a receiving opening for receiving said light filter, wherein at least one outer engaging groove is provided in said bottom side of said light filter holder for installing with said integral base, wherein said outer engaging groove is arranged along a bottom periphery of said light filter holder, wherein said supporting groove forms an inner enclosing space for installing said light filter within said light filter holder in said photosensitive path of said photosensitive element and said outer engaging groove forms an outer surrounding space for engaging with said integral base, wherein said light filter holder further comprises a light filter holder body having said receiving opening defined therein, at least one inward extending arm, and at least one downward extending arm which is extended downwardly from at least a portion of an inner side of said light filter holder body surrounding and defining said receiving opening and said outer engaging groove at said bottom side of said light filter holder to engage with said integral base, wherein said inward extending arm is extended inwardly from said downward extending arm to define said supporting groove above said inward extending arm to form an installing position surrounding by said downward extending arm for supporting said light filter within said light window and defines a light filter window positioning in said light window of said integral base and having a size at least equal to or less than said photosensitive area of said photosensitive element, so that said inward extending arm not only provides a peripheral support to said light filter, but also enables said size of said light filter to be minimized; and
    at least a lens installed on said top side of said light filter holder such that said light filter holder is positioned between said lens and said integral base assembly and supports said lens in position while said lens is optically coupled with said photosensitive element in such a manner that said lens and said light filter are positioned in said photosensitive path of said photosensitive element, so that a light beam passing through said lens and reaching said photosensitive element via said light window and said light filter undergoes a light conversion by said photosensitive element that electrical signals are transmitted to said circuit board so that said camera module is able to capture image information.

2. The camera module, as recited in claim 1, wherein said downward extending arm is longitudinally extended from said light filter holder body and said inward extending arm is transversely extended from said downward extending arm for providing said installing position to install said light filter, such that a light path of said light filter and said photosensitive path of said photosensitive element are coaxially arranged.

3. The camera module, as recited in claim 1, wherein said light filter holder has an outer peripheral edge extended outwardly to be supported on top of said base body of said integral base and an inner peripheral edge extended inwardly from said inner surrounding wall of said base body of said integral base to form said supporting groove, so that said receiving opening has a size smaller than said light window, wherein said light filter is supported in said supporting groove of said light filter holder and arranged along said photosensitive path of said photosensitive element so as to minimize said size of said light filter, while said flexible material made light filter holder provides a better support to said light filter than said integral base.

4. The camera module, as recited in claim 2, wherein said light filter holder has an outer peripheral edge extended outwardly to be supported on top of said base body of said integral base and an inner peripheral edge extended inwardly from said inner surrounding wall of said base body of said integral base to form said supporting groove, so that said receiving opening has a size smaller than said light window, wherein said light filter is supported in said supporting groove of said light filter holder and arranged along said photosensitive path of said photosensitive element so as to minimize said size of said light filter, while said flexible material made light filter holder provides a better support to said light filter than said integral base.

5. The camera module, as recited in claim 1, wherein said supporting groove is an indented groove having a supporting bottom surrounding said receiving opening below said top side of said light filter holder, wherein said light filter installed in said supporting groove is positioned within said light window and a bottom side of said light filter is positioned below said top side of said light filter holder so as to reduce a total height of said light filter holder and said integral base.

6. The camera module, as recited in claim 2, wherein said supporting groove is an indented groove having a supporting bottom surrounding said receiving opening below said top side of said light filter holder, wherein said light filter installed in said supporting groove is positioned within said light window and a bottom side of said light filter is positioned below said top side of said light filter holder so as to reduce a total height of said light filter holder and said integral base.

7. The camera module, as recited in claim 3, wherein said supporting groove is an indented groove having a supporting bottom surrounding said receiving opening below said top side of said light filter holder, wherein said light filter installed in said supporting groove is positioned within said light window and a bottom side of said light filter is positioned below said top side of said light filter holder so as to reduce a total height of said light filter holder and said integral base.

8. The camera module, as recited in claim 4, wherein said supporting groove is an indented groove having a supporting bottom surrounding said receiving opening below said top side of said light filter holder, wherein said light filter installed in said supporting groove is positioned within said light window and a bottom side of said light filter is positioned below said top side of said light filter holder so as to reduce a total height of said light filter holder and said integral base.

9. The camera module, as recited in claim 1, wherein a top side of said light filter installed in said supporting groove is positioned at the same level of or lower than said top side of said light filter holder.

10. The camera module, as recited in claim 2, wherein a top side of said light filter installed in said supporting groove is positioned at the same level of or lower than said top side of said light filter holder.

11. The camera module, as recited in claim 4, wherein a top side of said light filter installed in said supporting groove is positioned at the same level of or lower than said top side of said light filter holder.

12. The camera module, as recited in claim 8, wherein a top side of said light filter installed in said supporting groove is positioned at the same level of or lower than said top side of said light filter holder.

13. The camera module, as recited in claim 1, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

14. The camera module, as recited in claim 3, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

15. The camera module, as recited in claim 4, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

16. The camera module, as recited in claim 8, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

17. The camera module, as recited in claim 9, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

18. The camera module, as recited in claim 12, wherein an inner end of said inward extending arm of said light filter holder has an inclined cross section defining a taper shape for said light filter window, such that a size of said light filter window increases gradually from top to bottom thereof, so as to reduce reflectivity of incident light beams and avoid stray lights.

19. The camera module, as recited in claim 1, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

20. The camera module, as recited in claim 19, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

21. The camera module, as recited in claim 9, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

22. The camera module, as recited in claim 21, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

23. The camera module, as recited in claim 13, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

24. The camera module, as recited in claim 23, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

25. The camera module, as recited in claim 14, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

26. The camera module, as recited in claim 25, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

27. The camera module, as recited in claim 17, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

28. The camera module, as recited in claim 27, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

29. The camera module, as recited in claim 18, wherein an inner surface of said integral base is inclinedly extended from bottom to top to form said light window which has a gradually increasing size along said photosensitive path, wherein said inner surface of said integral base defines an inclination angle of at least 3° or more, with respect to a longitudinal light axis of said camera module, wherein said outer engaging groove of said light filter holder defines an engaging angle corresponding to said inclination angle, such that a shape of said outer engaging groove of said light filter holder adapts an inclined shape of said inner surface of said integral base for facilitating an installation of said light filter holder with said integral base.

30. The camera module, as recited in claim 29, wherein said downward extending arm is inclinedly and downwardly extended from said light filter holder body to define said engaging angle corresponding to said inclination angle, wherein said inward extending arm is transversely extended from said downward extending arm to define a supporting angle which is larger than 90° so as to facilitate an installation of said light filter.

* * * * *